United States Patent
Hu et al.

(10) Patent No.: US 11,031,160 B2
(45) Date of Patent: Jun. 8, 2021

(54) METHOD OF ACTUATING A SHAPE CHANGEABLE MEMBER, SHAPE CHANGEABLE MEMBER AND ACTUATING SYSTEM

(71) Applicant: MAX-PLANCK-GESELLSCHAFT ZUR FÖRDERUNG DER WISSENSCHAFTEN E.V., Munich (DE)

(72) Inventors: Wenqi Hu, Stuttgart (DE); Guo Zhan Lum, Stuttgart (DE); Massimo Mastrangeli, Stuttgart (DE); Metin Sitti, Stuttgart (DE)

(73) Assignee: MAX-PLANCK-GESELLSCHAFT ZUR FORDERUNG DER WISSENSCHAFTEN E.V.

( * ) Notice: Subject to any disclaimer, the term of this patent is extended or adjusted under 35 U.S.C. 154(b) by 19 days.

(21) Appl. No.: 16/477,593

(22) PCT Filed: Dec. 22, 2017

(86) PCT No.: PCT/EP2017/084408
§ 371 (c)(1),
(2) Date: Oct. 7, 2019

(87) PCT Pub. No.: WO2018/130410
PCT Pub. Date: Jul. 19, 2018

(65) Prior Publication Data
US 2020/0035390 A1   Jan. 30, 2020

(30) Foreign Application Priority Data
Jan. 13, 2017   (WO) .................. PCT/EP2017/050666

(51) Int. Cl.
*H01F 1/03* (2006.01)
*B81B 3/00* (2006.01)
(Continued)

(52) U.S. Cl.
CPC ......... *H01F 1/0308* (2013.01); *B81B 3/0032* (2013.01); *F03G 7/065* (2013.01); *B63H 1/37* (2013.01); *B81B 2201/038* (2013.01)

(58) Field of Classification Search
CPC ................. H01F 1/0308; B81B 3/0032; B81B 2201/038; F03G 7/065; B63H 1/37; B60F 3/00
(Continued)

(56) References Cited

U.S. PATENT DOCUMENTS 4,789,803 A * 12/1988 Jacobsen ................ H02N 13/00
307/400
9,281,112 B2 * 3/2016 Sitti ....................... H01F 7/0242
(Continued)

FOREIGN PATENT DOCUMENTS

CN   1887646 A   1/2007
CN   1903656 A   1/2007
(Continued)

OTHER PUBLICATIONS

G.Z. Lum et al.: "Shape-programmable Magentic Soft Matter", Proceedings of the National Academy of Sciences, vol. 113, 2016, pp. E6007-E60015, XP002774981.
(Continued)

*Primary Examiner* — Hoang M Nguyen
(74) *Attorney, Agent, or Firm* — Dickinson Wright PLLC

(57) ABSTRACT

The present invention relates to a method of actuating a shape changeable member of actuatable material. The invention further relates to a shape changeable member and to a system comprising such a shape changeable member and a magnetic field apparatus.

17 Claims, 43 Drawing Sheets

(51) Int. Cl.
*F03G 7/06* (2006.01)
*B63H 1/37* (2006.01)

(58) Field of Classification Search
USPC .............................. 60/527–529; 310/308–309
See application file for complete search history.

(56) References Cited

U.S. PATENT DOCUMENTS

| | | |
|---|---|---|
| 2006/0150627 A1 | 7/2006 | Oohara |
| 2007/0079997 A1 | 4/2007 | Chan et al. |
| 2010/0326071 A1* | 12/2010 | Gracias ................. B81C 99/002 |
| | | 60/527 |
| 2013/0210294 A1 | 8/2013 | Hoon et al. |
| 2013/0303847 A1* | 11/2013 | Sitti ................... A61B 1/00158 |
| | | 600/104 |
| 2018/0012693 A1* | 1/2018 | Lum ....................... H01F 13/00 |

FOREIGN PATENT DOCUMENTS

| | | |
|---|---|---|
| JP | S5766078 A | 4/1982 |
| KR | 101488247 B1 | 2/2015 |
| WO | 2010126223 A2 | 11/2010 |
| WO | 2012040775 A1 | 4/2012 |

OTHER PUBLICATIONS

International Search Report for related International Application No. PCT/EP2017/084408; dated: Jan. 13, 2017; 4 pages.

* cited by examiner

Fig. 14
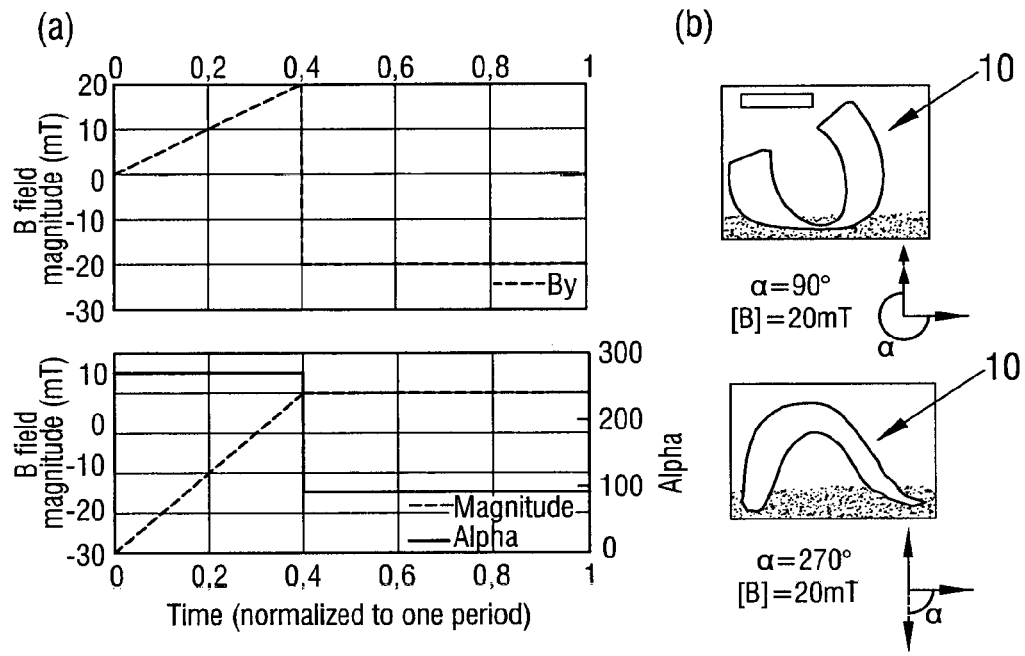
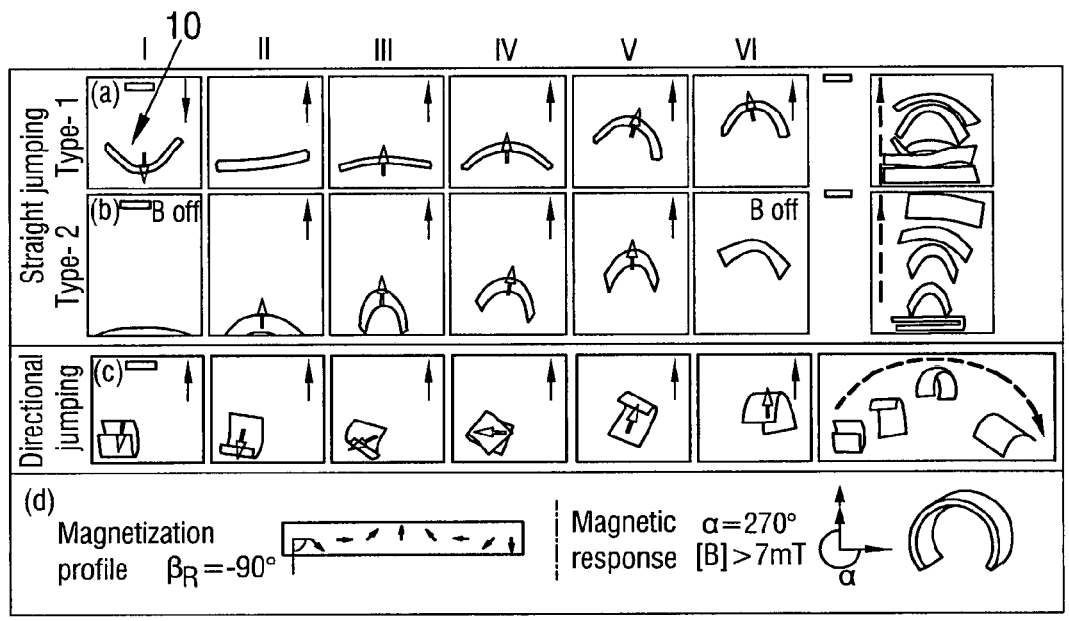
Fig. 15

METHOD OF ACTUATING A SHAPE CHANGEABLE MEMBER, SHAPE CHANGEABLE MEMBER AND ACTUATING SYSTEM

CROSS-REFERENCES TO RELATED APPLICATIONS

This application is a 371 National Phase application of Patent Application PCT/EP2017/084408, filed on Dec. 22, 2017, which claims the priority of PCT Application No. PCT/EP2017/050666 filed on Jan. 13, 2017, each of which is incorporated herein by reference, in their entirety.

The present invention relates to a method of actuating a shape changeable member of actuatable material. The invention further relates to a shape changeable member and to a system comprising such a shape changeable member and a magnetic field apparatus.

Miniature members are envisaged that can facilitate access to and inspection of narrow, remote and unexplored environments. However, restricted mobility of miniature members may hinder the realization of targeted applications in highly unstructured landscapes.

To date the miniature members produced are generally tethered members, this means that they are generally connected to a further structure and can be adapted to move relative to the further structure. While there also exists untethered miniature members, these miniature members are generally only capable of carrying out one mode of locomotion and are specifically designed to carry out that one single mode of locomotion. The use of members that can only carry out limited number of modes of locomotion however hinders the movement capabilities and applications that can be carried out by such members.

In view of the foregoing it is an object of the present invention to make available shape changeable members that can more readily access remote and unexplored environments and that are capable of carrying out multiple modes of locomotion.

This object is satisfied in accordance with a method of actuating a shape changeable member as defined in claim 1.

By way of example, such a method of actuating a shape changeable member, in which the shape changeable member has a height, a width as well as a length, and is untethered; comprises the steps of:
actuating the shape changeable member by means of at least one stimulus to bring about a change of shape of the member at least over the length of the shape changeable member in at least one spatial direction and thereby inducing a torque into the shape changeable member;
effecting a locomotion of the member by means of the induced change of shape of the member in the at least one spatial direction; and
moving the shape changeable member in the at least one spatial direction.

The use of untethered members increases the movement capabilities of such members. Moreover, the use of at least one stimulus to bring about a variety of changes of shape of the member to induce different moments into the member to effect different types of locomotion increases the variety of modes of moving the member. The different modes of moving the member translate to different types of locomotion which were previously not possible using one and the same member.

Thereby miniature mobile members capable of accessing and navigating effectively in narrow remote environments can be made available. These miniature members may enable unprecedented applications in microfactories, bioengineering, environmental remediation, and healthcare. Moreover, one and the same miniature device can be made available that can inherently carry out the different modes of locomotion.

In this connection it should be noted that the moment can also be referred to as torque and the induced torque is generally small when the induced change of shape of the member causes a small deformation of the member. Moreover, it should be noted that the torque vanishes when the net magnetic moment of the deformed member is aligned with an applied stimulus, such as an applied magnetic field.

Preferably the induced torque is used to steer the shape changeable member in the at least one direction.

It is preferred if a type of locomotion of the shape changeable member is selected from the group of members consisting of swimming, walking, flipping, crawling, rolling, diving, immersion, emersion, jumping, landing, surface climbing, liquid meniscus climbing, hopping, crawling inside a confined space, spinning, flying, gliding.

Dexterous miniature members that can swim, walk, roll, jump, or crawl have been proposed in recent years. However, these members are only capable of performing one specific locomotion mode, and are inadequate to escape from liquid environments to solid terrains. In contrast to this the shape changeable member can be actuated to carry out several modes of locomotion one after the other. This means that the member can, for example, move through a liquid, leave the liquid and then move on a solid surface, and vice versa.

For example, untethered, amphibious, millimeter-scale soft (rubber like) members capable of multiple modes of locomotion can be made available that move across and/or through liquid and solid unstructured terrains.

In this connection, soft means that the member is inherently flexible, such as a member comprising rubber and is not a hard/rigid member such as a piece of non-flexible metal or wood.

The members can be actuated by locomotion mode-specific external magnetic fields, the magneto-elastic sheet-shaped members with a pre-programmed magnetization profile and hydrophobic surface can swim inside and on the surface of liquids, climb liquid menisci, roll, walk on ground, jump directionally over obstacles, and crawl within narrow spaces. Such members can reversibly transit from the surface to the bulk of a liquid, and from a liquid surface to rigid ground.

Advantageously the change of shape comprises at least one of a deformation, a contraction, a flexing, an undulation and a stretching of the actuatable material of the shape changeable member. In this way, the member can change its shape in a variety of ways with each change of shape being capable of being used for certain types of locomotion.

By way of example, the shape changeable member can be deformed to adopt a sine-like or cosine-like shape to affect a walking type of locomotion, in particular wherein a rotating magnetic field B sequence of small magnitude is applied to the shape changeable member to enable an undulating locomotion of the shape changeable member, with an applied magnetic field preferably having a small magnitude |B| being selected in the range of 0.1 to 200 mT in particular of 2 to 5 mT and especially of 3 mT.

By way of a further example, the shape changeable member can be deformed to adopt a part-circular shape, such as a semi-circular shape, to effect a rolling or meniscus climbing type of locomotion, in particular wherein a rotating magnetic field B sequence of large magnitude is applied to the shape changeable member to enable a rolling locomotion of the shape changeable member, with the applied magnetic field preferably effecting a rolling type of locomotion in a clockwise sense, and with an applied magnetic field preferably having a large magnitude |B| selected in the range of 0.1 to 1000 mT, in particular of 12 to 20 mT and especially of 15 mT, in particular wherein, to effect a meniscus climbing type of locomotion a large constant magnetic field B is applied followed by a rotating magnetic field B sequence of large magnitude with an applied magnetic field preferably having a large magnitude |B| being selected in the range of 0.1 to 1000 mT, in particular of 10 to 20 mT and especially of 12 mT.

By way of a further example, the shape changeable member can be deformed to undulate and generate a travelling wave on the member to affect a swimming type of locomotion or crawling type of locomotion.

By way of a further example, the shape of the shape changeable member can be flipped from a first shape into a second shape and back into the first shape to affect a jelly-fish swimming type of locomotion, wherein the first and second shapes preferably resemble that of a part-circle.

By way of yet a further example, the shape changeable member can be pulsed with the at least one stimulus in order to affect the jumping type of locomotion.

By way of yet a further example to affect an immersion type of locomotion a magnetic field having a rotating B sequence is applied, with the magnetic field effecting a rotation of the shape changeable member in a counter-clockwise sense to reduce a contact with a liquid surface, with the applied magnetic field preferably having a magnitude selected in the range of 1 to 200 mT, in particular of 15 to 30 mT, especially of 20 mT.

By way of yet a further example to affect a landing type of locomotion a magnetic field having a rotating B sequence of variable magnitude applied, with the initial B-sequence having a high magnitude which is then reduced to a low magnitude, with the high magnetic field preferably being selected in the range of 1 to 1000 mT, especially of 10 to 15 mT and the low magnitude being selected in the range of 0.1 to 100 mT, especially of 3 to 8 mT.

By way of yet a further example a rocking sequence of the magnetic field is applied to perform the walking type of locomotion, in particular the walking type of locomotion is effected by use of four phases in which four different kinds of magnetic field are applied.

By way of yet a further example to affect a jelly fish-like swimming motion mode of locomotion of the shape changeable member the applied magnetic field is sequentially flipped from a positive magnetic field to a negative magnetic field causing an inversion of the shape of the shape changeable member.

Preferably the stimulus is one of an external stimulus and an internal stimulus.

Examples of an internal stimulus can e.g. be pressurized air that is provided at the member in order to inflate or deflate certain regions of the member to bring about an actuation of its shape.

Examples of an external stimulus are the application of a magnetic field, an electric field, heat, or laser light. E.g. direct illumination of the laser on the member which causes ejection of material and motion of the member.

Examples of members that can be actuated by external stimuli that do not include the application of a magnetic field as the main source of stimulus are thermally swelling materials, light-sensible materials locally heated by laser light. For example, shape-memory polymers can be used that can deform when they are stimulated by heat. By pre-programming these polymers, different regions of the polymer can create different curvatures.

It is however preferred if the external stimulus is present in the form of a time varying magnetic field applied in at least one dimension, preferably two dimensions, most preferably in three dimensions.

A time varying magnetic field is simple to realize and can be implemented in a cost effective manner and can be used to move a variety of members through various types of media.

Moreover, a time varying magnetic field can not only be changed in its magnitude but also in its direction and this variation in field strength and direction can be utilized by a shape changeable magnetic member that has a pre-determined magnetization profile to change its shape over its length and height in quick succession in order to be moved by the magnetic field using different forms of locomotion.

Preferably a magnitude of the time varying magnetic field applied is selected in the range of 0 to 1000 mT, especially of 0 to 500 mT. Such magnetic fields can be used to move a member both in liquid environments as well as in dry environments.

Advantageously the magnitude of the time varying magnetic field applied is varied with a frequency selected in a suitable range of, e.g., 0 to 1000 kHz, preferably of 0 to 200 Hz, especially of 0 to 50 Hz. These frequencies have found to be advantageous to bring about the locomotion of the shape changeable member.

It is preferred if a direction of the time varying magnetic field applied is varied with a frequency selected in the range of 0 to 100 kHz, especially of 0 to 100 kHz. These frequencies have been found to be advantageous to bring about the change of shape of the member and to induce the various types of locomotion.

It is preferred if the shape changeable member can be actuated in order to additionally carry out at least one function. In this way, for example, a robot can be made available that is capable of executing pick-and-place tasks and shape deformation-triggered release of cargos.

For example, the at least one function comprises at least one of a gripping function, a holding function, a dropping function, a clamping function and picking up function.

In accordance with a further aspect the invention also relates to a shape changeable member of actuatable material, the shape changeable member being untethered and having a width, a height and a length, wherein the shape changeable member is configured to be actuated by means of at least one stimulus in order to bring about a change of shape of the member at least over the length of the shape changeable member; wherein the shape changeable member is configured to be actuated in accordance with a method of actuating the shape changeable member as discussed in the foregoing. In this connection it should be noted that the shape changeable member can be furthered using similar features to those discussed in the foregoing in relation to the method in accordance with the invention.

Such minimalist, programmable and versatile soft members could enable applications in environmental monitoring and minimally invasive medical operations inside the human body.

The proposed members with versatile and robust multi-modal locomotion capability may be tailored to diverse applications, including environmental monitoring and minimally invasive medical operations. Further progress is envisaged by implementing a remote member localization method and improving the member's dexterity, precision, safety, and functionality using a closed-loop feedback control by monitoring the member while this is moved e.g. through the human body.

Preferably the stimulus is an external stimulus in the form of a magnetic field applied in at least one dimension and most preferably in three dimensions, with the magnetic field interacting with a pre-programmed magnetization profile of the shape changeable member, with the member preferably having a hydrophobic surface.

Providing a magnetized member that moves in a magnetic field is a beneficial way of implementing the various modes of locomotion required to e.g. facilitate drug delivery in the human body.

A viable solution to develop miniature devices with multimodal and multi-terrain locomotion capability is to employ soft active materials, such as ecoflex, shape memory alloys, liquid metals, silicone rubbers, silicone-based materials, polyurethanes, soft gels (hydrogels, oil-based gels, aerogels) as well as natural polymers, such as DNA or proteins that are embedded with ferromagnetic, paramagnetic or diamagnetic particles, which endow machines with extra degrees-of-freedom and support programmable shape changes while assuring safe interaction with delicate environments.

Moreover, magnetic actuating fields can harmlessly penetrate most biological materials, making them particularly promising for biomedical applications.

In a further aspect the present invention relates to an actuating system comprising a shape changeable member in accordance with the foregoing and a magnetic field apparatus, wherein the magnetic field apparatus is a source of the at least one stimulus.

The advantages discussed in the foregoing in connection with the method of actuating as well as in connection with the shape changeable member likewise apply to the system.

It is preferred if the magnetic field apparatus is configured to generate a uniform 3D time-varying magnetic field at a center of the system. In this way the shape changeable member can be actuated on by a magnetic field in order to effect the different types of locomotion. Such as system can then be used to e.g. steer miniature robots to different positions of application.

Preferably the magnetic field apparatus comprises at least two, preferably three and especially four, pairs of magnetic coils, wherein each of the pairs of coils is arranged on a common axis, with the respective common axes being arranged at least approximately perpendicular to one another at a center of the system.

Such a coil arrangement can generate very accurate time-varying magnetic fields that are suitable to moving the shape changeable member.

It should be noted in this connection that if four pairs of coils are used then the fourth pair of coils is configured to control a gradient of the applied magnetic field.

Advantageously the shape changeable member is configured to be actuated by means of the pairs of magnetic coils in such a way that the shape changeable member carries out at least one type of locomotion within the applied magnetic field.

It is preferred if each coil of each pair of magnetic coils is arranged at least substantially equidistant from the center. In this way a homogenous magnetic field can be generated that can be varied in a time dependent manner both with regard to the direction of the magnetic field applied and with the magnitude of the applied magnetic field.

In this way the pairs of magnetic coils can be configured to produce a time-varying magnetic field at the center.

In order to produce a time-varying magnetic field at the center, each pair of coils can be actuated to produce a magnetic field at the center whose field strength can be suitably varied, preferably in the range of 0 to 500 mT, in particular of 0 to 50 mT. Indeed each pair of coils can be actuated to produce a magnetic field at the center whose field strength can be varied with a frequency in the range of at least 0 to 1 kHz, in particular of 0 to 50 kHz.

In fact each pair of coils can be actuated to produce a magnetic field having a varying direction in one of the following planes spatial planes X-Y, X-Z, Y-Z. By changing the direction in the different planes in which the field is applied means that the shape changeable member can be moved in all three directions of space.

Preferably the change in direction of the magnetic field applied can be varied with a frequency selected in the range of 0 to 100 kHz, in particular of 0 to 200 Hz.

Advantageously each coil of each pair of coils is configured to carry a current in the range from 0 to 20 A for a coil comprising 3 layers of wires with 60 wires per layer and a diameter of 1.05 cm.

Preferably, if three pairs of magnetic coils are used, two pairs of the magnetic coils are provided with an at least substantially equal size and each coil of the third pair of magnetic coils has a larger size than a respective coil of the other two pairs of magnetic coils.

In this way, a simple configuration is made available to produce a uniform magnetic field.

Advantageously a diameter of each of the four coils of the two pairs of magnetic coils of at least substantially equal size is selected in the range of 50 to 65 cm and a diameter of each of the two coils of the third pair of magnetic coils of at least substantially equal size has a size that is selected in the range of 100 to 140 cm.

Preferably the shape changeable member is configured to be steered by a magnetic field applied in at least one of the Y-direction and the Z-direction and is further configured to be changed in shape by a magnetic field applied in the X- and Y-direction and is configured to be moved by the magnetic fields applied in the X- and Y-direction.

Advantageously the magnetic field is applied relative to a local X-Y frame of the shape changeable member and through a presence of the magnetic field deforms a shape of the shape changeable member in the X-Y frame, wherein the shape changeable member is steering by a magnetic field applied in at least one of the Y-direction and the Z-direction.

The invention will be explained in detail in the following by means of embodiments and with reference to the drawing in which is shown:

FIG. 1 a) a design of a magneto elastic-shape changeable actuatable member and b) the magnetic response of the magneto elastic-shape changeable actuatable member;

FIG. 2 various types of modes of locomotion and associated transition modes of the magneto elastic-shape changeable actuatable member, with a) illustrating swimming, b) meniscus climbing, c) immersion, d) landing, e) rolling, f) walking, g) crawling and h) jumping;

FIG. 3 multimodal locomotion over liquid-solid hybrid terrain by the magneto elastic-shape changeable actuatable member, with a) illustrating rolling, diving and swimming, b) immersion, c) emersion, d) meniscus climbing, landing, jumping, walking and e) walking and crawling;

FIG. 4 a) approach and pick up of a load by the magneto elastic-shape changeable actuatable member and b) transport and placement of the load by the magneto elastic-shape changeable actuatable member;

FIG. 5 a magnetization process of a soft magneto-elastic shape changeable actuatable member, with $a$) illustrating an elastomeric beam loaded with NdFeB microparticles wrapped around a cylindrical glass tube (perimeter: 3.7 mm) and magnetized by a uniform 1.5 T magnetic field produced by a vibrating sample magnetometer. and $b$) illustrating the programmed magnetization profile in the unwrapped member, for $\beta_R=45°$;

FIG. 6 a six-coil electromagnetic setup to actuate the magneto-elastic shape changeable actuatable member;

FIG. 7 a quasi-static analysis of a soft shape changeable actuatable member;

FIG. 8 a rotating B sequence enabling the undulating motion of the magnetoelastic shape changeable actuatable member, with ($a$) illustrating the required B in dependence on time to undulate the member 10 to the right, with the variables $B_x$ and $B_y$ representing the magnetic field along the x- and y-axis of the coordinate system, shown in ($b$) with FIG. 8($b$) illustrating two principle shapes;

FIG. 9 further illustrations as shown in FIG. 8$a$) and $b$) for a further type of locomotion;

FIG. 10 further illustrations as shown in FIG. 8$a$) and $b$) for a further type of locomotion;

FIG. 11 further illustrations as shown in FIG. 8$a$) and $b$) for a further type of locomotion;

FIG. 12 further illustrations as shown in FIG. 8$a$) and $b$) for a further type of locomotion;

FIG. 13 further illustrations as shown in FIG. 8$a$) and $b$) for a further type of locomotion;

FIG. 14 further illustrations as shown in FIG. 8$a$) and $b$) for a further type of locomotion;

FIG. 15 snapshots of straight and directional jumping by the magneto-elastic shape changeable actuatable member, with $a$) illustrating a first type of straight jumping, $b$) a second type of straight jumping, $c$) a type of directional jumping and $d$) the magnetization profile of the shape changeable magnetic member used in a to c, and its magnetic response at large |B|;

FIG. 16 a vibrational analysis of a shape changeable actuatable member;

FIG. 17 boundary conditions for the Type-1 straight jump of FIG. 15$a$;

FIG. 18 a design of a modified shape changeable actuatable member fora magnetically triggered cargo release, with $a$) illustrating an extra strap added to the member 10, $b$) the extra strap locked into a hole on the body of the member with cargo arranged there between and $c$) the opening of the strap;

FIG. 19. ($a$) The rectangular sheet-shaped magnetic soft robot's dimensions and magnetization profile, m. ($b$) Theoretically predicted and experimental shapes of a magnetically deformed millirobot. α is a clockwise angle from the x-axis, and it is used for describing the direction of $B_{xy}$. (I) The robot is in its rest state under null $B_{xy}$. A small residual curvature is induced by the pre-stress resultant from the demolding process. (II-III) Small deformation shapes under a small magnitude $B_{xy}$ ($B_{xy}$=5 mT) aligned along the two principal directions (α=225° for sine and 315° for cosine shape) in the xy plane. In contrast, the robot deforms into a 'C'-shape (IV) or 'V'-shape (V) when a large magnitude $B_{xy}$ ($B_{xy}$=20 mT) aligns along the principal axis (α=135° and 315°, respectively). The induced pre-stress from the demolding process may introduce a deviation between the predicted and actual shapes, particularly for (II) and (V). The theoretical $M_{net}$ of the robot for each shape is shown on the right.

($c$) The clockwise rotation of the 'C'-shaped robot is induced by rotating $B_{xy}$. Scale bars: 1 mm.

FIG. 20 the sub-panels for the swimming locomotion in ($a$) are displayed in a horizontal sequence to show the relative vertical displacement between them. The sub-panels for the rest of the locomotion are arranged in a vertical sequence to show the relative horizontal displacement between them. The corresponding time stamps and B in each sub-panel are shown in the bot-tom-right and top-left corners, respectively. ($a$) Jellyfish-like swimming in water using a time-symmetrical but speed-asymmetrical gait. ($b$) Water meniscus climbing. A counter-clockwise magnetic torque progressively adapts the pose of the robot as it deforms and ascends due to buoyancy. ($c$) Landing, i.e., transition from water surface onto solid ground. A clockwise rotating B peels the robot off the water surface and lets it stand on the platform. ($d$) Immersion, i.e., transition from the surface into the bulk of a water pool by a combination of curling and rigid-body rotation. ($e$) Rolling by a clockwise rotating B of high magnitude. ($f$) Walking. The robot tilts and changes its curvature to create a net stride in each cycle. ($g$) Crawling inside a tubular channel with a cross section of 0.645×2.55 mm² by using an undulating traveling wave along the robot's body. (h) Directional jumping. The robot uses its rigid-body motion and shape change to induce a jumping momentum. More than one robot is used for this illustration but we highlight that all these robots have the same design (scale bars: 1 mm); and FIG. 21 ($a$) the soft robot navigating across a synthetic stomach phantom using a combination of locomotion modes. ($b$) Ultrasound-guided locomotion: the robot (marked out by dotted lines) rolls within the concealed areas of an ex vivo chicken tissue, as visualized by ultrasound imaging. ($c$) The robot approaches a cargo item (nylon, 1×0.8×1.5 mm³) by walking on a flat rigid surface, picks up the cargo by curling into the 'C'-shape, transports away the cargo by rolling and maintaining its 'C'-shape configuration, and releases the cargo by uncurling at a new position. (d) Dynamic and selective cargo release. A paper tissue (0.5× 0.5×0.1 mm³, used as model drug container) is bound to the robot by an extra appendage After pre-bending the robot, B is quickly reversed to open the appendage and release the cargo (cargo highlighted by the white dashed line) (scale bars: 1 mm).

FIG. 22 Magnetization process of the soft magneto-elastic robot.

FIG. 23 Quasi-static analysis of the soft robot.

FIG. 24 Soft robots implementing jumping locomotion.

FIG. 25 The required B for the directional jumping locomotion. (

FIG. 26 Sketch for the analysis of the straight jumping locomotion (not to scale).

FIG. 27 Experimental and model-predicted results for Hmax in the straight jumping locomotion.

FIG. 28 The compiled experimental data, displaying how the robot's dimensions will affect Hmax for the straight jumping locomotion (Hmax versus B).

FIG. 29 The required B for the rolling locomotion.

FIG. 30 Sketch for the analysis of the rolling locomotion (not to scale).

FIG. 31 Experimental and model-predicted results for the rolling locomotion (Vroll versus f).

FIG. 32 The compiled experimental data, displaying how the robot's dimensions will affect Vroll for the rolling locomotion (Vroll versus f).

FIG. 33 The required B for the walking locomotion.

FIG. 34 Stretched and curled state of the robot during a walking cycle (not to scale).

FIG. 35 Experimental and model-predicted results for the walking locomotion (Vwalk versus f while Bmax is fixed at 10 mT).

FIG. 36 Experimental and model-predicted results for the walking locomotion (Vwalk versus Bmax while f is fixed at 5 Hz).

FIG. 37 The compiled experimental data, displaying how the robot's dimensions will affect Vwalk for the walking locomotion (Vwalk versus f while Bmax is fixed at 10 mT).

FIG. 38 The compiled experimental data, displaying how the robot's dimensions will affect Vwalk for the walking locomotion (Vwalk versus Bmax while f is fixed at 5 Hz).

FIG. 39 The required B for the meniscus climbing locomotion.

FIG. 40 Meniscus climbing by a magnetic soft robot that has an L of 5 mm.

FIG. 41 Sketches of the geometries for the meniscus-climbing models.

FIG. 42 Results for the meniscus-climbing locomotion (robot curvature versus robot dimensions).

FIG. 43 Results for the meniscus-climbing locomotion (Bmin as a function of robot dimensions).

FIG. 44 The required B for the undulating swimming locomotion.

FIG. 45 Vibrational analysis of a soft robot.

FIG. 46 Experimental and model-predicted results for the undulating swimming locomotion (Vswim versus f while B is fixed at 5 mT).

FIG. 47 Experimental and model-predicted results for the undulating swimming locomotion (Vswim as a function of B while f is fixed at 40 Hz).

FIG. 48 The compiled experimental data, displaying how the robot's dimensions will affect Vswim for the undulating swimming locomotion (Vswim as a function of f while B is fixed at 5 mT).

FIG. 49 The compiled experimental data, displaying how the robot's dimensions will affect Vswim for the undulating swimming locomotion (Vswim as a function of B while f is fixed at 40 Hz).

FIG. 50 The required B for the crawling locomotion.

FIG. 51 The compiled experimental data, displaying how the robot's dimensions will affect Vcrawl for the crawling locomotion (Vcrawl as a function of f while B is fixed at 10 mT).

FIG. 52 The compiled experimental data, displaying how the robot's dimensions will affect Vcrawl for the crawling locomotion (Vcrawl as a function of B while f is fixed at 20 Hz).

FIG. 53 Crawling speed and contact length between the original robot and the inner tunnel surface as a function of B (f is fixed at 20 Hz).

FIG. 54 Experimental and model-predicted results for the crawling locomotion (Vcrawl as a function of f while B is fixed at 10 mT).

FIG. 55 Experimental and model-predicted results for the crawling locomotion (Vcrawl as a function of B while f is fixed at 20 Hz).

FIG. 56 The required B for the jellyfish-like swimming locomotion.

FIG. 57 Fluid vortices produced by the power stroke during the jellyfish-like swimming locomotion.

FIG. 58 The compiled experimental data, displaying how the robot's dimensions will affect Vjf for the jellyfish-like swimming locomotion (Vjf as a function of f while Bmax is fixed at 20 mT).

FIG. 59 The compiled experimental data, displaying how the robot's dimensions will affect Vjf for the jellyfish-like swimming locomotion (Vjf as a function of Bmax while f is fixed at 20 Hz).

FIG. 60. Experimental and model-predicted results for the jellyfish-like swimming locomotion (Vjf as a function of f while Bmax is fixed at 20 mT).

FIG. 61 Experimental and model predicted results for the jellyfish-like swimming locomotion (Vjf as a function of Bmax while f is fixed at 20 Hz).

FIG. 62 The required B for the immersion locomotion.

FIG. 63 The required B for the landing locomotion.

FIG. 64 Ultrasound-guided locomotion.

FIG. 1a shows a design of a shape changeable actuatable member 10, present in the form of a strip of material. The shape changeable actuatable member 10 can also be referred to as a magneto-elastic member 10. The member 10 has a length l in the x-direction, a height h in the y-direction and a width w in the z-direction. In the present example, the member 10 is formed from a continuum of infinitesimal segments ds of which nine segments s are shown for the purpose of illustration along the x-direction, with the segments s (ds) each comprising the same material but having a different direction of magnetization as indicated by arrows.

The final segment $s_f$ in the x-direction indicates a phase shift $\beta_R$ of the magnetization profile, this phase shift is important as will be discussed in the following.

The member 10 is magneto-elastic and fabricated from a hydrophobic silicone rubber sheet loaded with embedded 5 µm NdFeB particles. FIG. 5 and the subsequent description details steps that can be carried out to form such a member 10. The member 10 is magnetized as a single-period sinusoidal function for its $m_x$ and $m_y$ component along the sheet's length l and equally along the sheet's width w and thickness h.

FIG. 1b shows the member 10 of FIG. 1 in four different states of excitation. The different states of excitation are brought about by way of remote magnetic actuation by means of a multi-coil electromagnet system (see FIG. 6 in this regard). This multi-coil electromagnet system enables untethered operations, i.e. the member 10 is not connected to a host, substrate or the like and can indeed move freely in space.

The first state shows a member 10 with $\beta_R=45°$ in its rest state when no magnetic field B is applied, a scale bar is also indicated and has the size of 1 mm. The member 10 shown in the present example has a size of 3.7×1.5×0.24 mm³.

Typical sizes of the member can be selected in the range of 0.001 to 100×0.001 to 100×0.001 to 20 mm³ especially of 0.01 to 10×0.01 to 10×0.01 to 2 mm³. It should be noted in this regard that also non-uniform shaped members 10 can be produced; however, for the ease of simplicity a member 10 of strip shape is described in the following.

The second state shows an applied magnetic field of 3 mT field strength that is aligned in the X-Y plane with a principal direction of α=225°. In the second state the magnetic member 10 adopts a sinusoidal shape.

The third state shows an applied magnetic field of 3 mT field strength that is aligned in the X-Y plane with a principal direction of α=135°. In the third state the magnetic member 10 adopts a cosine like shape, i.e. by changing the phase of alignment of the magnetic field by 90° has caused a shift in the general shape of the member by 90°.

If one were to continue changing the principal direction of the magnetic field of the same amplitude one can observe a traveling wave traversing through the member 10.

In this way, the member 10 can be caused to undulate and thereby a swimming like type of locomotion can be effected (see also FIG. 3a)

In this regard, it should be noted that a time varying magnetic field can be applied with a field strength selected in the range of 0 to 1000 mT, especially of 0 to 500 mT, with a frequency of the magnitude being variable in a range selected as 0 to 1000 kHz, especially of 0 to 1 kHz. Likewise, a direction of the applied magnetic field can be changed with a frequency selected in the range of 0 to 1 kHz.

The fourth state depicted shows the application of a significantly larger magnetic field in comparison to the third state for the same principal direction of magnetization. In this magnetic field, the member 10 is distorted into a horse shoe like shape or a semi-circle like shape when |B| is large.

The four states show that the shape of the member 10 can be changed by changing the principle direction and/or the strength of the applied magnetic field. Indeed, by generating desired magnetic fields net magnetic moments arise in the member 10. The electromagnets allow the soft member 10 to thus not only produce time-varying shapes, but also various magnetic moments that can invoke a variety of modes of locomotion. The magnetic moments align with an externally applied magnetic field B, so that magnetic torques can steer the member 10 in three-dimensions (3D) in all modes of locomotion.

FIG. 2 shows various types of modes of locomotion and associated transition modes of the magneto elastic-shape changeable actuatable member 10. The scale bars shown in FIG. 2 relate to an actual size of 1 mm.

FIG. 2a shows a mode of locomotion of the member 10 that resembles Jellyfish-like swimming, when the member 10 is completely immersed in water. Indeed, it has been found that the member 10 can overcome gravity by swimming upwards. The swimming is brought about by a time-asymmetrical reversal of B along the vertical direction. The maximum field strength used is $|B|_{max}$=30 mT. Thus, a periodic magnetic field B with a time-varying magnitude along the vertical direction causes the jellyfish-like swimming motion of the member 10, and propels the member 10 to reach the water surface (FIG. 3c). Upon emersion, the soft member 10 strongly pins to the water-air interface by exposing its hydrophobic body surface to air.

FIG. 2b shows a mode of locomotion of the member 10 that resembles water meniscus climbing. A counter-clockwise magnetic torque progressively adapts the pose of the member 10 to the meniscus profile and raises its center of mass. The maximum magnetic field used in this example is $|B|_{max}$: 12 mT.

By applying the different magnetic field a programmed shape change occurs from the shape shown in FIG. 2a that allows the member 10 to exploit the capillary action of a water surface and move upward along the slope of a concave meniscus (FIG. 2b). Meniscus climbing is typically adopted by insects when they cannot swim across frictionless liquid barriers, thus, the member 10 can adopt an insect like mode of locomotion.

It has namely been found that a control of the magnitude of B and of the direction of B makes the member 10 curve upwards and gradually rotate to match the local curvature of the water surface. This curving and rotation permits the member 10 to undergo capillary displacement without extra energy expenditure. Conversely, a fast sequence of downward bending and rotation disengages the member 10 from the water-air interface as shown in FIG. 2c.

Figure 1:
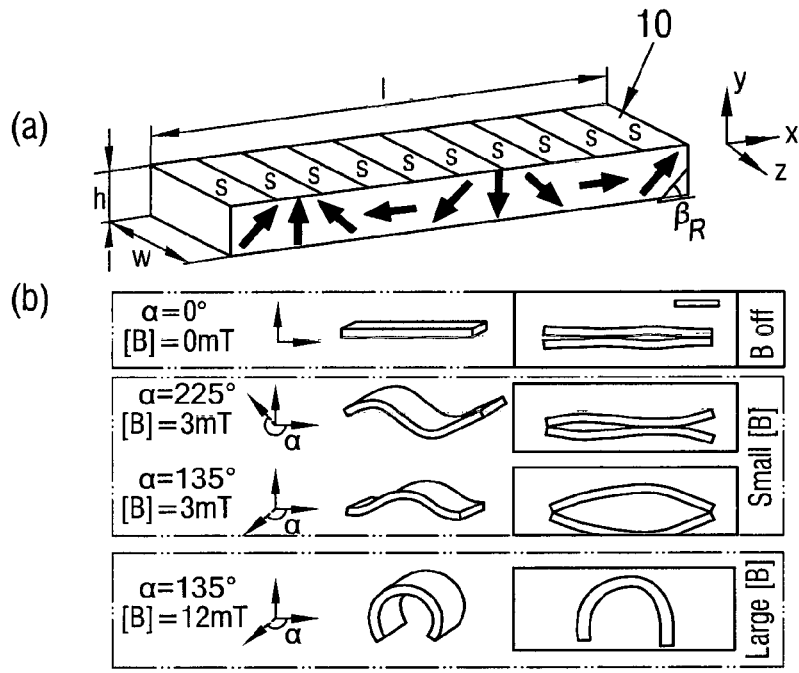

The maximum magnetic field used in this example is $|B|_{max}$: 12 mT. On meniscus climbing, the member 10 can thus efficiently rotate to peel away from the water surface to stand on an adjacent solid substrate. The low wettability (receding water contact angle ~78°) of the microscopically rough elastomer surface of the member 10 leaves the receding triple contact lines unpinned and makes water easily dewet the surface of the member 10 during its displacement.

FIG. 2e shows a mode of locomotion of the member 10 that resembles rolling by means of a high magnitude, and low frequency rotating B field. The maximum magnetic field used in this example is $|B|_{max}$: 20 mT. By rolling, i.e. rigid-body rotation around the z-axis enabled by means of the high magnitude, low frequency B, the member 10 can advance directionally over a rigid substrate and also dive from a solid onto a liquid surface (see FIG. 3a). However, the curled member 10 cannot roll across substrate gaps wider than the diameter of the member 10. In order to bridge gaps the member 10 changes into a walking mode of locomotion.

FIG. 2f shows a mode of locomotion of the member 10 that resembles walking. The direction and magnitude of the magnetic field B control the gait of the member 10 and modulate the stride between its legs, respectively. The maximum magnetic field used in this example is $|B|_{max}$: 7.7 mT. The dashed lines mark the net displacement after one walking cycle. Walking is a particularly robust way to move over unstructured terrain morphologies, and affords precise tuning of stride granularity. Directional walking can be achieved by sequentially and periodically adapting the tilting angle and curvature of the member 10 through the control of the orientation and magnitude of the magnetic field B, respectively.

By way of example the walking to the right shown in FIG. 2f will be described in more detail by using the following sequence of the magnetic field B (see also FIG. 13a):

1. Start walking (Frame I): The magnetic field B is oriented at α=135° with a magnetic field strength |B|=7.7 mT. Under this condition, the member 10 assumes a vertically symmetric pose with both feet touching the ground (see also FIG. 12b).
2. Rise of the front foot (Frames I and II): B rotated from α=135° to 124° while |B|=7.7 mT. This lifts up the front foot (with respect to the moving direction) while keeping the back foot fixed.
3. Stretch and lowering of the front foot (Frames II and III): While a is kept at 124°, |B| is linearly decreased from 7.7 mT to 0 mT. This lowers the front foot and extends the horizontal span of the member 10 by an amount d while the member 10 pivots on the back foot.
4. Shrink and rising of the back foot (Frames III and IV): While a is kept at 146°, |B| increases from 0 mT to 7.7 mT. This makes the member 10 curl to shrink its span and lift up the back foot while keeping the front foot fixed as a pivot.
5. Lowering of the back foot (Frames IV and V) (Lower the back foot): B is rotated from α=146° to 135° while |B|=7.7 mT. This closes the control cycle by returning the member 10 to its starting pose at a net rightward displacement d with respect to its initial position (compare to frame I).

Figure 13:
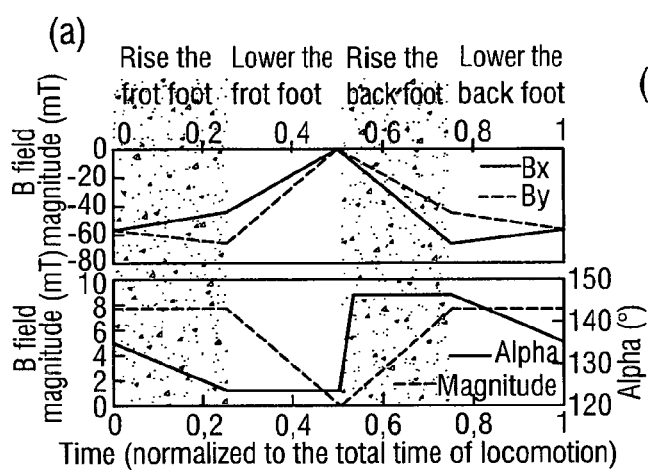

Jellyfish-Like Swimming (FIG. 13)

The jellyfish-like swimming shown in FIG. 2a is realized by the following steps:
1. The member is acted on to implement a fast power stroke.
2. The member is then acted on to implement a slow recovery stroke.

By this periodic flipping of B along the vertical direction to give a fast power (downward) stroke, the robot (member), functioning at a Reynolds number Re ~32.5, is shown to swim upward against the gravitational field, and even against the downward magnetic field gradient eventually present at the vicinity of the bottom coil of the working space.

Figure 9:
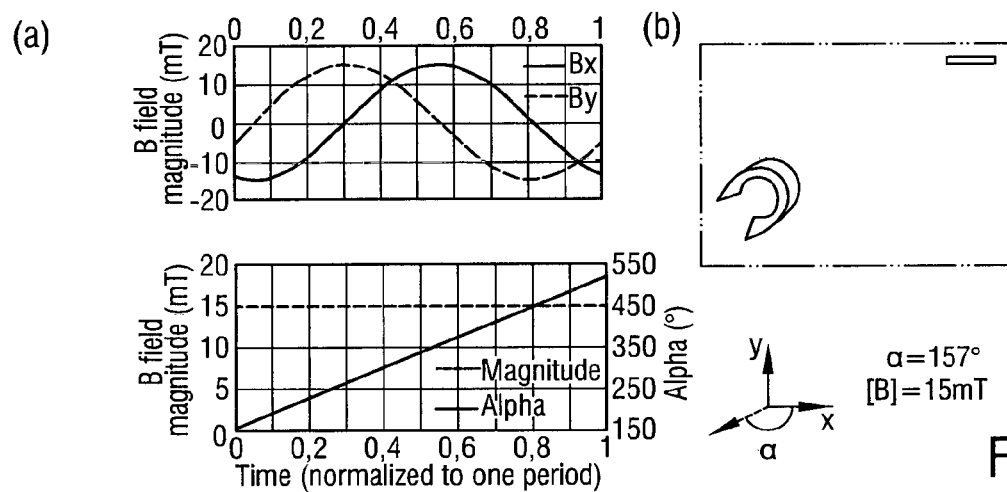

Meniscus Climbing (FIG. 9)

The meniscus climbing shown in FIG. 2b is realized by the following steps:
1. The member is acted on to assume a vertically symmetric pose with upward curvature. The member achieves in 400 ms a stable position along the meniscus known to depend on both the initial meniscus profile and the curvature of the device.
2. B is subsequently rotated clockwise toward to progressively displace the position of the robot along the meniscus and raise its center of mass. Once the device reaches contact with the solid substrate, B is turned off and the robot rests on the edge of the adjacent platform (Frame I in FIG. 2d).

Figure 10:
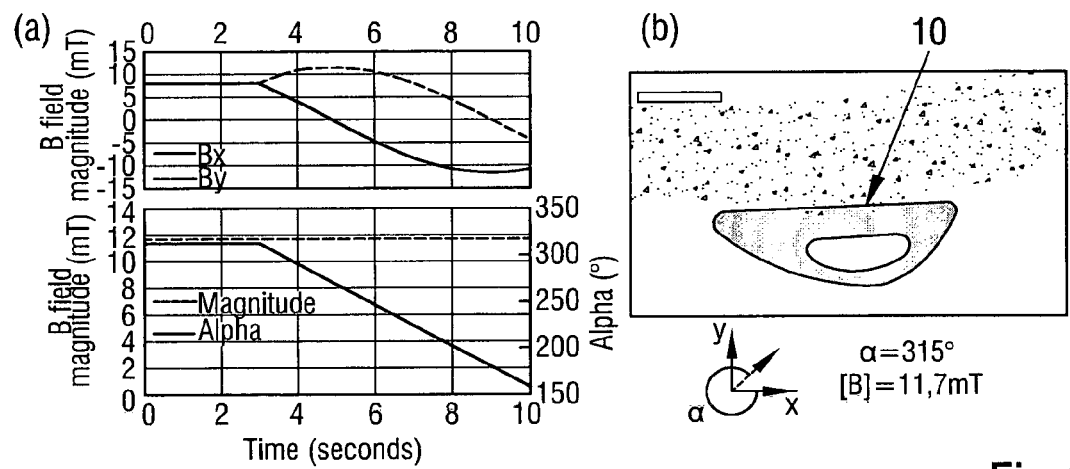

Immersion (FIG. 10)

The immersion shown in FIG. 2c is realized by the following steps:
1. The member is acted on to initially curl downward (Frame II in FIG. 2c).
2. The member is then acted on to rotate counterclockwise to reduce the contact with the water-air interface to a minimum (Frame II in FIG. 2c). At the end of this step, one ending of the beam is still attached to the water surface (Frame III in FIG. 2c).
3. A quick 180° flipping of the external B field disengages the ending of the member from the water surface and let the robot sink (Frame IV and V in FIG. 2c).

Figure 11:
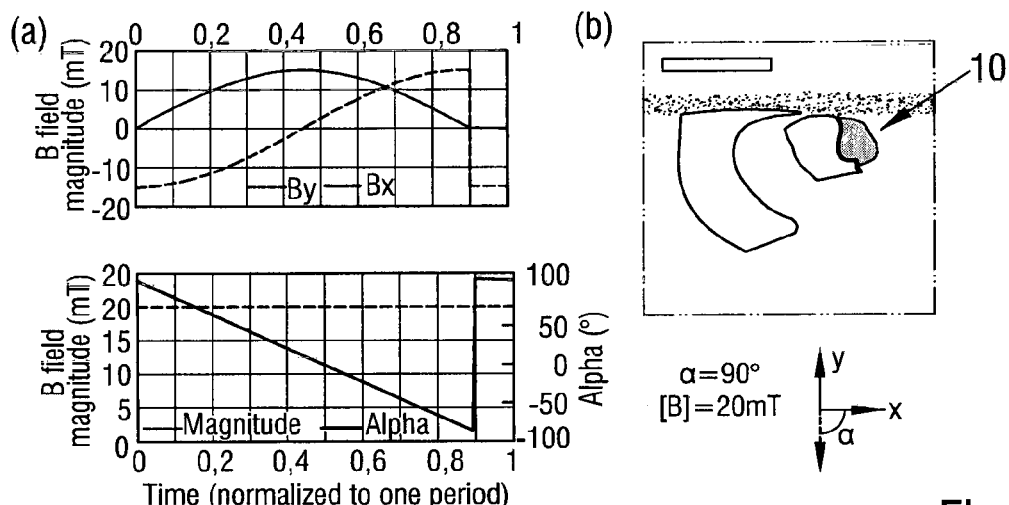

Landing (FIG. 11)

The landing shown in FIG. 2d is realized by the following steps:
1. The member is acted on to keep rotating clockwise while using the edge of the platform as the pivot point.
2. When the second leg of the member reaches the platform (Frame V, FIG. 2d), the external B field is turned off.

Figure 8:
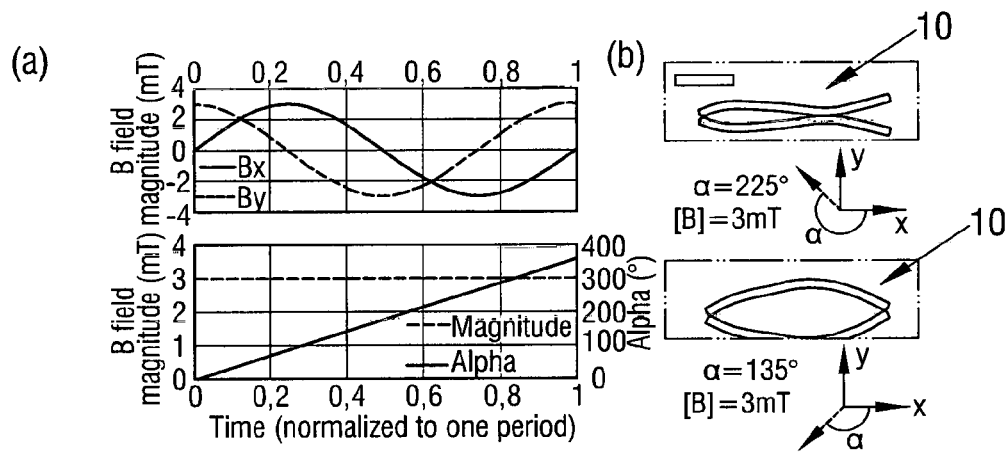

Rolling (FIG. 8)

The rolling shown in FIG. 2e is realized by using the following steps:
1. A large magnitude B (15 mT) along a field angle of 157° to deflect the robot into a distorted cosine shape resembling a semicircle-like shape (FIG. S5b).
2. The external B starts rotating, a rigid-body magnetic torque, $\tau_{rigid\text{-}body}$, is induced by the robot, which can be described mathematically as:

$$\tau_{rigid\text{-}body} = M_{net} \times B. \tag{S9}$$

The external B starts rotating and the agent, the robot's $M_{net}$ will be aligned with its final direction, and $\tau_{rigid\text{-}body}$ will be reduced to a null vector.

Figure 12:
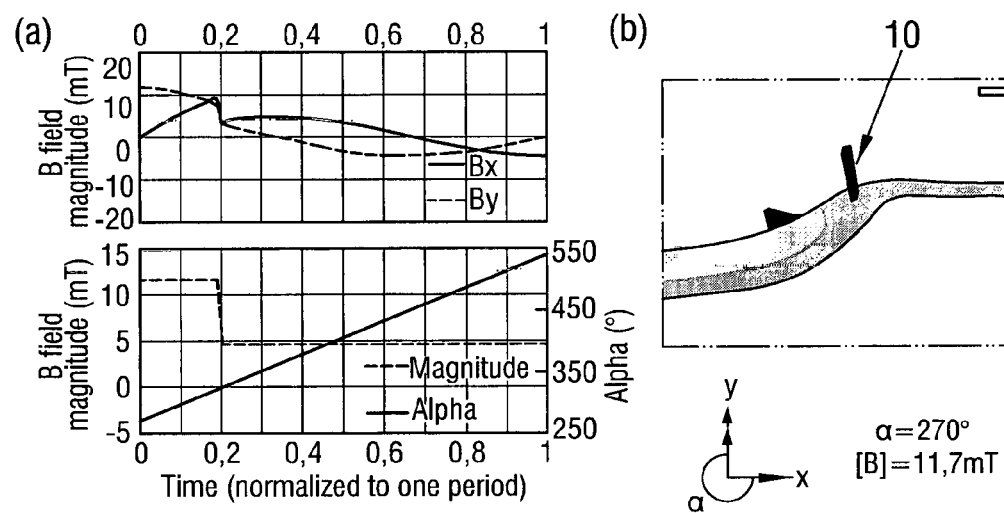

Walking (FIG. 12)

The rightwards walking shown in FIG. 2f is realized by the following steps
1. Start of walk (Frame I): B oriented at α=135° with |B|=7.7 mT. Under this condition, the robot assumes a vertically symmetric pose with both feet touching the ground (FIG. S8b).
2. Rise the front foot (Frame I and II): B rotated from α=135° to 124° while |B|=7.7 mT. This lifts up the front foot (with respect to the moving direction) while keeping the back foot fixed.
3. Stretch and Lower front foot (Frame II and III): While a is kept at 124°, |B| is linearly decreased from 7.7 mT to 0 mT. This lowers the front foot and extends the horizontal span of the robot by an amount d while the robot pivots on the back foot.
4. Shrink and Rise the back foot (Frame III and IV): While a is kept at 146°, |B| increases from 0 mT to 7.7 mT. This makes the robot curl to shrink its span and lift up the back foot while keeping the front foot fixed as pivot.
5. Lower the back foot (Frame IV and V) (Lower the back foot): B is rotated from α=146° to 135° while |B|=7.7 mT. This closes the control cycle by returning the robot to its starting pose at a net rightward displacement d with respect to its initial position (compare to frame I).

Figure 7:
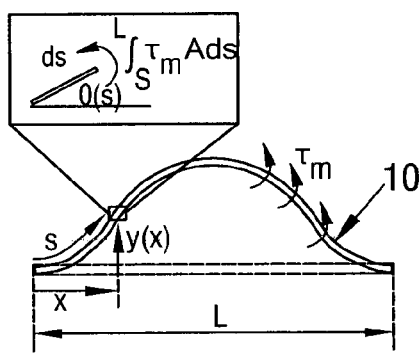

Crawling and Undulating Swimming (FIG. 7)

The crawling mode of locomotion (FIG. 2g) require undulating, time-varying shapes. The agent achieves its undulation by using a rotating B of low magnitude and relatively high frequency. The deformation produced by the time-dependent undulation can be described mathematically as:

$$y(x, t) = \frac{mAl^3B}{8\pi^3 EI}\left[\cos\left(\frac{2\pi}{l}x\right)\cos\left(\frac{2\pi}{T}t\right) + \sin\left(\frac{2\pi}{l}x\right)\sin\left(\frac{2\pi}{T}t\right)\right]$$

where the variable T represents the period of the rotating B. The same motion is also applied to undulating swimming.

Jumping

The jumping shown in FIG. 2h is realized by using the following steps:
1. In Type-1 straight jumping, the agent is first pre-bent by the magnetic field to curl upward and stand on its center (frame I of FIG. 2h).
2. The direction of B is then quickly reversed to force the agent to flatten out (frames II and III of FIG. 2h) and hit the substrate by its feet.

FIG. 2g shows a mode of locomotion of the member 10 that resembles crawling inside a cylindrical tube (inner diameter: 1.62 mm). A clockwise rotating magnetic field B (B=3 mT at 15 Hz) propels the motion to the right by body undulation. The dashed lines mark net displacement after five crawling cycles. When facing narrow openings in standing obstacles that may prevent walking, the member 10 can effectively resort to small amplitude body undulations to crawl through the opening. The crawling motion is encoded by a low magnitude rotating magnetic field B that produces reversible longitudinal traveling waves along the magneto-elastic member 10. A similar control sequence additionally makes the member 10 swim efficiently on liquid surfaces akin to a Taylor swimming sheet (see FIG. 3a), as it does in the member 10 with m featuring multiple sinusoidal periods.

FIG. 2h shows a mode of locomotion of the member 10 that resembles directional jumping. The member 10 is initially tilted at 9° by the applied magnetic field B. The magnetic field B is then flipped clockwise and maintained for 25 ms. The maximum magnetic field used in this example is $|B|_{max}$: 18.9 mT. The arrows indicate the orientation of B in the XY-plane and the instantaneous net magnetization vector of the member 10, respectively.

Fronted by obstacles too high to roll or walk over, the soft member 10 can thus also resort to jumping by imparting an impulsive impact on a rigid substrate. Both straight jumping (see FIG. 15) and directional jumping strategies (see FIG. 2h and FIG. 15) can be achieved. To steer the jumping mode of locomotion, the control sequence of the magnetic field B prompts both the rigid-body rotation of the member 10, which specifies the jump direction, and elastic deformations to maximize the momentum of the member 10 before striking the substrate. Alongside the geometrical member design and the control parameters of the magnetic field B, the net magnetic moment of the deformed member additionally allows the modulation of jump height by magnetic gradient pulling. Magnetic gradient pulling alone could theoretically levitate the member 10; however, the required gradient magnitude is too large to be made practically feasible.

Figure 3:
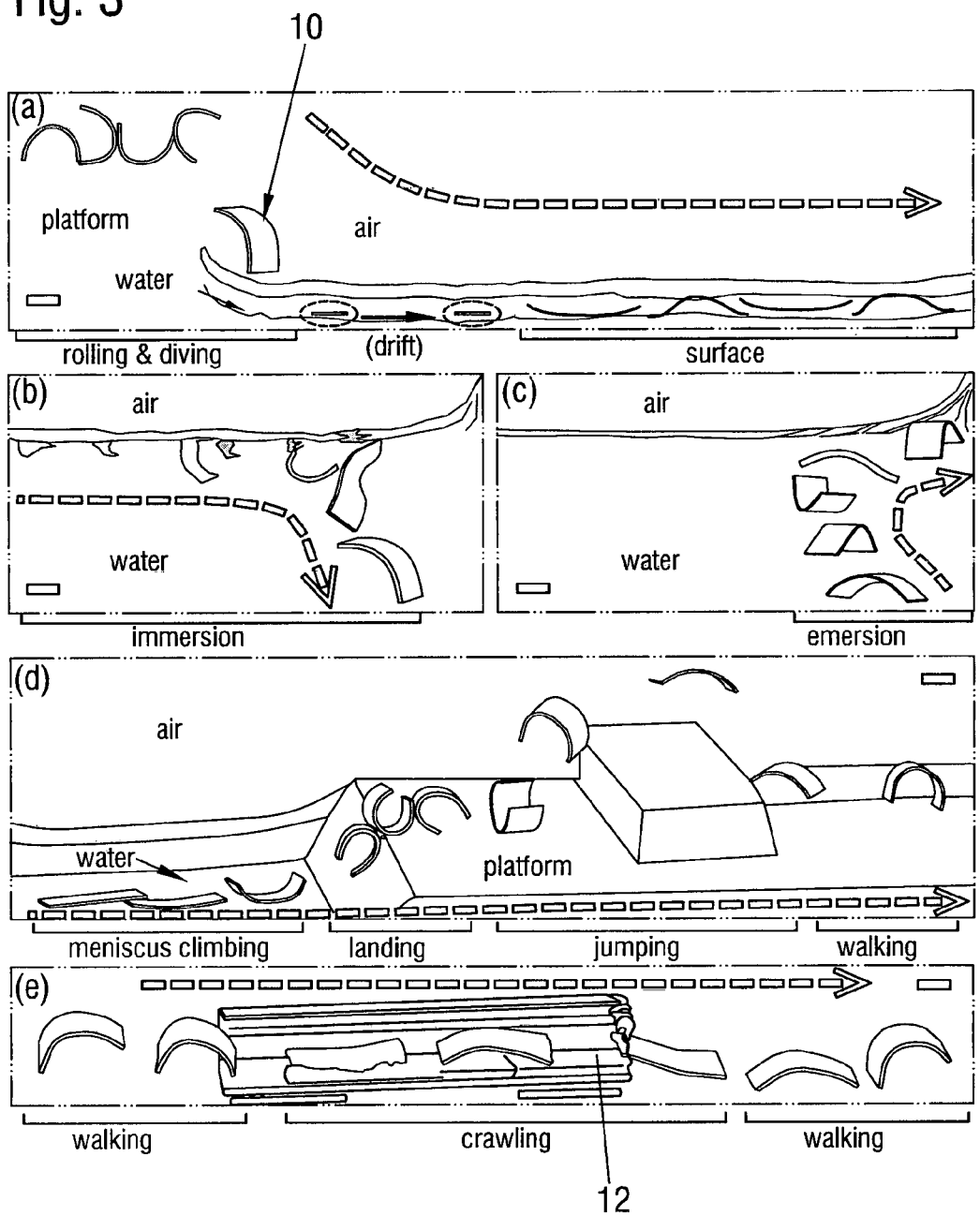

FIG. 3 presents a hybrid liquid-solid environment that a member 10 can fully explore only through the combination of all of its modes of locomotion. A long-ranged water meniscus adjacent to a smooth, hydrophilic solid platform prompts capillary climbing by the member 10, which subsequently jumps directionally beyond an otherwise insurmountable, fixed obstacle. Navigation across the unstructured environment of e.g. a surgical human stomach phantom further illustrates the robustness of the multimodal member locomotion towards future potential biomedical applications.

The environment shown in FIG. 3 features laser-milled, poly(methyl methacrylate) platforms (water contact angle<10°) in a Plexiglas box (52×32×25 mm³) containing deionized water. The various modes of locomotion shown in FIG. 3 are sequentially captured in separate videos of which frames are shown, the scale bars used in these Figs. scale to 1 mm.

In the following the procedures to implement the multimodal mode of locomotion of the member 10 shown in FIG. 3 will be described. In FIG. 3a, the member 10 first uses its rolling locomotion to get onto the water surface. After dipping into the water, the member 10 drifts slightly away from the platform along the meniscus and then starts swimming after it has stabilized. A clockwise magnetic field B (|B|=3 mT, 25 Hz) is applied to let the member 10 swim to the right. Subsequently, the member 10 sequentially bends downwards on the water surface to disengage from the water surface. The member 10 is then and rotated counterclockwise to sink into the water, and subsequently swims back to the water surface to engage again at the water/air interface (FIG. 3b-c).

FIG. 3d shows the member 10 using four different modes of locomotion on land. After climbing onto the solid substrate by way of meniscus climbing the member 10 is present on the solid platform. The net magnetization of the member 10 is subsequently used to rotate the member 10 to the required initial pose for directional jumping to move the member 10 beyond the otherwise unsurmountable obstacle. After this, the member 10 starts to walk.

It has been observed that the member 10 incurs slight slipping before and after jumping across the obstacle due to the magnetic gradient force. As in this case, slip may happen because the currently implemented control loop is open: The member 10 traverses a large working space, and for each position in the space the suitable magnetic actuation matrix is chosen by the human controller. Thus, a small gradient force associated with a control error may be present. Specifically, the slipping happens when the member 10 has only one foot in contact with the substrate, that is, when the friction is smallest and even a small gradient force can displace the member 10.

It is worth noting that the walking can make the member 10 advance against an opposing magnetic gradient pulling force. Moreover, as the net magnetization of the member 10 can steer the member 10, it can be seen that the walking member 10 is initially misaligned with the desired advancing direction, and starts to align with the horizontal component of the magnetic field B after a few periods of walking.

In FIG. 3e, the member 10 first walks towards a glass capillary 14 mimicking a tunnel (inner diameter: 1.62 mm). The tunnel impedes the walking gait of the member 10, such that it gets stuck at the tunnel entrance, because the cross-section of the glass capillary 14 does not allow the member 10 to lift up its front foot to proceed with further walking. To overcome this obstacle the member 10 then switches to the crawling mode of locomotion to pass through the tunnel. At this point the input is switched to a clockwise rotating magnetic field B, and the member 10 starts to crawl through the tunnel. After passing through the tunnel, the walking locomotion is resumed and the member 10 finally leaves the working space.

It has further been discovered that the magneto-elastic member 10 can additionally accomplish functional, shape change-enabled tasks. As an example, gripping and transportation of an object is shown in FIG. 4a.

Figure 4:
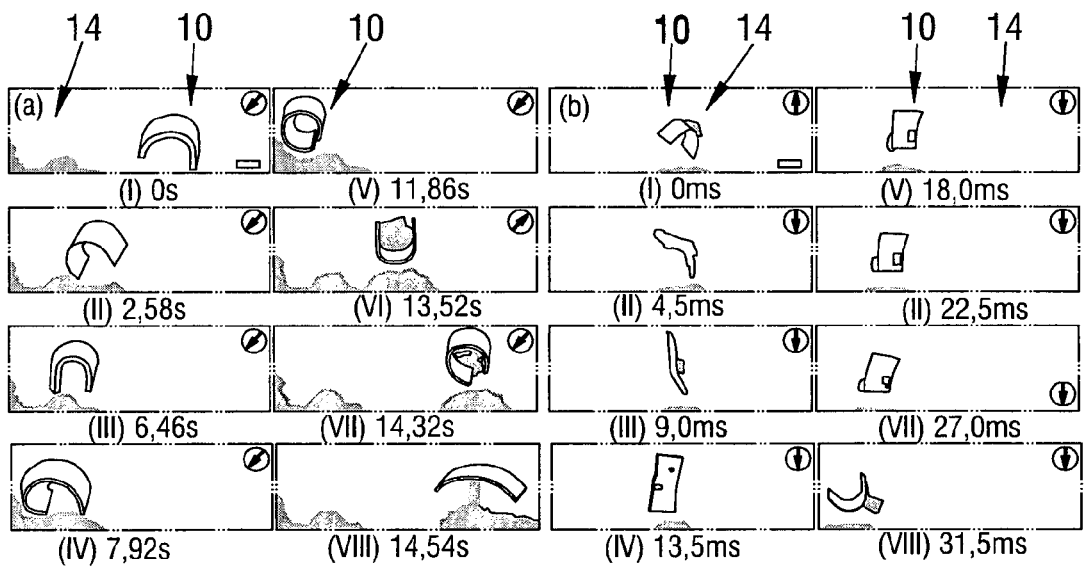

FIG. 4 shows various frames taken from a video depicting the different shapes the member 10 adopts while carrying out a pick up and place task. FIG. 4a shows how the member 10 approaches a cargo item 14 (nylon, 1×0.8×1.5 mm³) by walking on a flat rigid surface, picks up the cargo by curling (frame V, |B|=20 mT), transports away the cargo 14 by rolling and maintaining the curled shape, and releases the cargo 14 by uncurling at a new position.

FIG. 4b shows a dynamic and selective cargo 14 release. A paper tissue (0.5×0.5×0.1 mm³, used as an example of a model drug container) is bound to the member 10 by an extra appendage. After pre-bending the member 10 (frame I), B is quickly reversed (frame II-IV) to open the appendage and release the cargo (frames V-VIII, cargo 14 indicated by the dashed line). The maximum magnetic field applied in these examples is $|B|_{max}$: 30 mT. The loading of the cargo 14 does not hinder the locomotive multimodality of the member 10. The scale bars shown relate to a scale of 1 mm.

In order to produce a programmable magnetic soft composite member 10, a negative base mold is produced (not shown), for example of rectangular shape to form a rectangular shaped magnetized member. A decision is then made if the member 10 should have a varying magnitude of magnetization with varying direction of magnetization over its length l or whether it should have a constant magnitude of magnetization with varying direction of magnetization. If a constant magnitude of magnetization is desired then the base mold is filled with magnetizable material, i.e. an active component (actuatable component) is filled into the negative mold. An example of the active component can comprise a mixture of NdFeB and Ecoflex.

The member 10 comprising the active component is then installed on a jig and then subjected to an external magnetic field to create the different directions of magnetization of the segments s of the member 10. In order to permanently magnetize the member 10, the member 10 is subjected to a strong magnetic field having a strength of around 1.5 T. This is typically achieved by placing and orienting the member and the jig within the magnetic field generated by the electric coils.

If a non-uniform magnitude of magnetization is required then the base mold is filled with a passive component in order to form a rectangular shaped member. For this purpose, a mixture of Al and Ecoflex is used as the passive component and simply poured into the mold in liquid form and allowed to cure.

Having calculated the ideal shape required to form a magnetized component of desired variable magnitude and orientation, a negative component mold for the magnetized component (also not shown) is formed in the passive component, for example by cutting out excess material of the passive component with a laser cutter to form a shaped band having a uniform or non-uniform width. The shape of the band of is based on a programmed magnetization profile.

In a further step the magnetizable material, i.e. the active component, is filled into the negative mold formed by the passive component. An example of the active component can comprise a mixture of NdFeB and Ecoflex. The active component is poured into the component mold formed within the passive component and is cured in the component mold and thereby adheres to the passive component.

The member 10 comprising the passive component and the active component is then installed on a jig and subjected to an external magnetic field to create the different directions of magnetization of the segments s of the member 10. Again, the member 10 is subjected to a strong magnetic field having a strength of around 1.5 T to permanently magnetize the member 10.

In particular the body of the magneto-elastic member 10 is fabricated by loading an Ecoflex-10 polymer matrix (density: 1.04 g/cm$^3$) with neodymium-iron-boron microparticles (MQP-15-7, Magnequench; average diameter: 5 µm, density: 7.61 g/cm$^3$) according to a mass ratio of 1:1. The resulting soft magnetic elastomer has a density of 1.9 g/cm$^3$ and a Young's modulus of 6.4×10$^4$ Pa, as measured by a tensile testing ma-chine (Instron 5943, Instron Inc.). During the fabrication, the pre-polymer is cast onto a flat poly(methyl methacrylate) plate to form a 240 µm-thick film. After thermal polymer curing, the device is laser cut with the desired geometry.

Figure 5:
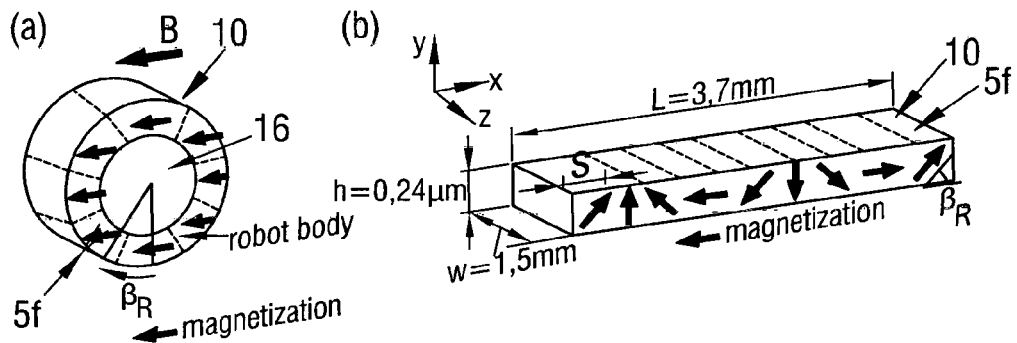

FIG. 5a shows an example jig 16 that is formed by a glass rod. Other forms of jigs can be used to form specific profiles of magnetization. By using a non-uniform width negative component mold into which the active material is introduced a magnetic member 10 of non-uniform magnitude of magnetization is formed in which segments s of the member 10 also have varying directions of magnetization. In the present example, a magnetic field of 1.5 T was applied to magnetize the member 10.

It should be noted in this connection that a magnetic field of at least 1.2 T is required in order to saturate the magnetization of NdFeB.

A detailed description of the embedding process can be found in the publication by G. Z. Lum et al., titled "Shape-programmable Magnetic Soft Matter" and published in *Proceedings of the National Academy of Sciences* vol. 113, E6007-E6015 (2016), in particular in connection with FIG. 5 and the associated description of said publication. The publication by G. Z. Lum et al. also details the mathematical equations required to compute the shape of the negative component mold in order to form the member 10. European patent application EP16175341.3 provides further details of this method of manufacture.

The glass rod forming the jig 16 shown in FIG. 5a shows an elastomeric member 10 comprising NdFeB microparticles that is wrapped around the cylindrical glass tube (perimeter: 3.7 mm) and that is magnetized by a uniform 1.5 T magnetic field produced by a vibrating sample magnetometer. The relative orientation $\beta_R$ defines the phase shift in the magnetization profile. FIG. 5b shows the programmed magnetization profile in the unwrapped member 10 of FIG. 5a, for $\beta_R=45°$.

The member 10 dimensions used in this work are shown in FIG. 5b, where l, w, and h are the length, width, and height of the member 10, respectively.

To create the phase shift, $\beta_R$, in the magnetization profile m (FIG. 5b), the rod is rotated by the angle $\beta_R$ during the member 10 magnetization. If not otherwise mentioned, a $\beta_R$ of 45° is assumed in the following.

It should be noted that the native surface of the composite elastomeric material is hydrophobic and microscopically rough. Static advancing)(116°±3° and receding) (78°±2° water contact angles were measured by the sessile droplet method through an automated goniometer routine that continuously increased and decreased the water droplet volume, respectively (Krüss DSA100). Surface roughness ($R_a$=0.63±0.02 µm and $R_z$=4.37±0.28 µm) was measured by laser interferometry (Keyence VK-X200). The members 10 surface was not subjected to any treatment before the experiments.

Figure 6:
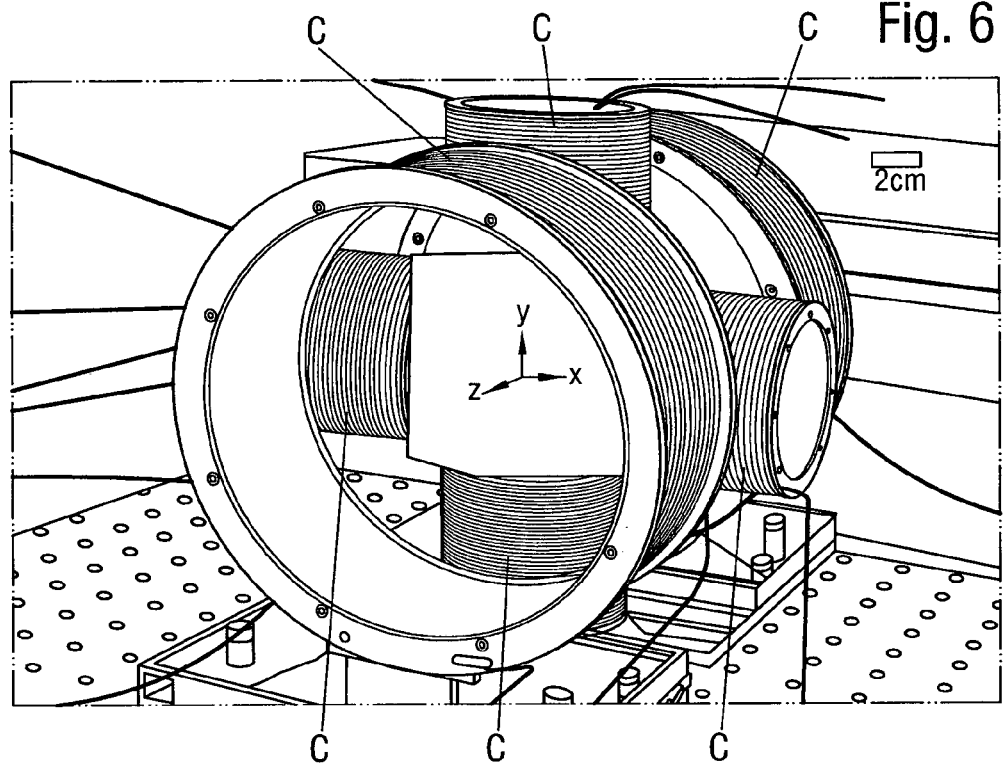

FIG. 6 shows an example of a six-coil C electromagnetic setup M to actuate the magneto-elastic member 10. The global coordinate system in X, Y and Z is indicated. The magnetic actuation setup is composed of three orthogonal pairs of custom-made electromagnets. The input currents driving the electromagnets are specified by software control signals through a custom electronic board. In the present setup a calibrated magnetic actuation matrix was used to map the control current input to the actual magnetic field in the working space. The effective working space along the X, Y and Z coordinates is restricted to 30 mm around the center of the reference system to exclude the effect of nonlinear components of the actuation matrix in close proximity of each coil.

In particular FIG. 6 shows three pairs of coils C respectively arranged at a common axis, with the three common axes intersecting perpendicular to one another at the center of the apparatus. The spacing of each coil from the center is the same and in the specific example amounts to 37.5 mm. Through passing a current through the coils magnetic fields having a magnitude of 0 to 500 mT can be generated at the center of the arrangement. The magnetic field strength can be varied with a frequency of 1 kHz and the direction of the magnetic field can be varied with a frequency of 1 kHz.

|  | Coil pair in X direction | Coil pair in Y direction | Coil in Z direction |
| --- | --- | --- | --- |
| Layers of wires | 3 | 3 | 4 |
| Wraps per layer | 60 | 60 | 40 |
| Wire diameter | 1.05 mm | 1.05 mm | 1.5 mm |
| Distance between two coils in each pair (between two surfaces facing each other) | 75 mm | 75 mm | 75 mm |

-continued

|  | Coil pair in X direction | Coil pair in Y direction | Coil in Z direction |
|---|---|---|---|
| Diameter of each coil | 75 mm | 75 mm | 190 mm |
| Current applied per coil | 0~30 A | 0~30 A | 0~30 A |

In the global center of the working space, the relation between the current in coil and the magnetic field is:

$$\vec{B} = A\vec{I};$$

in which $\vec{B} = [B_x, B_z, B_z]^T$ and $B_x$, $B_y$, $B_z$ are magnetic fields in +X, +Y, +Z directions and are in mT (millitesla); $\vec{I} = [I_x, I_z, I_z]^T$ and $I_x$, $I_y$, $I_z$ are the current flowing through the coil pair, which contains two coils, in each direction and are in A (ampere). Positive current value is defined to produce positive magnetic field in this direction. For our system, the actuation matrix A is:

$$A = \begin{bmatrix} 0.597 & 0 & 0 \\ 0 & 0.597 & 0 \\ 0 & 0 & 0.6378 \end{bmatrix}$$

Based on the prescribed magnetization profile (FIG. 5b), a description will now be given to describe how the member 10 changes its shape when different external magnetic fields, B, are applied. Furthermore, the steering method is illustrated for the soft member 10. The analysis in this section provides a simple theoretical understanding for the experiments discussed in the following.

Quasi-Static Model

In order to discuss the quasi-static shapes that the soft member 10 can assume when subjected to B, the magnetization profile m, along the members 10 length, s, is assumed to be:

$$m(s) = m \begin{pmatrix} \cos(\omega_s s + \beta_R) \\ \sin(\omega_s s + \beta_R) \\ 0 \end{pmatrix} \quad (S1)$$

The variables m and $\omega_s$ represent the magnitude and spatial angular frequency of m(s), respectively, with $$\omega_s = \frac{2\pi}{l}.$$

Using the above m(s) and without any loss of generality, the members 10 local frame is used to describe the actuating magnetic field B (FIG. 5b). As the magnetic field B interacts with the magnetization profile, the soft member 10 experiences a locally varying stress that allows it to create desirable deflections. FIG. 7 shows a quasi-static analysis for the soft member 10. When the member 10 deforms, the bending moment acting on the infinitesimal element at steady state is $\int_s^l \tau_m \, Ads$.

These static deflections can be described via the Euler-Bernoulli equation, where the rotational deflection along the member 10, θ(s), can be expressed explicitly by the actuating magnetic torque, $\tau_m$, as:

$$\int_s^l \tau_m A ds = EI \frac{\partial \theta}{\partial s}$$

where $$\tau_m = [0\ 0\ 1]\{Rm \times B\} \quad (S2)$$

The variables A=hw, I=$h^3$w/12 and E represent the member 10's cross-sectional area, second moment of area and Young's modulus, respectively, while R is the standard z-axis rotational matrix, given as:

$$R = \begin{bmatrix} \cos\theta & -\sin\theta & 0 \\ \sin\theta & \cos\theta & 0 \\ 0 & 0 & 1 \end{bmatrix}. \quad (S3)$$

Physically, the left side of Eq. S2 represents the magnetic actuation that deforms the member 10, while its right side represents the resultant deflections. Since magnetic forces are not applied onto the beam, the shear forces along the beam will be zero at steady-state and so can be neglected for the quasi-static analyses (see FIG. 7). For the locomotion modes that have small deflections, such as swimming and crawling, Eq. S2 can be simplified by approximating R with a simple 3×3 identity matrix, s≈x (along the body frame's x-axis), and $$\theta \approx \frac{\partial y}{\partial x}$$

where y refers to the vertical deflection. The governing equation then becomes:

$$\int_x^l [0\ 0\ 1]\{m \times B\}dx = EI \frac{\partial^2 y}{\partial x^2} \quad (S4)$$

Using Eq. S4, the shape of the member 10 can be described via the linear combination of two principal shapes, resembling respectively a cosine and a sine function. The first principal shape can be enforced when the direction of the magnetic field B is parallel to $[\cos \beta_R\ \sin \beta_R\ 0]^T$, i.e., $B = B[\cos \beta_R\ \sin \beta_R\ 0]^T$, and as presented in (1), Eq. S4 can be double integrated to become:

$$y(x) = \frac{mAl^3 B}{8\pi^3 EI} \cos\left(\frac{2\pi}{l} x\right) \quad (S5)$$

In a similar manner, when B is parallel to $[-\sin(\beta_R)\ \cos(\beta_R)\ 0]^T$, i.e., $B = B[\sin(\beta_R) - \cos(\beta_R)\ 0]^T$, Eq. S4 can be double integrated to become:

$$y(x) = \frac{mAl^3 B}{8\pi^3 EI} \sin\left(\frac{2\pi}{l} x\right) \quad (S6)$$

While Eqs. S4-S6 can fully describe the achievable shapes for the swimming and crawling locomotion (see FIG. 1b), they can only be used as an approximation for the other modes of locomotion, with the other modes of locomotion making use of large deflections. Despite the limitations, Eq. S5 can still be used to approximate large beam (member) deflections, since a large magnitude magnetic field B parallel to $[\cos \beta_R \sin \beta_R \ 0]^T$ creates a distorted cosine shape that resembles a semicircle (FIG. 1b). While the cosine function cannot fully describe the semicircle-like shape, Eq. S5 suggests that a larger curvature can be achieved when the amplitude of the cosine function is increased. The capability to create the large curvature semicircle-like shape is essential to achieve most locomotion and transition modes.

Steering Strategy

In the un-deformed state, the soft member 10 does not have a net magnetic moment. The member 10 can still produce a net magnetic moment upon deformation. As the net magnetic moment $M_{net}$ of the member 10 tends to align with the applied magnetic field B, the direction of the magnetic field B can be controlled to steer the member 10 while it moves. $M_{net}$ can be expressed as:

$$M_{net} = \int_0^l Rm \ A \ ds \tag{S7}$$

To achieve the multiple modes of locomotion, the magnetic field B is used to steer $M_{net}$ and to allow the member 10 to move along an intended direction or to produce the necessary tilting (e.g., for walking).

In the following a description of the magnetic field B required to achieve each of the different modes of locomotion expressed by the shown member 10 will be given. Moreover, additional experimental details necessary to combine all the modes of locomotion together will also be provided. Unless stated to the contrary the member 10 described in the following has a $\beta_R$ of 45°.

Low-Magnitude (<5 mT) Rotating B: Undulating Swimming and Crawling

The undulating swimming and crawling modes of locomotion require similar undulating, time-varying shapes. Like the Taylor swimming sheet, the soft member 10 achieves its undulation by using a rotating magnetic field B of low magnitude and relatively high frequency.

FIG. 8 shows the rotating magnetic field B sequence enabling the undulating motion of the magneto-elastic member 10. FIG. 8a shows the required B plotted against time to undulate the member 10 to the right. The variables $B_x$ and $B_y$ represent the magnetic field along the x- and y-axis of the coordinate system, shown in FIG. 8b. FIG. 8b shows the two principle shapes as described by Eq. S5-S6 (reproduced from frame I in FIG. 1b). The scale bars shown scale to 1 mm.

Based on Eq. S5-S6, when the field angle of the magnetic field B, represented by a, is 135° or 225° (FIG. 8b), a small magnetic field |B| (3 mT) enables the member 10 to produce a shape that resembles a cosine or a sine function, respectively. As a is subsequently rotated, the member 10 produces a traveling wave along its body. The deformation produced by the time-dependent undulation can be described mathematically as:

$$y(x, t) = \frac{mAl^3B}{8\pi^3 EI}\left[\cos\left(\frac{2\pi}{l}x\right)\cos\left(\frac{2\pi}{T}t\right) + \sin\left(\frac{2\pi}{l}x\right)\sin\left(\frac{2\pi}{T}t\right)\right] \tag{S8}$$

where the variable T represents the period of the rotating magnetic field B.

High Magnitude (>7 mT), Low Frequency (<15 Hz) B: Rolling, Immersion, Meniscus Climbing and Landing FIG. 9 shows the rotating sequence of the magnetic field B enabling the rolling mode of locomotion. FIG. 9a shows the required B plotted against time (normalized to one period) to roll clockwise. The variables $B_x$ and $B_y$ represent the magnetic field along the x- and y-axis of the coordinate system, shown in FIG. 9b. FIG. 9b shows the semi-circle shape required for the rolling locomotion (reproduced from frame I in FIG. 2e). The scale bars indicated an actual size of 1 mm.

To perform the rolling locomotion shown e.g. in FIG. 2e, a large magnitude magnetic field B (15 mT) is first applied along a field angle of 157° to deflect the member 10 into a distorted cosine shape resembling a semicircle-like shape (see FIG. 9b). The deflected member 10 produces a $M_{net}$ described by Eq. S7, allowing the member 10 to be steered via a gradual rotation of the direction of the magnetic field B. During this period of time, a rigid-body magnetic torque, $\tau_{rigid-body}$, is induced by the member 10, which can be described mathematically as:

$$\tau_{rigid-body} = M_{net} \times B. \tag{S9}$$

Once the rotation of the magnetic field B is stopped, the $M_{net}$ of the member 10 will be aligned with its final direction, and $\tau_{rigid-body}$ will be reduced to a null vector.

FIG. 10 shows the sequence of the magnetic field B to perform the meniscus climbing mode of locomotion. FIG. 10a shows the required magnetic field B plotted against time to climb the meniscus on the right. The variables $B_x$ and $B_y$ represent the magnetic field along the x- and y-axis of the coordinate system, shown in FIG. 10b. When the magnetic field B has a field angle of 315°, the member 10 produces a shape that resembles a semi-circle. The member 10 pins on the water surface with its feet under deformation. The scale bar shown depicts an actual size of 1 mm.

This rigid-body torque is necessary for meniscus climbing. The required magnetic field B sequences to perform meniscus climbing are shown in FIG. 10a. The initial magnetic field B (|B|=11.7 mT, α=315°) is imposed to let the member 10 assume a vertically symmetric pose with upward curvature (FIG. 10b). In 400 ms the member 10 achieves a stable position along the meniscus known to depend on both the initial meniscus profile and the curvature of the device. The magnetic field B is subsequently rotated clockwise toward α=157° to progressively displace the position of the member 10 along the meniscus and raise its center of mass. Once the device reaches contact with the solid substrate, the magnetic field B is turned off and the member 10 rests on the edge of the adjacent platform (see also Frame I in FIG. 2d).

FIG. 11 shows the rotating B sequence required to perform immersion. FIG. 11a shows the required B plotted against time (normalized to one period) to rotate counter-clockwise and immerse into the water. The variables $B_x$ and $B_y$ represent the magnetic field along the x- and y-axis of the coordinate system, shown in FIG. 11b. FIG. 11b shows the initial curving of the member 10 for immersion (reproduced from frame I in FIG. 2c). The scale bar shown depicts an actual size of 1 mm.

The sequence of the magnetic field B for immersion is shown in FIG. 11. In this mode of locomotion, the member 10 rotates counterclockwise to reduce the contact with the water-air interface to a minimum, right before a quick flip in the direction of B intervenes to disengage it and let it sink (0.9 time unit in FIG. 11a).

FIG. 12 shows the rotating B sequence to perform landing. FIG. 12a shows the required magnetic field B plotted against time to escape the capillary attraction of the water. The variables $B_x$ and $B_y$ represent the magnetic field along the x- and y-axis of the coordinate system, shown in 12b.

FIG. 12b shows the initial curving of the member 10 for landing (reproduced from the frame I of FIG. 2d).

During the landing mode of locomotion water can easily dewet the surface of the member 10 because its high receding contact angle leaves the receding contact lines unpinned. The magnitude of the applied magnetic field B decreases at the 0.2 time unit in FIG. 12a from 11.7 mT to 5 mT. Before this time point, most of the member 10 has peeled away from the water surface and a large magnetic field B is no longer necessary.

FIG. 13 shows the rocking sequence of the magnetic field B required to perform the walking mode of locomotion. FIG. 13a shows the required magnetic field B plotted against time to walk rightward. The actuation is divided into four phases, corresponding to Frame I-V in FIG. 2f. Note that the actuation is periodic, so that Frame I corresponds to Frame V. FIG. 13b shows how when the magnetic field B has a field angle of 315° the member 10 produces a shape that resembles a semi-circle (reproduced from the frame I of FIG. 2f). The scale bar shown depicts an actual size of 1 mm.

FIG. 14 shows the flipping magnetic field B sequence enabling the jelly fish-like swimming motion mode of locomotion of the magneto-elastic member 10. FIG. 14a shows the required B plotted against time to make the member 10 swim like a jellyfish upwards inside water. The variable $B_y$ represents the magnetic field along y-axis of the coordinate system, shown in FIG. 14b. $B_x$ is zero throughout the period. FIG. 14b shows the two shapes assumed by the member 10 during swimming. The scale bar shown depicts an actual size of 1 mm.

The jellyfish-like swimming shown in FIG. 14 in bulk liquid is implemented by periodic flipping of the magnetic field B along the vertical direction to give a fast power (downward) stroke and slow recovery stroke. In this way the member 10, functioning at a Reynolds number Re ~2.3, is shown to swim upward against the gravitational field, and even against the downward magnetic field gradient eventually present at the vicinity of the bottom coil of the working space.

Flipping the magnetic field B can also make the member 10 jump. To this end FIG. 15 shows snapshots of frames taken to illustrate straight and directional jumping by way of the magneto-elastic member 10. The first six video frames and time-lapse (last column) are shown for each jumping sequence. The same member 10 with $\beta_R$=−90° was used in all cases. The recording speed was adapted to the dynamics of each jump type. FIG. 15a shows Type-1 straight jumping (550 fps). There is almost no net magnetization in the second frame as the member 10 is almost flat. In this example the maximum magnetic field $B_{max}$ is 12 mT.

FIG. 15b shows Type-2 straight jumping (355 fps). In this example the maximum magnetic field $B_{max}$ is 18.9 mT. FIG. 15c shows directional jumping (720 fps), which is also shown in FIG. 2e. The direction of the magnetic field B (18.9 mT) applied is switched from 189° to 0° and maintained for 25 ms. In the frames where the magnetic field B is applied, the instantaneous net magnetization vector of the member 10 is indicated by the arrow. FIG. 15d shows the magnetization profile used for the member 10 in (a-c), and its magnetic response under large |B|. The scale bar shown depicts an actual size of 1 mm.

All types of jumping are achieved by quickly flipping the direction of the magnetic field B via a step or a fast ramp function. In order to effect this a single pair of coils is preferably used to create a (vertical) magnetic field B along the Y-axis of the global reference system and the factors affecting the jumping performance.

When a $\beta_R$=45° is used, a magnetic field B along the (1,1) direction in the X-Y plane can be used, though this is prone to more errors since two pairs of coils have to be used.

In Type-1 straight jumping, the member 10 is first pre-bent by the magnetic field to curl upward and stand on its center (frame I of FIG. 15a). The direction of the magnetic field B is then quickly reversed to force the member 10 to flatten out (frames II and III of FIG. 15a) and hit the substrate with its feet. An example of the modeling framework used to optimize this type of jump is shown in the following. In contrast to this, Type-2 straight jumping does not require pre-bending, as the magnetic field B is only applied to curl the member 10 to jump (FIG. 15b). This difference between Type-2 and Type-1 jumping is characterized by using: 1) different ramping time of external magnetic field B; 2) different magnitude of the magnetic field B used; 3) a different magnetic field B spatial gradient; and 4) for two types of m.

Directional jumping (FIG. 15c) is also featured in the multimodal locomotion experiment shown in FIG. 3b. The results shown in FIG. 3e are re-plotted in FIG. 15c with more details. For this type of jump, the member 10 is initially deformed into a shape that resembles a cosine function. Subsequently, the direction of the applied magnetic field B is slightly rotated (~9°) about the longitudinal axis of the member 10 to specify the rotational direction during the jump.

Following this a step change in the direction of the magnetic field B is imparted, this simultaneously incepts both rigid-body rotation (clockwise here, to align the net magnetization to the external magnetic field B direction), and shape change (frames I-Ill in FIG. 15c). During the rotation, the shape of the member 10 changes to an inverted cosine, increasing the momentum of the member 10 before it strikes the substrate (frames III-V in FIG. 15c).

It should be noted in this connection that the jumping mode of locomotion of the member 10 is sensitive to the initial pose and shape of the member 10. Exact consecutive reproduction of the same jump may be hindered by the inherent viscoelasticity of the body of the member 10 and by the associated shape hysteresis.

In the following a discussion will also be presented on how the dimensions of the member 10 affect the performance of each mode of locomotion, in particular how the dimensions of the member 10 affect its swimming and crawling speed. In order to facilitate this discussion, simple theoretical models are employed that can approximate the physics of each mode of locomotion. The derivation of these models is a first step towards understanding the full physics of a miniature soft member 10 with multimodal modes of locomotion.

Figure 16:
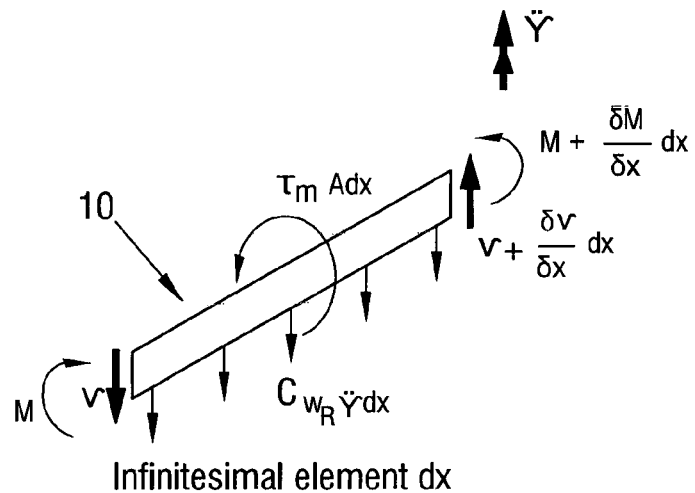

The speed of the swimming and crawling modes of locomotion depends on the highest rotational frequency of the magnetic field B that the member 10 can respond to, the mechanical bandwidth of the member 10, i.e. its non-zero fundamental natural frequency can be computed. This computation can be achieved by using a simple vibrational analysis where small deflections for the member 10 are assumed. Using this assumption, Newton's second law is initially used to analyze an arbitrary infinitesimal element of the member 10, dx, at a time t. FIG. 16 shows a vibrational analysis of the member 10 by showing the forces and torques acting on an infinitesimal element of the member 10.

Based on Newton's force law, the equation of motion of such an element along the vertical axis is given as:

$$-C w \dot{y} + \frac{\partial v}{\partial x} = \rho A \ddot{y} \quad \text{(S10)}$$

where C, v and ρ represent the damping coefficient, shear force and density along the member 10's body, respectively. In Eq. S10, $-Cw\dot{y}$ and $\rho A \ddot{y}$ represent the damping and inertia forces acting on the element, respectively.

In a similar manner, τ=Jα can be used to obtain the rotational equation of motion for this element about its bending axis:

$$\frac{\partial v}{\partial x} = -\frac{\partial^2 M_b}{\partial x^2} - \frac{\partial \tau_m}{\partial x} A \quad \text{(S11)}$$

The variable $M_b$ represents the bending moment acting on the element, and based on the Euler-Bernoulli equation, it is also equivalent to $$EI \frac{\partial^2 y}{\partial x^2}.$$

Therefore, by substituting Eq. S11 into Eq. S10, one can obtain the governing equation for the beam:

$$-C w \dot{y} - EI \frac{\partial^4 y}{\partial x^4} - \frac{\partial \tau_m}{\partial x} A = \rho A \ddot{y} \quad \text{(S12)}$$

The well-established mode-shape analysis is used to evaluate this partial differential equation. A free-vibration analysis is initially used to obtain the mode shapes of the member 10, i.e. the damping effects and magnetic actuation are temporarily removed from Eq. S12. Subsequently, the variable separation method for y is used such that $$y(x,t) = F(x)G(t) \quad \text{(S13)}$$

where F(x) is solely a function of x and G(t) is only a function of time. By substituting Eq. S13 into Eq. S12 (without the damping effects and magnetic actuation) and rearranging the terms, one obtains:

$$-\frac{EI}{\rho A} \left( \frac{\partial^4 F}{\partial x^4} \right) \left( \frac{1}{F} \right) = \left( \frac{1}{G} \right) \ddot{G}. \quad \text{(S14)}$$

Based on classical vibration analysis, both sides of Eq. S14 are independent of x and t, and they can be equated to become a function of the $R^{th}$ natural frequency, $\omega_{n,R}^2$, of the member 10 ($F_R$):

$$\left( \frac{1}{G} \right) \ddot{G} = -\omega_{n,R}^2 \quad \text{(S15)}$$

and $$-\frac{EI}{\rho A} \left( \frac{\partial^4 F}{\partial x^4} \right) \left( \frac{1}{F} \right) = -\omega_{n,R}^2. \quad \text{(S16)}$$

After solving the homogeneous equation in Eq. S16, one can obtain both $\omega_{n,R}^2$ and the $R^{th}$ mode shape of the member 10 ($F_R$):

$$F_R = A_R e^{\frac{\sqrt{\omega_n}}{\beta} x} + B_R e^{-\frac{\sqrt{\omega_n}}{\beta} x} + C_R \cos\left( \frac{\sqrt{\omega_n}}{\beta} x \right) + D_R \sin\left( \frac{\sqrt{\omega_n}}{\beta} x \right) \quad \text{(S17)}$$

where $$\beta^4 = \frac{EI}{\rho A}$$

and the variables $A_R$, $B_R$, $C_R$, and $D_R$ are constants dependent on the boundary conditions of the member 10. Because the member 10 has free ends, the following free-free boundary conditions are substituted into Eq. S17:

$$\begin{cases} \frac{\partial^2 y}{\partial x^2}(x=0) = \frac{\partial^2 y}{\partial x^2}(x=l) = 0 \\ \frac{\partial^3 y}{\partial x^3}(x=0) = \frac{\partial^3 y}{\partial x^3}(x=l) = 0 \end{cases} \quad \text{(S18)}$$

Physically, the boundary conditions in Eq. S18 dictate that there are no shear forces and bending moments acting on the free ends of the member 10. Based on these boundary conditions, one can obtain the following characteristic equation for the member 10:

$$\cos\left( \frac{\sqrt{\omega_{n,R}}}{\beta} l \right) \left( e^{\frac{\sqrt{\omega_{n,R}}}{\beta} l} + e^{-\frac{\sqrt{\omega_{n,R}}}{\beta} l} \right) = 2 \quad \text{(S19)}$$

Once the characteristic equation has been solved numerically, the two lowest natural frequencies of the member 10 are given as:

$$\frac{\sqrt{\omega_{n,1}}}{\beta} l = 0 \text{ and } \frac{\sqrt{\omega_{n,2}}}{\beta} l = 4.73 \quad \text{(S20)}$$

The first mode, $\omega_{n,1}$, represents the rigid-body motion of the member 10, while the second mode shows the non-zero fundamental natural frequency of the member 10. As the first mode does not describe the shape change of the member 10 with respect to the actuating magnetic field's frequency, the presented frequency response analysis begins with the second lowest natural frequency, i.e.s $\omega_{n,2}$. Based on Eq. S20, this natural frequency can be expressed as:

$$\omega_{n,2} = 4.73^2 \sqrt{\frac{E}{12\rho}} \left( \frac{h}{l^2} \right). \quad \text{(S21)}$$

Using Eq. S21 and the Taylor swimming sheet model, one can approximate the achievable swimming speed, $v_{swim}$, of the member 10. Although the selected fluidic boundary conditions result in a slight deviation from the Taylor model, i.e. the presented member 10 swims on the water surface and not far away from walls, it is assumed that the following equation can still capture the fundamental dynamics of the swimming locomotion:

$$v_{swim} = \frac{2\pi^2}{l}\left(\frac{mAl^3B}{8\pi^3 EI}\right)^2 f \qquad (S22)$$

where f represents the frequency of the traveling wave (coincident with the rotation frequency of B). As $v_{swim}$ can be maximized by applying the highest f and since the highest f is limited by $$f = \frac{\omega_{n,2}}{2\pi},$$

one can rewrite Eq. S20 as:

$$v_{swim} = 4.73^2 \pi \left[\left(\frac{12mB}{8\pi^3 E}\right)^2 \sqrt{\left(\frac{E}{12\rho}\right)}\right]\left(\frac{l^4}{h^3}\right) \qquad (S23)$$

Based on Eq. S23, the swimming speed of the member 10 can be increased when its l and h are increased and decreased, respectively.

Similar to the swimming mode of locomotion, the member 10 can crawl faster when it can produce a faster undulating frequency. However, in order to enhance the crawling speed one would have to increase the second lowest natural frequency of the member 10, and Eq. S21 implies, in contrast to Eq. S23, that h should be increased while l should be decreased.

The rolling mode of locomotion also uses a rotating magnetic field B to control the soft member 10. However, in this case the magnetic field B rotation frequency f has to be much slower ($f<15$ Hz in the present example) than the one utilized in the swimming and crawling mode of locomotion to prevent the member 10 from creating a traveling wave along its body. Therefore, it will not be necessary to use vibrational analyses to evaluate the performance of this mode of locomotion.

It is assumed that the rolling mode of locomotion is similar to that of a wheel, such that it is more efficient when the member 10 becomes rounder. A rounder shape will require the soft member 10 to produce deformations that have large curvatures. While the cosine function in Eq. S5 cannot fully describe the semicircular shape of the member 10 for the rolling mode of locomotion, this equation suggests that a larger curvature can be achieved when the amplitude of this cosine function, i.e., $$\frac{mAl^3B}{8\pi^3 EI},$$

can be increased. As m, B, E and other constants are independent of the dimensions of the member 10, one can conclude that a larger curvature can be easily accomplished when $$\frac{Al^3}{I}$$

is maximized. Since $$\frac{Al^3}{I} = \frac{hwl^3}{\frac{1}{12}wh^3} = 12\frac{l^3}{h^2},$$

larger curvatures can be achieved by increasing l and decreasing h.

Similar to the rolling mode of locomotion, the effectiveness of meniscus climbing is highly dependent on the maximum achievable curvature of the member 10. As a result, one can use Eq. S5 and the above discussion on rolling to approximate how the dimensions of the member 10 can affect the climbing behavior of the member 10. This equation suggests that a larger curvature can be achieved by increasing l and decreasing h.

Jumping

Figure 17:
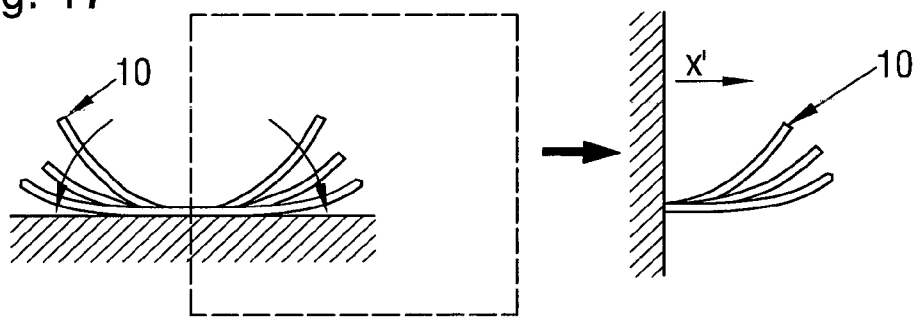

FIG. 17 shows the boundary condition for the Type-1 straight jump (see also FIG. 15*a*). The analysis can be simplified by considering a fixed-free half beam, since the center point of the member 10 neither rotates nor translates and the motion is symmetrical about this point.

As it is very challenging to derive a mathematical model that can accurately describe how the dimensions of the member 10 can affect its jumping performance, only a simple vibrational analysis will be provided as a first step towards understanding this mode of locomotion. The presented analysis is performed to approximate the simplest jumping mode—Type-1 straight jump in FIG. 15*a*. To proceed with this vibrational analysis, one assumes that the shape of the member 10 begins with a cosine function in stage I (FIG. 17*a*). Furthermore, after the member 10 is subjected to a step change in B direction (i.e. flipping B for 180°), the shape of the member 10 will tend to change into an inverted cosine function. During this transition, the member 10 experiences an impact with the substrate, allowing itself to jump (stage II).

The formulation can be reduced to analyze only half of the beam because the jumping motion is symmetrical about the center point of the member 10, which neither rotates nor translates, and its boundary condition can be simplified into a fixed-free type (FIG. 17).

In order to facilitate the formulation in the following, one uses l' to represent l/2 and x'=x−l'. Using these variables, one can mathematically represent the boundary conditions for half of the member 10 as:

$$\begin{cases} y(x'=0) = \frac{\partial y}{\partial x}(x'=0) = 0 \\ \frac{\partial^2 y}{\partial x^2}(x'=l') = \frac{\partial^3 y}{\partial x^3}(x'=l') = 0 \end{cases} \qquad (S24)$$

Although the boundary conditions for the jumping mode of locomotion is different from the swimming mode of locomotion, the vibrational analysis from Eq. S10-17 is still valid. By substituting the boundary conditions in Eq. S24 into Eq. S17, one obtains the following characteristic equation:

$$\cos\left(\frac{\sqrt{\omega_{n,R}}}{\beta}l'\right)\cosh\left(\frac{\sqrt{\omega_{n,R}}}{\beta}l'\right) - 1 \qquad (S25)$$

Once the $R^{th}$ natural frequency in Eq. S25 has been solved numerically, this value is substituted back into Eq. S17 to obtain the corresponding mode shape:

$$F_R(x) = e^{\frac{\sqrt{\omega_{n,R}}}{\beta}x'} + \tag{S26}$$

$$\frac{e^{\frac{\sqrt{\omega_{n,R}}}{\beta}l'} + \cos\left(\frac{\sqrt{\omega_{n,R}}}{\beta}l'\right) + \sin\left(\frac{\sqrt{\omega_{n,R}}}{\beta}l'\right)}{-e^{-\frac{\sqrt{\omega_{n,R}}}{\beta}l'} - \cos\left(\frac{\sqrt{\omega_{n,R}}}{\beta}l'\right) + \sin\left(\frac{\sqrt{\omega_{n,R}}}{\beta}l'\right)} e^{-\frac{\sqrt{\omega_{n,R}}}{\beta}x'} +$$

$$\frac{e^{-\frac{\sqrt{\omega_{n,R}}}{\beta}l'} - e^{\frac{\sqrt{\omega_{n,R}}}{\beta}l'} - 2\sin\left(\frac{\sqrt{\omega_{n,R}}}{\beta}l'\right)}{-e^{-\frac{\sqrt{\omega_{n,R}}}{\beta}l'} - \cos\left(\frac{\sqrt{\omega_{n,R}}}{\beta}l'\right) + \sin\left(\frac{\sqrt{\omega_{n,R}}}{\beta}l'\right)} \cos\left(\frac{\sqrt{\omega_{n,R}}}{\beta}x'\right) +$$

$$\frac{e^{-\frac{\sqrt{\omega_{n,R}}}{\beta}l'} + e^{\frac{\sqrt{\omega_{n,R}}}{\beta}l'} + 2\cos\left(\frac{\sqrt{\omega_{n,R}}}{\beta}l'\right)}{-e^{-\frac{\sqrt{\omega_{n,R}}}{\beta}l'} - \cos\left(\frac{\sqrt{\omega_{n,R}}}{\beta}l'\right) + \sin\left(\frac{\sqrt{\omega_{n,R}}}{\beta}l'\right)} \sin\left(\frac{\sqrt{\omega_{n,R}}}{\beta}x'\right)$$

By substituting the obtained mode shapes into Eq. S12, rearranging the terms and normalizing the inertia terms, the following equation is obtained:

$$\sum_{R=1}^{\infty}(F_R\ddot{G}_R) + \frac{C}{\rho h}\sum_{R=1}^{\infty}(F_R\dot{G}_R) + \frac{EI}{\rho A}\sum_{R=1}^{\infty}\left(\frac{\partial^4 F_R}{\partial x^4}G_R\right) = -\frac{1}{\rho}\frac{\partial \tau_m}{\partial s} \tag{S27}$$

Because the magnetic actuation on the right side of Eq. S27 can be computed as:

$$-\frac{1}{\rho}\frac{\partial \tau_m}{\partial s} = \frac{2\pi B}{pl'}\cos\left(\frac{\pi}{l'}x'\right),$$

Eq. S27 becomes:

$$\sum_{R=1}^{\infty}(F_R\ddot{G}_R) + \frac{C}{\rho h}\sum_{R=1}^{\infty}(F_R\dot{G}_R) + \frac{EI}{\rho A}\sum_{R=1}^{\infty}\left(\frac{\partial^4 F_R}{\partial x^4}G_R\right) = \tag{S28}$$

$$\frac{2\pi B}{pl'}\cos\left(\frac{\pi}{l'}x'\right)$$

To simplify the discussion, only the fundamental natural frequency and mode shape are used to describe the jumping mode of locomotion. While the exclusion of other mode shapes might introduce errors into this prediction, it is believed that the discussion is still valid, since the fundamental mode shape is the most critical component in Eq. S28. Therefore, the orthogonal property for vibration is used and Eq. S28 is multiplied with $F_1$ and subsequently both sides are integrated over x' from x'=0 to x'=l' to obtain the following equation:

$$\int_0^{l'} F_1^2 dx' \ddot{G}_1 + \frac{C}{\rho h}\int_0^{l'} F_1^2 dx' \dot{G}_1 + \frac{EI}{\rho A}\int_0^{l'} \frac{\partial^4 F_1}{\partial x^4} F_1 dx' G_1 = \tag{S29}$$

$$\frac{2\pi B}{pl'}\int_0^{l'}\cos\left(\frac{\pi}{l'}x'\right)F_1 dx'$$

The characteristic equation in Eq. S25 numerically evaluates that $$\frac{\sqrt{\omega_{n,1}}}{\beta}l' = 1.88,$$

and by using this value one numerically determines $$\int_0^{l'} F_1^2 dx = 19.9l', \int_0^{l'}\frac{\partial^4 F_1}{\partial x^4}F_1 dx = \frac{l'}{2}\left(\frac{1.88}{l'}\right)^4,$$

and $$\int_0^{l'}\cos\left(\frac{\pi}{l'}x'\right)F_1 dx = -3.26l'.$$

By substituting these values back into Eq. S27 and normalizing the inertia term, one obtains:

$$\ddot{G}_1 + \frac{C}{\rho h}\dot{G}_1 + \left(\frac{12.4EI}{\rho A(l')^4}\right)G_1 = -\frac{0.52mB}{\rho l'} \tag{S30}$$

At stage I, the member 10's initial shape can be expressed as $$A_0\left[1 - \cos\left(\frac{\pi}{l'}x'\right)\right]$$

where $A_0$ is a positive real number that represents the amplitude of the cosine function. Similar to Eq. S27, one can use the orthogonal property of classical vibration analysis to extract the initial condition for $G_1(t=0)$, i.e., one can multiply the initial shape of the member 10 with $F_1$ and subsequently integrate the new function over x' from 0 to l'. Based on numerical evaluation, one obtains $G_1(t=0)=G_{1,0}l$, where $G_{1,0}$ is a positive real number. Because the member 10 does not have an initial speed, one can conclude that the second initial condition can be expressed as $\dot{G}_1(t=0)=0$. Therefore, by using these two initial boundary conditions and assuming the system is underdamped (i.e. low magnitude of C) one can solve Eq. S30 to obtain:

$$\dot{G}_1 = -\left[G_0 l' + \frac{0.04mABl^3}{EI}\right] \tag{S31}$$

$$\left(\sqrt{\frac{C^4}{16\rho^4 h^4(\omega_d^2)} + \frac{C^2}{2p^2h^2} + \omega_d^2}\right)e^{-\frac{C}{2\rho h}t}\cos(\omega_d t + \phi + \varphi),$$

Where $$\omega_d^2 = \frac{12.4EI}{\rho A(l')^4} - \frac{C^2}{p^2 h^2}, \tan\phi = -\frac{C}{2\rho h \omega_d}, \tan\varphi = \frac{2\rho h \omega_d}{C}$$

The kinetic energy for the member 10 before it impacts the substrate at time $t_f$, $E_{kE,i}$, can then be approximated numerically as:

$$E_{kE,i} = \tfrac{1}{2}\iiint \dot{y}^2 \rho \, dV = \tfrac{1}{2}\int_0^l (F_1 \dot{G}_1)^2 \rho w h \, dx = 19.9 \rho l' w h \dot{G}_1^2 \quad (t=t_f) \tag{S32}$$

where V represents the volume of the member 10. After striking the substrate, Newton's law of restitution dictates that the kinetic energy of the member 10, $E_{kE,f}$ will become:

$$E_{kE,f} = \gamma^2 E_{kE,i} \tag{S33}$$

where γ represents the coefficient of restitution and it is a positive real number that is between 0 and 1. One assumes that $E_{kE,f}$ can be converted fully to gravitational potential energy such that:

$$\rho V g z = E_{kE,f} \tag{S34}$$

where z is the highest point of the jump. Therefore, by substituting Eq. S32 and S33 into S34, and rearranging the equation, one can approximate z as:

$$z = 19.9 \gamma^2 \dot{G}_1^2 (t=t_f) \tag{S35}$$

To maximize z, the magnitude of $\dot{G}_1^2(t=t_f)$ and $\gamma^2$ have to be maximized. However, as $\dot{G}_1^2(t=t_f)$ is highly dependent on other parameters like C, ρ, E and $t_f$, it is difficult to deduce the effects of h and l for such a complex function. Likewise, it is also difficult to deduce the mathematical relationship between $\gamma^2$ and the dimensions of the member 10, i.e., its w, h and l. As a result, it is believed to be necessary to perform a numerical optimization to determine the optimal values of h, w and l such that the member 10 can maximize z.

Walking and Jellyfish-Like Swimming

The net stride of the member 10 in one walking cycle is dependent on the difference between the curvature of the member 10 in Steps 3 and 4. Thus, when a larger curvature can be achieved in Step 4, the member 10 can produce a bigger stride. By using similar analyses as presented in the foregoing, one can deduce that a larger stride can be achieved per cycle when l is increased and h is decreased.

On the other hand, the walking speed also depends on the bandwidth of the member 10, i.e. the capability to respond to high frequency periodic magnetic fields B. In this instance the bandwidth of the member 10 is approximated with its fundamental natural frequency, so that based on Eq. S21 the bandwidth can be increased when l is decreased and h is increased. Because the criteria to produce a larger stride are contrary to the criteria for higher bandwidth, it is possible to perform numerical optimization methods to determine the optimal dimensions of the member 10.

In a similar manner, greater swimming propulsion can be generated in one swimming cycle (jellyfish-like swimming) when the speed difference between the power and recovery strokes is increased. The fastest achievable speed is dictated by the bandwidth of the member 10. Therefore, it is beneficial to decrease l and increase h such that the fundamental natural frequency of the member 10 can be maximized.

However, decreasing l and increasing h will increase the overall stiffness of the member 10, making it harder to create a large stroke length that is necessary for generating large propulsions. Because the criteria to produce a larger stroke is contrary to the criteria for higher bandwidth, it is assumed that a numerical optimization is necessary to determine the optimal dimensions of the member 10.

Table 2 summarizes the design considerations discussed above for the member 10 under the control of a magnetic coil setup with negligible settling time.

Given the magnetic actuation, it is possible to use the spatial gradients of the magnetic field B to exert magnetic pulling on the member 10 to enhance its locomotion. For instance, after the member 10 has jumped, the deformed member 10 has a net magnetic moment that allows the use of gradient pulling to modulate jump height and distance.

Theoretically, magnetic gradient pulling may also levitate a magnetic member 10 and make it traverse across different terrains and obstacles. However, this approach is not practical. First, in absence of closed loop feedback control, the trajectories generated by gradient pulling are generally jerkier than those achievable by the proposed locomotion. Second, the required spatial gradients of the magnetic field B for the member 10 to levitate across all obstacles and terrains, estimated to be 3.8 T/m, are difficult to obtain. Moreover, when envisioning the use of the member 10 in healthcare, high spatial gradients of the magnetic field B are considered adverse for e.g. medical application, because they can create undesirable forces on implanted objects within a patient's body, e.g. an implantable cardioverter defibrillator (ICD). Although advancements in the design of ICDs are underway, the shock coils of many ICDs are ferromagnetic and they can experience significant adverse translational motions when they are subjected to such high spatial gradients. In contrast, although the ICD devices will also be affected by the required magnetic actuation, most ICD devices can fully function when the magnitude of the magnetic field B is lower than 500 mT, and this value is well above the magnetic field strength utilized for the soft member 10 (~20 mT) presented herein.

Figures 18, 22:
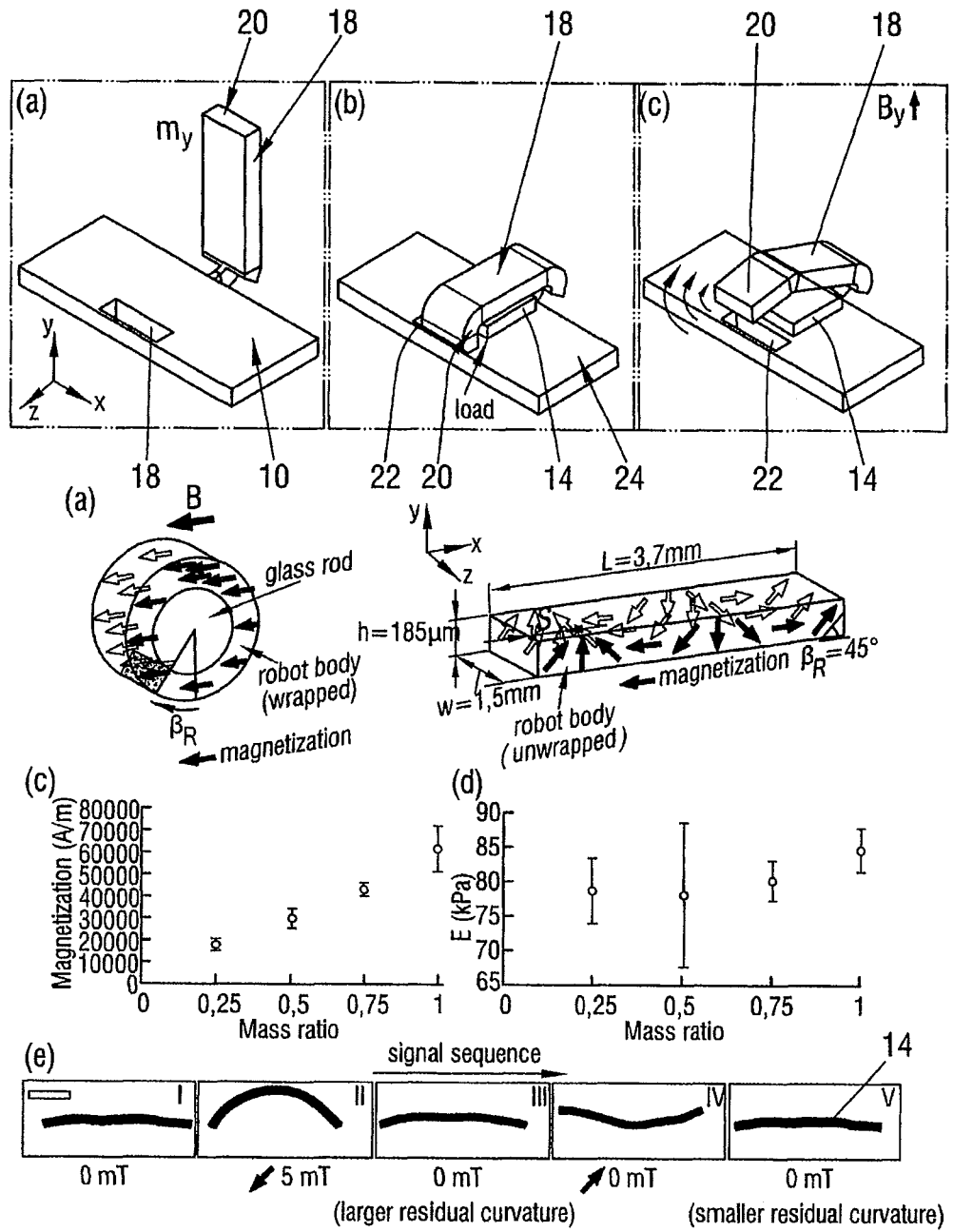

A design of a modified member 10 for selective, magnetically triggered drug release is shown in FIG. 18. To this end FIG. 18a shows that an extra strap 18 is added to the body of the original member 10. For clarity, only the main component of magnetization on the extra strap 18 is marked out in FIG. 18a, as it is the dominant and functional component in releasing a drug that is provided as the cargo 14. The magnetization of the member 10 main body is the same as that shown in FIG. 5b.

During locomotion, the cargo 14 is mechanically bound on the member 10 by inserting the strap head 20 into a hole 22 on the body 24 (FIG. 18b). When a large magnetic field B is applied along the y-axis, $B_y$ (~19 mT), then the magnetic torque bends and unlocks the strap to release the cargo (FIG. 18c). Note that other components of magnetic field ($B_x$, $B_z$) may also be present. Due to the restriction of the hole 22, a smaller $B_y$ (<18 mT in our case) is not sufficient to open the strap 18, which makes normal locomotion possible. The design may be optimized to also carry liquid or powder based loads as cargo 14.

In the foregoing approximate quasi-static and dynamic models have been shown to describe how the width w, length l, and thickness h of the member 10 can be designed to optimize each mode of locomotion (see also Table 2). Hence observations were made that w only affects jumping and jellyfish-like swimming, whereas l and h are subject to conflicting requirements for different locomotion modes. Improved meniscus climbing and rolling is predicted when l is increased and h is reduced, as this increases the member's bending compliance $$\left( \propto \frac{l^3}{h^2} \right).$$

Conversely, fast and efficient crawling requires limited member compliance to preserve its ability to track high frequency control signals. The walking gait imposes by itself conflicting requirements on l and h. A more compliant member body is preferred to produce a larger net stride and larger body curvatures, which implies the increase and decrease of l and h, respectively. However, this would also effectively decrease the bandwidth of the member, reducing the maximum frequency of steps in the walking gait. The present study only elicits a feasible design that enables all reported modes of locomotion.

| Locomotion mode | l | h | w |
|---|---|---|---|
| Jelly-fish like swimming (Speed ↑) | Optimization required | Optimization required | Optimization required |
| Jumping (Jumping force ↑) | Optimization required | Optimization required | Optimization required |
| Meniscus climbing (Stiffness ↓) | ↑ | ↓ | — |
| Walking  Dynamic | ↓ | ↑ | — |
|  Static | ↑ | ↓ | — |
| Undulating swimming (Speed ↑) | ↑ | ↓ | — |
| Crawling (Bandwidth ↑) | ↓ | ↑ | — |
| Rolling | ↑ | ↓ | — |

Table 2 shows design considerations of the member 10 for multimodal locomotion. The arrows respectively indicate whether an increase or decrease in the length, height or width have beneficial effects on which type of locomotion in comparison to the member 10 discussed in the foregoing, so as to optimize it for a certain mode of locomotion.

The magneto-elastic, rectangular sheet-shaped, soft robot 10 is made of silicone elastomer (Ecoflex 00-10) embedded with hard magnetic neodymium-iron-boron (NdFeB) microparticles that have an average diameter of 5 μm. The surfaces of the robot are hydrophobic, and they can potentially be made biocompatible (SI section S1C). By following the magnetization process described in SI section S1A, the robot can be programmed to have a single-wavelength harmonic magnetization profile m along its body (FIG. 19a and FIG. S1). After m is programmed, the robot can be controlled by a time-varying magnetic field, B, to generate different modes of locomotion. Unless otherwise specified, B is spatially uniform, and therefore no magnetic forces are applied to translate the robot (SI section S15). The uniform B, however, can control the robot's morphology and steer it to move along a desired direction. To describe the effects of B, we express $B=[B_{xy}^T \ B_z]^T$ with respect to the robot's body frame (FIG. 19a) where $B_{xy}$ represents the xy plane components of B, i.e., $B_{xy}=[B_x \ B_y]^T$. The interaction between $B_{xy}$ and m produces spatially-varying magnetic torques that deform the robot, and hence controlling $B_{xy}$ allows us to generate the desired time-varying shapes for the robot. As the deformed robot possesses an effective magnetic moment $M_{net}$ (FIG. 19b), which tends to align with B, we can control $B_z$ to rotate the robot about its y-axis, steering it along a desired direction (see SI section S3B(II)).

Depending on the magnitude of $B_{xy}$, i.e., $B_{xy}$, the robot exhibits different shape-changing mechanisms (FIG. 19b and SI section S3A-B). When $B_{xy}$ is small (e.g., $B_{xy} \leq 5$ mT) and $B_{xy}$ is aligned along the two principal directions shown in FIG. 19b(II-III), the prescribed m produces a sine or a cosine shape for the robot. Because the robot's deformation is small in such conditions, orienting $B_{xy}$ away from the principal directions generates a weighted superposition of the two basic configurations. Thus, we can create a traveling wave along the robot's body by using a rotating $B_{xy}$ that has a small constant magnitude. As the robot's $M_{net}$ is always parallel to the applied $B_{xy}$ in small-deflection conditions, the robot does not experience any rigid-body magnetic torque and consequent rotation about its z-axis (SI section S3B(I)). Conversely, when $B_{xy}$ has high magnitude (e.g., $B_{xy}=20$ mT) and is aligned along the principal axis shown in FIG. 19b(IV-V), the robot undergoes a large deflection shape-change to deform into either a 'C'- or a 'V'-shape. However, if the direction of $B_{xy}$ is not along this principal axis, the deformed robot generates a large $M_{net}$ that is generally non-parallel to the applied field, and this makes the robot rotate about its z-axis until its $M_{net}$ aligns with $B_{xy}$ (FIG. 19c and SI section S3B(I)). At the end of this rotation, the robot will assume its 'C'- or 'V'-shape configuration because the generated $M_{net}$ in these configurations is naturally aligned with the applied $B_{xy}$. Using this mechanism, we can control the robot's angular displacement about its z-axis to enable locomotion modalities like rolling, walking and jumping.

Figure 2:
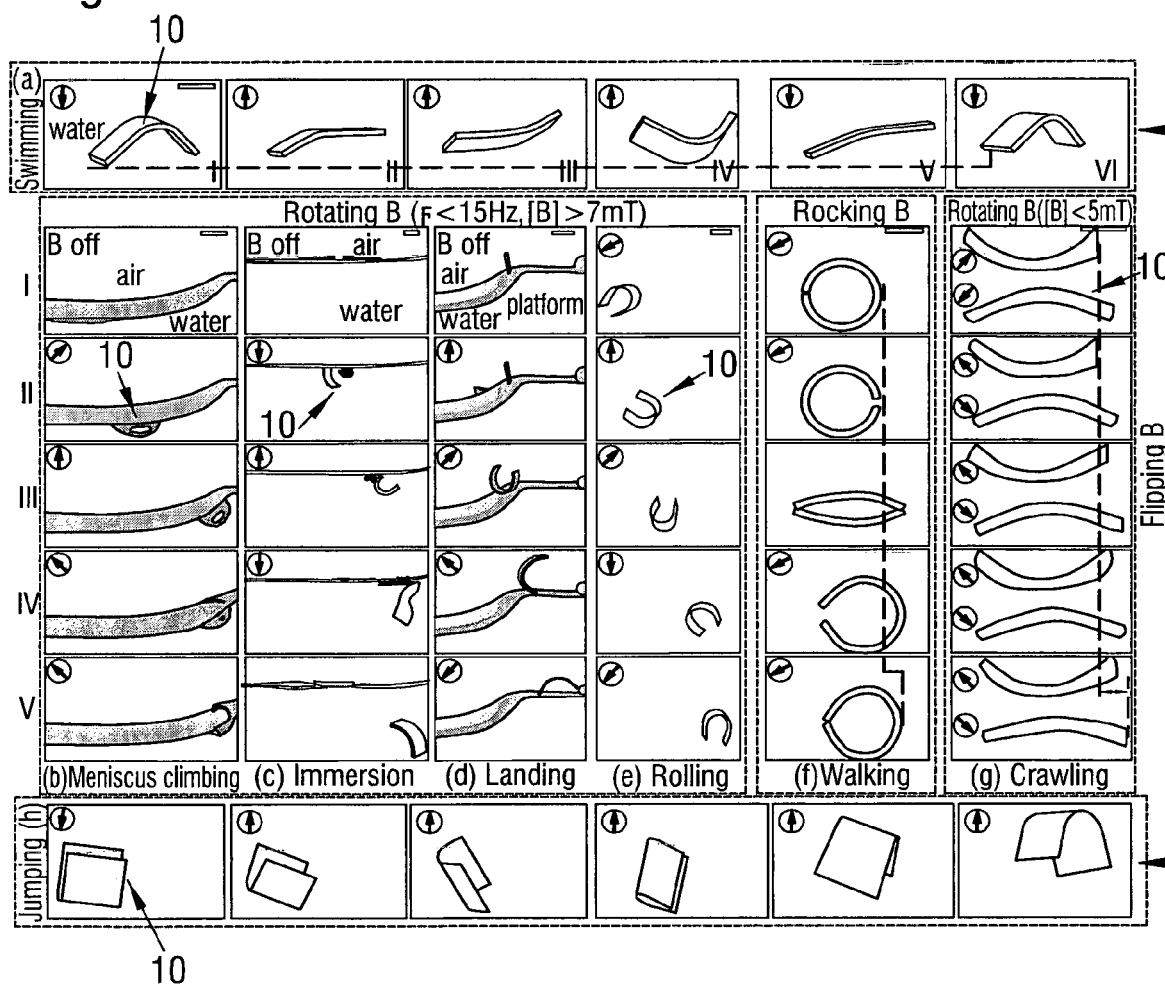
FIG. 2c shows a mode of locomotion of the member 10 that resembles immersion, i.e., a transition from the surface of a water pool into the bulk water of a water pool by a combination of curling and rigid-body rotation. The maximum magnetic field used in this example is $|B|_{max}$: 30 mT.
FIG. 2d shows a mode of locomotion of the member 10 that resembles landing, i.e., a transition from a water surface onto solid ground. A magnetic field that changes clockwise B peels the member 10 off the water surface and lets it stand on the platform.
Figure 20:
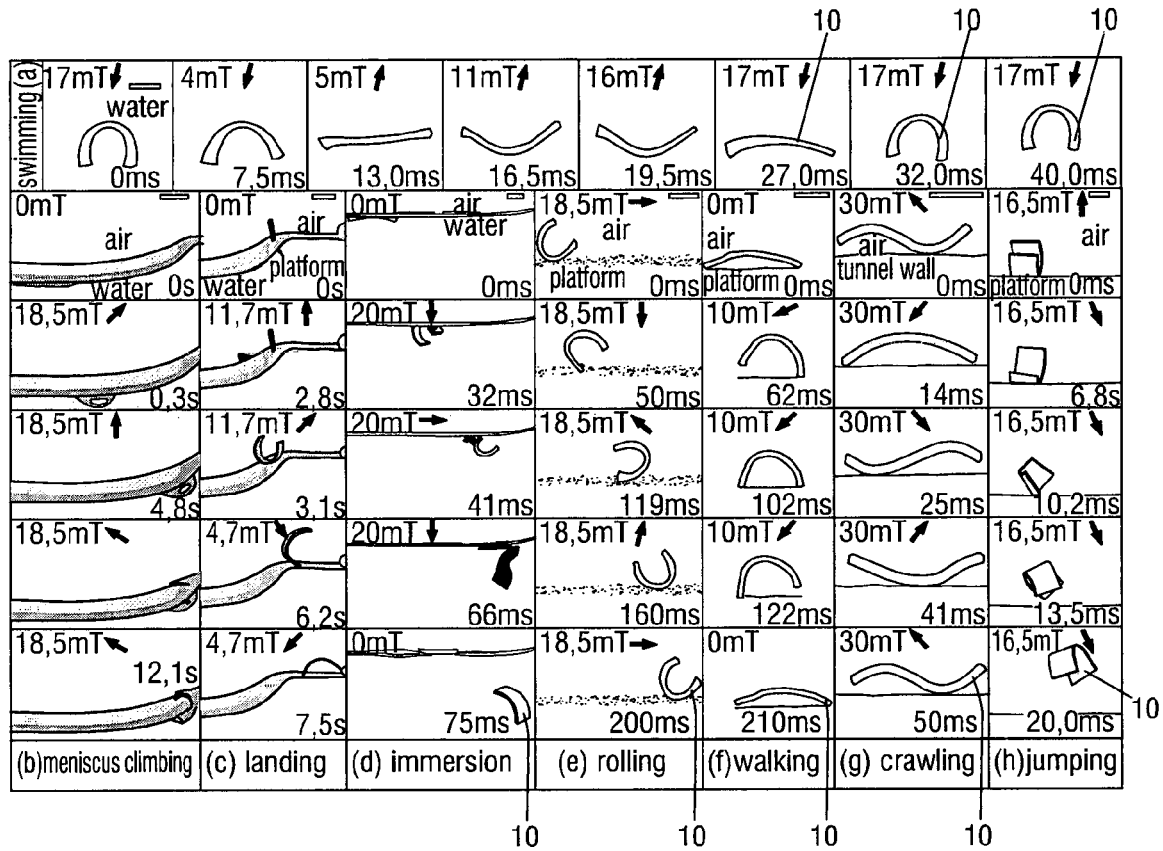

By using the steering and shape-changing mechanisms, we demonstrate all of our robot's locomotion modes in FIGS. 2 and 3. When completely immersed in water, the robot can swim upwards and overcome gravity (FIG. 20a, Supporting and SI section S10). A periodic B with time-varying magnitude along the principal axis allows the shape of the robot to alternate between the 'C'- and 'V'-shapes, enacting a gait similar to jellyfish swimming. Inertial effects at Reynolds number ranging from 74 to 190 permit this time-symmetrical but speed-asymmetrical swimming gait to produce fluid vortices that propel the robot to reach the water surface (FIG. 3c, and SI FIG. S37). Upon emersion, the soft robot strongly pins at the water-air interface by exposing its hydrophobic surface to air.

Inspired by beetle larva that overcome frictionless barriers by performing quasistatic work on liquid-air interfaces, the soft robot can climb up a water meniscus by deforming into a 'C'-shape to enhance its liquid buoyancy without extra energy expenditure (FIG. 20b, and SI section S7). Upon meniscus climbing and reaching contact with an adjacent solid platform, a slow rotating B will make the 'C'-shape robot rotate about its z-axis. The hydrophobicity of its surface allows the robot to be peeled away from the water surface by such rotation (FIG. 20c, and SI section S11B). In contrast to meniscus climbing, the robot can also dive into the liquid bulk by disengaging from the water-air interface via a fast sequence of downward bending, rotation and flipping (FIG. 20d and SI section S11A).

In nature, soft-bodied caterpillars use rolling locomotion to escape from their predators, because this is an efficient and fast way to sweep across solid terrains. Inspired by caterpillars, our robots can also roll directionally over a rigid substrate or dive from a solid onto a liquid surface (FIGS. 20e and 3a). This locomotion is enabled by a high-magnitude rotating B (e.g., B=18.5 mT), which allows the robot to roll in its 'C'-shape configuration (SI section S5). However, the curled-up robot cannot roll across substrate gaps wider than its diameter, which can instead be accomplished by walking.

Walking is a particularly robust way to move over unstructured surfaces and affords precise tuning of stride length and frequency (FIG. 20f, and SI section S6). Inspired by the inchworms' walking gait, the robot can walk along a desired direction when we use a periodic B to sequentially adapt its tilting angle and curvature. In each walking cycle, the robot first anchors on its front end to tilt forward so that it can pull its back end forward. The robot then anchors on its back end to tilt backwards and extends its front end to achieve a positive stride in a single cycle.

When the walking robot is blocked by narrow openings, it can mimic another caterpillar locomotion and use an undulating gait to crawl through the obstacle (FIG. 20g, and SI section S9). Crawling is encoded by a rotating B to produce a longitudinal traveling wave that propels the robot along the wave's direction. A similar control sequence additionally enables the robot to produce an undulating gait to swim efficiently on liquid surfaces (FIG. 3a). In contrast to crawling, however, the undulating swimming direction is antiparallel with the traveling waves' direction. While previous robots with multi-wavelength, harmonic magnetization profiles can also enable the undulating swimming locomotion[7], such robots have not been able to create the critical 'C' and 'V'-shapes necessary to realize multimodal locomotion.

Similar to nematodes, the soft robot can jump over obstacles, which are too high or time consuming to roll or walk over, by imparting an impulsive impact on a rigid surface (FIG. 20h, and SI section S4). The B control sequence prompts both the robot's rigid-body rotation, which specifies the jumping direction, and elastic deformations to maximize the momentum of its free ends before striking the substrate. This sequence of B is specified in the robot's local yz plane where $B_y$ is used for inducing the shape-changing mechanism, while the rigid-body rotation of the robot is induced by both $B_y$ and $B_z$.

Figure 21:
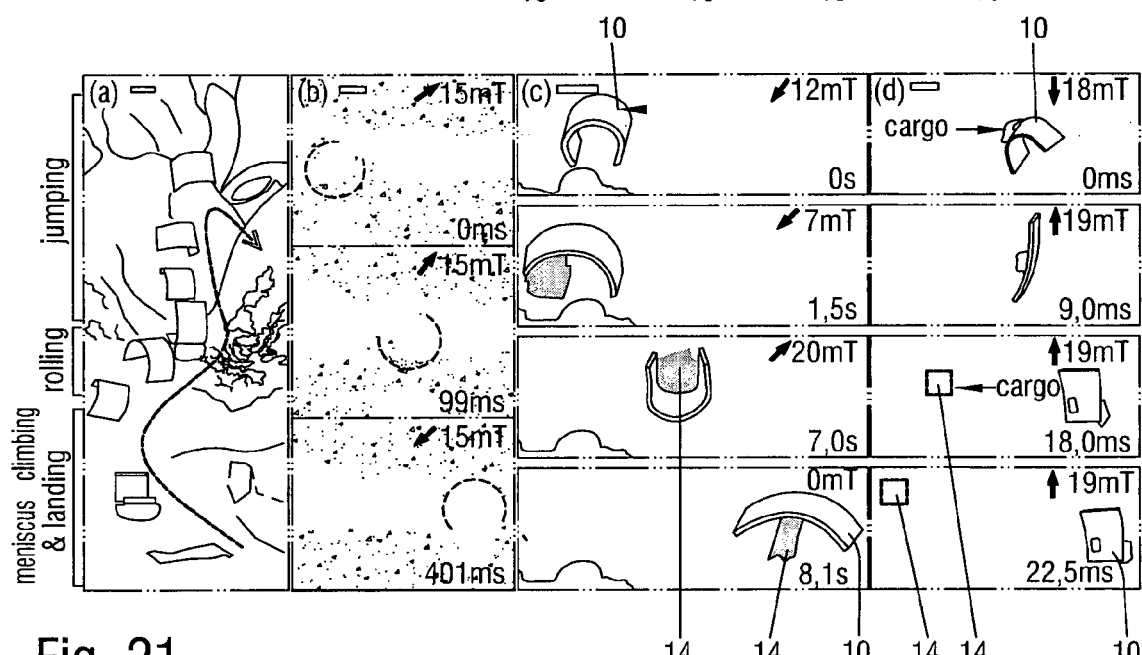

To illustrate the robot's potential to navigate across unstructured environments (SI section S13), we demonstrate that the robot can use a series of locomotion modes to fully explore a hybrid liquid-solid environment (FIG. 3) and a surgical human stomach phantom (FIG. 21a, and SI section S14A). Heading toward an in vivo ultrasound-guided operation, we also show that the robot can be visualized by an ultrasound medical imaging device as it rolls within the concealed areas of an ex vivo chicken muscle tissue (FIG. 21b, SI section S14B, and FIG. S44). The soft robot can additionally accomplish functional tasks like gripping an object and transporting it to a targeted location (FIG. 21c), as well as ejecting a cargo that is strapped on the robot (FIG. 21d and SI section S14C).

In addition to magnetic field-induced torques, magnetic gradient-based pulling forces could also be used to enhance locomotion performance (e.g., speed, jumping height). Moving along this direction, we show that the jumping height can be increased by adding magnetic gradient-based pulling forces, and we will explore other similar possibilities in the future. Using gradient-based pulling exclusively may however be detrimental, as the dynamics of this actuation method is inherently unstable. From a practical standpoint, gradient-based pulling methods are also less energy efficient than locomotion propelled via magnetic field-based torques (SI section S15).

The lack of an on-board actuation method prevents the proposed robot from operating in large open spaces, making it unsuitable for outdoor applications like environment exploration and monitoring. Furthermore, the current demolding process creates a pre-stress in the magneto-elastic material that induces a small residual curvature in the robot when it is in rest state (FIG. 19b(I) and SI section S1D). While the pre-stress does not hinder the robot from achieving multiple modes of locomotion and could be reduced through improved fabrication, it induces small errors in the predicted robot shapes (FIG. 19b(II, V)) and partly affects the model matching of the experimental data for the walking and undulating swimming speeds (SI sections S6 and S8).

To better understand small-scale soft-bodied locomotion, we have devised theoretical models to perform a scaling analysis on how the robot's dimensions (L, w, and h, shown in FIG. 19a) would affect the jumping, rolling, walking, meniscus-climbing and undulating swimming locomotion modalities (SI sections S4-8). As the theoretical models for the crawling and jellyfish-like swimming locomotion are too difficult to be derived, we have instead used the experimental data in SI sections S9-10 to derive corresponding fitting models. Based on our theoretical and fitting models, it is predicted that a larger L and a smaller h are always preferred for multimodal locomotion as it can help the robot to move faster and jump higher. The models also suggest that w would only affect the jellyfish-like swimming locomotion and minimizing w would increase the swimming speed. There are, however, practical lower bounds for both h and w, because our current fabrication technique has difficulties creating robots that have h<40 μm and w<0.3 mm. Likewise, the practical upper bound of L is typically constrained by the size requirements of specific applications and the maximum allowable workspace of the electromagnetic coil setup that generates the spatially uniform B. A more detailed summary for the scaling analysis and fabrication limits can be found in SI section S12.

To validate the theoretical models, we compared them against extensive experimental characterizations conducted across robots with differing dimensions. In general, except for the undulating swimming locomotion, the experimental data agree well with our models (see SI sections S4-8, SI section S12, and Table S4). Detailed discussions pertaining to the theoretical and experimental discrepancy for the undulating swimming locomotion can be found in SI section S8. While the present study only elicits a feasible robot design that enables all reported modes of locomotion, these analyses can also provide useful design guidelines for optimizing the performance of future miniature robots that have multimodal locomotion.

In the future, we will also use our proposed robot to study small-scale soft-bodied locomotion on other complex terrains such as within non-Newtonian fluids or on granular media. Moreover, we will scale down the proposed robots to sub-millimeter size scale and demonstrate their potential in vivo medical applications.

Data Availability Statement

All data generated or analyzed during this study are included in the published article and its supplementary information files. The datasets generated during and/or analyzed during the current study are available from the corresponding author on reasonable request.

S1—Robot Fabrication and Characterization

In this section, we describe the robot's fabrication process and mechanical properties (section S1A), its surface properties (section S1B), how it can potentially be made biocompatible (section S1C), and also its residual strain energy (section S1D).

A. Fabrication Process and Mechanical Properties of the Robot

The base material of the magneto-elastic robot body is an Ecoflex 00-10 polymer matrix (Smooth-On Inc.; density: 1.04 g/cm$^3$) loaded with neodymium-iron-boron (NdFeB) magnetic microparticles (MQP-15-7, Magnequench; average diameter: 5 μm, density: 7.61 g/cm$^3$) according to a mass ratio of 1:1 (the ratio of the mass of NdFeB microparticles to the mass of Ecoflex-10 elastomer). The NdFeB microparticles' high remanent magnetization enables us to generate effective magnetic actuation for the robots while their high magnetic coercivity ensures that our robot's magnetization profile is maintained during magnetic actuation: NdFeB particles requires more than 600 mT to be demagnetized, and our maximum B is limited to 50 mT. The resulting magnetic elastomer has a density ($\rho_r$) of 1.86 g/cm$^3$.

To fabricate the robots, the pre-polymer is cast onto a flat poly(methyl methacrylate) plate to form a 185 μm-thick film. After thermal polymer curing, the device is demolded by using the laser to cut it into the desired geometry before its removal from the substrate plate. The robot dimensions are shown in FIG. S1b, where L, w and h represent the length, width, and height of the robot, respectively. Unless specified otherwise, L=3.7 mm, w=1.5 mm, and h=185 μm are assumed. These are the dimensions for the robot described e.g. in FIG. 19. The harmonic magnetization profile of the robot is implemented by wrapping its soft body around a cylindrical glass rod with a circumference of 3.7 mm and subjecting it to a large, uniform magnetizing field of 1.65 T (FIG. S1a). To create the phase shift, $\beta_R$, in the magnetization profile m (FIG. S1b), the rod is maintained by an angle of $\beta_R$ during the robot's magnetization process. Unless specified otherwise, $\beta_R$ is assumed to be 45°. We experimentally evaluated the magnitude of m to be 62,000±10000 A/m for robots that have a 1:1 mass ratio (FIG. S1c).

The effective Young's modulus (E) of robots, which has a 1:1 mass ratio, is experimentally evaluated to be 8.45× 10$^4$±2.5×10$^3$ Pa through a tabletop test system (MTS Nano Biomix, Agilent Systems) using the accompanying software (Nano Suite V5, Agilent Systems). Figure S1c-d additionally summarizes the characterization of |m| and E, respectively, for similar magnetic elastomers with different mass ratios. The mean and standard deviation of each data point in these sub-figures are computed from the experimental results of three samples. According to these experimental data, increasing the content of magnetic particles in the polymer matrix increases |m| more significantly than it increases E. This suggests that robots with higher NdFeB concentration (larger mass ratios) can deform more easily, as they can generate higher magnetic torques, while becoming only slightly stiffer. From the fabrication perspective, it is difficult to further increase the NdFeB mass content beyond the 1:1 mass ratio as the base material Ecoflex-10 no longer cures well. Hence, all the robots used in this work are fabricated based on the 1:1 mass ratio to maximize the amount of NdFeB content while preserving the ease of fabrication.

B. Surface Properties of the Robot

The native surface of the composite elastomeric material is hydrophobic and microscopically rough. Static advancing (116°±3°) and receding (78°±2°) water contact angles were measured by the sessile droplet method through an automated goniometer routine (Krüss DSA100 and accompanying software) that continuously increases and decreases the water droplet volume, respectively. Surface roughness ($R_a$=0.63±0.02 μm and $R_z$=4.37±0.28 μm) was measured by laser interferometry (Keyence VK-X200). The as-fabricated robots' surface was not subjected to any treatment before the experiments.

C. Biocompatibility of the Robots

While the Ecoflex-10 polymer matrix is itself biocompatible, the presence of NdFeB microparticles within the matrix makes the current composition of our soft robots only partially biocompatible. Full biocompatibility of our soft robots can be recovered by sealing the microparticles safely within the robots. For example, this can be achieved by coating and encasing the robots within an additional, outer thin shell of Ecoflex-10 polymer. This solution would also preserve the surface properties discussed above, as the native Ecoflex-10 is itself hydrophobic and has a microscopically rough surface. Furthermore, because unadulterated Ecoflex-10 has lower E than our composites shown in FIG. S1d, the robot should still be sufficiently compliant to execute all of the proposed locomotion modes and functionalities as long as the additional layer is sufficiently thin. To ensure that we can predict the behavior of such robots, it would then be necessary to characterize the Young's modulus of this new composition.

D. Residual Strain Energy

We hypothesize that there are two lowest energy configurations because our fabrication process is not perfect and the pre-stress induced from the demolding process will make the robot retain some strain energy. One consequent effect of this phenomenon is that the proposed robots will exhibit two different rest state curvatures when no B is applied (FIG. S1e). The first rest state curvature, which is relatively smaller, is illustrated in FIG. S1e(I, V) while the second rest state curvature, which is larger, is shown in FIG. S1e(III). We found that the robot can alternate between these two rest state curvatures when it undergoes different shape-change. In particular, the relatively flat curvature can be restored after the robot recovers from the shape specified in FIG. S1e(IV), and the larger residual curvature rest state is activated after the robot recovers from the shape specified in FIG. S1e(II). Our experiments show that these two different rest state curvatures can be switched repeatedly.

Having two rest state curvatures implies that the robot has two distinct lowest energy configurations. By inducing a shape-change to alter the amount of strain energy within the robot, the robot can switch between these two lowest energy configurations after B is removed. Theoretically, if there is no residual strain energy, the lowest energy configuration of the robot should be perfectly flat.

Figure 19:
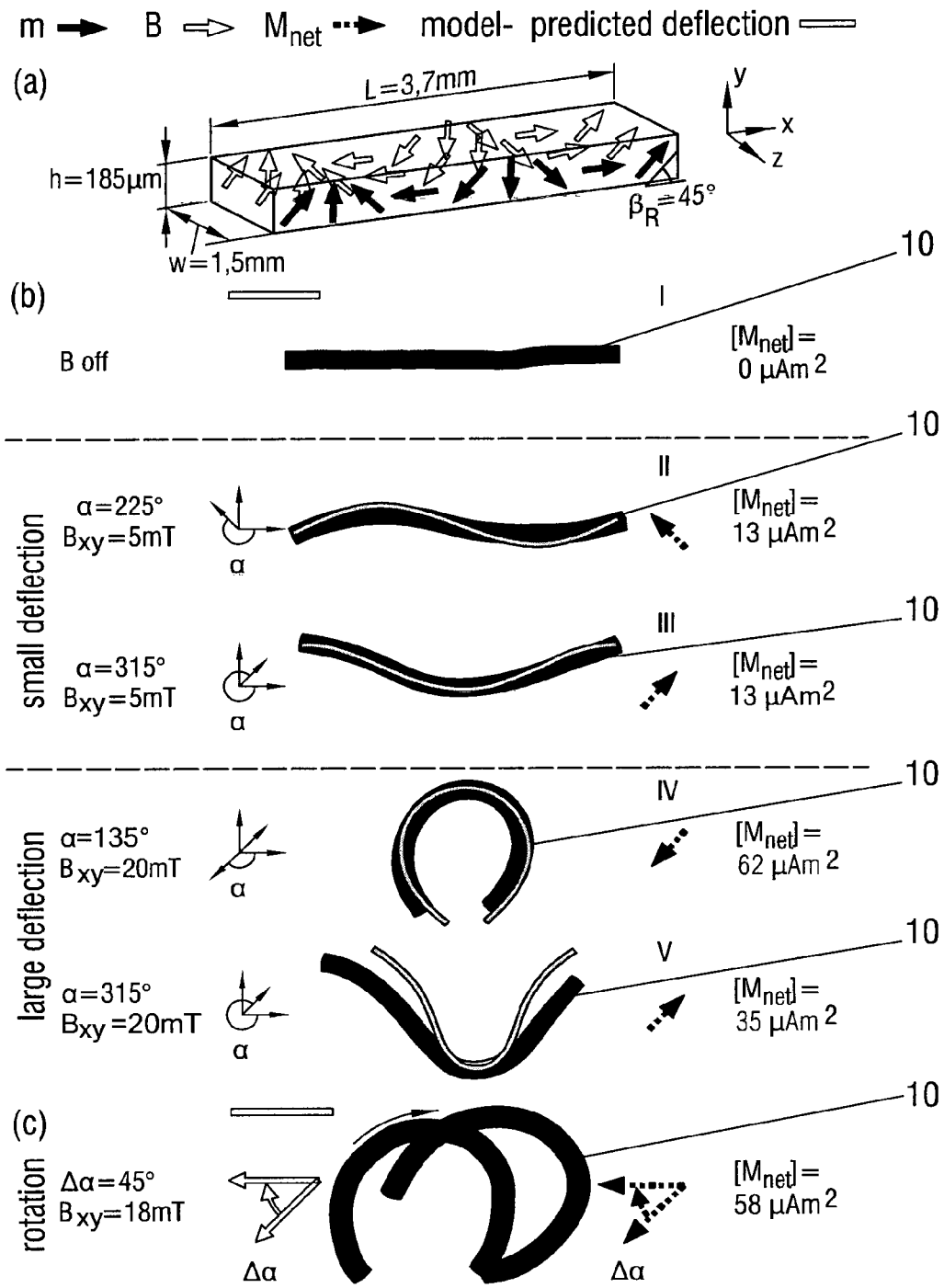

As mentioned in the foregoing and the captions in FIG. 19, the residual strain energy would also induce small errors in the predicted robot shapes. Since this fabrication uncertainty may vary across different robots, it is expected that different robots would have slightly different errors in their predicted shapes. To reduce such uncertainties, we always use the same batch of robots to characterize each locomotion mode (SI sections S4-10).

Despite having residual strain energy, we remark that our robot is still able to achieve multiple modes of locomotion. This is supported by our multi-locomotion demonstration in FIG. 3 where we show that one single robot is able to realize all the proposed modes of locomotion. In the future, we will account for these effects via calibrating B and we will also improve our fabrication process such that the fabricated robot will have less residual strain energy.

S2—Magnetic Actuation Setup

A. Experiment Setup

The magnetic actuation setup is composed of three orthogonal pairs of custom-made electromagnets, and it has an inner chamber size of 65 mm×65 mm×65 mm (6). The input currents driving the electromagnets are specified by software control signals through a custom electronic board. We use a calibrated magnetic actuation matrix to map the control current input to the actual magnetic field B in the working space. With respect to the center of working space, which coincides with the center of the reference system defined in FIG. 6, the 95% homogeneous field region is 16 mm wide along the X- and Y-axis and 50 mm wide along the Z-axis. All demonstrations of individual locomotion modes were conducted in this homogenous field region, except for the multimodal locomotion experiments in FIG. 3a, d, e, for which the maximum displacement of the robot was around 30 mm. In these situations, we would recalibrate our actuation matrix to produce a relatively spatially uniform B for our robot. All characterizations in sections S4-S11 were conducted in the homogenous field region, except for the characterization of the jumping and jellyfish-like swimming, in which a pair of Helmholtz coil is used for simplicity.

Despite our efforts to provide spatially uniform fields, uncontrolled spatial-gradients in these regions may still exist. For example, we have observed unwanted magnetic forces pulling the walking robot towards the center of the workspace (FIG. 3d). While these forces have induced unwanted disturbances on the walking locomotion, we remark that the robot is able to walk successfully even against the gradient (see SI section S13 for more discussion). We further remark that the current setup was designed for proof-of-concept purposes, showing the possibility of creating highly mobile miniature soft robots that have multiple modes of locomotion. Electromagnetic coil setups with larger uniform workspaces can well be conceived to address these issues and render the whole robotic system more suitable for potential biomedical applications described in SI section S14.

B. Coordinate Frames

Here the global frame is defined by the magnetic actuation setup's coordinate frame, and we shall define the axes in this frame with capital letters, e.g., X-, Y- and Z-axes, and XY plane. To distinguish this global frame from the robot's un-deformed local frame shown in FIG. 19, we assign the axes of the local frame with lower case letters, e.g., x-, y- and z-axes, and xy plane. As the soft robots can be steered by B, we can orientate the robot's local frame with respect to the global frame accordingly (see SI section S3B). For example, we can make the robot's local xy plane parallel with the global XY plane by applying a B that only has components in the XY plane.

Except for the main text and the shape change analyses in SI section S3A, which are more intuitive to be described in the robot's local frame, all other analyses and characterizations in the SI are described in the global frame (SI sections S4-11). In these analyses and characterizations, we have orientated the robot's local xy plane to be parallel with the global XY plane.

S3—General Theory

Here we provide the general theory, which describes how our soft robots respond to external magnetic fields. We begin by providing a quasi-static mathematical analysis of how the actuating fields can generate desired time-varying shapes for a magnetically actuated soft robot (section 3A). Subsequently, we describe how the actuating fields can be used to rotate the body of the robot (section S3B), and also how to use our theory to determine the operating range of B (section S3C). SI sections S4-11 then propose more detailed models and discussions for each locomotion mode. A scaling analyses summary for the soft robots is finally presented in SI section S12 and Table S4. We also provide a nomenclature for all the mathematical symbols in Table S1 and a summary of our robot's physical properties in Table S2.

We remark that the analyses and discussions presented here and in the following SI sections aim to facilitate future studies on soft-bodied locomotion. The analyses can also provide design guidelines, which can be used as the first step towards designing and optimizing miniature soft magnetic robots that have multi-locomotion capabilities.

A. Quasi-Static Analysis

Given the magnetization profile m prescribed in FIG. S1b, here we use quasi-static analysis to describe how we can use the external magnetic fields, $B=[B_x\ B_y\ B_z]^T$ to control our robot's shapes. The magnetization profile, m, along the robot's length, s, is described as:

$$m(s) = \begin{pmatrix} m_x \\ m_y \\ 0 \end{pmatrix} = m\begin{pmatrix} \cos(\omega_s s + \beta_R) \\ \sin(\omega_s s + \beta_R) \\ 0 \end{pmatrix}. \tag{S3.1}$$

The variables $m_x$ and $m_y$ represent the components of m along the x- and y-axis, respectively, while m and $\omega_s$ represent the magnitude and spatial angular frequency of m(s), respectively, with $$\omega_s = \frac{2\pi}{L}.$$

Using the above m(s) and without any loss of generality, we use the robot's local reference frame in FIG. S1b to describe B, which is a function of time, t. At a given t, the interaction between B and m(s) creates a spatially varying stress in the soft robot to create desirable deflections (FIG. S3). These static deflections on an element can be described by the Euler-Bernoulli equation for beams, i.e., the bending moment $$M_b = EI\frac{\partial \theta}{\partial s},$$

where the rotational deflection along the robot, $\theta(s)$, is expressed explicitly with respect to actuating magnetic torque, $\tau_m$, as[3]:

$$-\tau_m A = EI\frac{\partial^2 \theta}{\partial s^2}(s), \tag{S3.2}$$

where $$\tau_m = [0\ 0\ 1]\{Rm \times B\}. \tag{S3.3}$$

The variables A=hw, I=h³w/12 and E represent the robot's cross-sectional area, second moment of area and Young's modulus, respectively, while R is the standard z-axis rotational matrix that accounts for the change in direction of m due to the robot's rotational deflection:

$$R = \begin{bmatrix} \cos\theta & -\sin\theta & 0 \\ \sin\theta & \cos\theta & 0 \\ 0 & 0 & 1 \end{bmatrix}. \tag{S3.4}$$

Physically, the left side of Eq. (S3.2) represents the magnetic actuation that deforms the robot, while its right side is a function of the resultant deflections. Since we do not apply magnetic forces onto the robot, the shear forces along the robot are null at steady-state and are therefore neglected for the quasi-static analyses (FIG. S3). For the locomotion modes that have small deflections, such as the undulating swimming, Eq. (S3.2) can be simplified by approximating R with a 3×3 identity matrix, s≈x (along the body frame's x-axis), and $$\theta \approx \frac{\partial y}{\partial x}$$

where y refers to the vertical deflection. With these simplifications, Eq. (S3.2) then becomes:

$$-[0\ 0\ 1]\{m \times B\}A = EI\frac{\partial^3 y}{\partial x^3}. \quad (S3.5)$$

Using Eq. (S3.5), the robot's shape under small deflection condition can be described via the linear combination of two principal shapes, resembling respectively a sine and a cosine function (FIG. 19b(II,III)). The first principal shape can be enforced when the direction of B is parallel to $[\cos \beta_R \sin \beta_R]^T$, i.e., $B=B[\cos \beta_R \sin \beta_R]^T$. Then, Eq. (S3.5) can be triple integrated with respect to x to become[4]:

$$y(x) = \frac{mAL^3 B}{8\pi^2 EI}\cos\left(\frac{2\pi}{L}x\right) + k_1 x^2 + k_2 x + k_3, \quad (S3.6)$$

where B represents the magnitude of B, and $k_1$, $k_2$ and $k_3$ are the constants of integration, valid for all B values as long as the robot's deflections are small (i.e., including the case of B=0). When B=0, the LHS of Eq. (S3.6) has to be zero for all x, because the robot does not deform in the absence of B, and this implies that Eq. (S3.6) becomes:

$$k_1 x^2 + k_2 x + k_3 = 0. \quad (S3.7)$$

As x can vary from 0 to L, Eq. (S3.7) can only be satisfied across all x if and only if $k_1 = k_2 = k_3 = 0$. Therefore, Eq. (S3.6) can be rewritten as:

$$y(x) = \frac{mAL^3 B}{8\pi^3 EI}\cos\left(\frac{2\pi}{L}x\right). \quad (S3.8)$$

Similarly, when B is parallel to $[-\sin(\beta_R)\ \cos(\beta_R)\ 0)]^T$, i.e., $B=B[-\sin(\beta_R)\ \cos(\beta_R)\ 0]^T$, Eq. (S3.5) can be triple integrated to become:

$$y(x) = \frac{mAL^3 B}{8\pi^2 EI}\sin\left(\frac{2\pi}{L}x\right) + k_4 x^2 + k_5 x + k_6, \quad (S3.9)$$

and using the same reasoning as for $k_1$, $k_2$ and $k_3$, we deduce that Eq. (S3.9) can only be valid across all x if and only if $k_4 = k_5 = k_6 = 0$. Therefore, Eq. (S3.9) becomes:

$$y(x) = \frac{mAL^3 B}{8\pi^3 EI}\sin\left(\frac{2\pi}{L}x\right). \quad (S3.10)$$

As mentioned in the main text, if the direction of B is not aligned along the principal directions, the robot will assume a shape that can be described by the weighted superposition of Eqs. (S3.8) and (S3.10). While Eqs. (S3.8) and (S3.10) can be used to fully describe the small deflection shapes used in undulating swimming and meniscus climbing, they are insufficient to describe the large deflection shape change necessary for rolling, walking, jumping and jellyfish-like swimming. The large deflection shapes are achieved by applying a large magnitude B parallel or anti-parallel to $[\cos \beta_R \sin \beta_R\ 0]^T$. To predict the robot's shapes under such conditions, we have to solve Eq. (S3.2) numerically with the following free-free boundary conditions:

$$\frac{\partial \theta}{\partial s}(s=0) = \frac{\partial \theta}{\partial s}(s=L) = 0. \quad (S3.11)$$

Physically, these boundary conditions imply that there is zero bending moment applied on the free-ends of the beam. The numerical solutions reveal that the robot creates a large deflection configuration that resembles a 'C'-shape when we apply a large magnitude B parallel to $-[\cos \beta_R \sin \beta_R\ 0]^T$ (FIG. 19b(IV)). On the other hand, when we use the same boundary conditions and apply a large magnitude B parallel to $[\cos \beta_R \sin \beta_R\ 0]^T$, the numerical solution of Eq. (S3.2) yields a 'V'-shape (FIG. 19b(V)). In both configurations, the curvature increases as B is increased. Furthermore, if the direction of B is not aligned along the principal axis shown in FIG. 19b(IV,V), the robot will have a rigid-body rotation until its $M_{net}$ is aligned with B. At the end of this rotation, the robot will assume its 'C'- or 'V'-shape (see the next sub-section for more details).

B. Rigid-Body Rotation

As the net magnetic moment of a robot tends to align with the external magnetic fields, it is possible to use the direction of the fields to control the orientation of the magnetic robot[1,5]. While our robot does not have a net magnetic moment in the un-deformed state, a net magnetic moment arises once the robot deforms. Mathematically, the net magnetic moment, $M_{net}$, is expressed as:

$$M_{net} = \int_0^L Rm\ A\ ds. \quad (S3.12)$$

Once equipped with $M_{net}$, we can create rigid-body torques on the robot by controlling B. This magnetic torque, $\tau_{RB}$, can be represented as:

$$\tau_{RB} = M_{net} \times B. \quad (S3.13)$$

Physically, Eq. (S3.13) implies that as long as $M_{net}$ is not aligned with B, a magnetic torque will be applied onto the robot. If there are no other external torques acting on the robot, the magnetic torque will eventually align $M_{net}$ along the direction of the applied B at steady state conditions. In the following sub-sections, we will discuss how we can rotate the robot about its z- and y-axes.

I. Rotation about z-Axis

Here, we will explain why the robot is unable to rotate about its z-axis when it has small deflections (i.e., B is small) but will be able to do so under large deflection conditions (i.e., B is large). We begin this discussion by showing that the robot's $M_{net}$ will always be aligned with B under small deflection conditions, and this in turn will conclude that there will be no rigid-body magnetic torques acting on the robot, making the robot unable to rotate about its z-axis. To establish this mathematical proof, we first show that when the robot is subjected to a B that is parallel to the principal directions shown in FIG. 19b(II-III), its resultant deformation will generate an $M_{net}$ parallel to the corresponding principal directions. Subsequently, by using the superposition principle, we can generalize and conclude that the robot's $M_{net}$ will always be aligned with the applied B under small deflection conditions.

Based on Eq. (S3.8), the robot will produce a cosine shape when B is parallel to its first principle direction, i.e., $B=B[\cos(\beta_R)\ \sin(\beta_R)\ 0]^T$. Since the deformation of this shape is small, its rotational deflection can be approximated as:

$$\theta(x) \approx \frac{dy}{dx} = -\frac{mAL^2 B}{4\pi^2 EI}\sin\left(\frac{2\pi}{L}x\right), \quad (S3.14)$$

Using the small rotational deflection representation in Eq. (S3.14), we can approximate cos θ and sin θ to be 1 and θ, a respectively. These approximations will in turn simplify the resultant rotational matrix R in Eq. (S3.12) and Eq. (S3.4) to:

$$R(x) \approx \begin{bmatrix} 1 & \frac{mAL^2B}{4\pi^2 EI}\sin\left(\frac{2\pi}{L}x\right) & 0 \\ -\frac{mAL^2B}{4\pi^2 EI}\sin\left(\frac{2\pi}{L}x\right) & 1 & 0 \\ 0 & 0 & 1 \end{bmatrix}. \quad (S3.15)$$

By substituting Eq. (S3.15) into Eq. (S3.12), the deformed robot's $M_{net}$ can be expressed as:

$$M_{net} = \int_0^L mA \begin{pmatrix} \cos\left(\frac{2\pi}{L}x+\beta_R\right) + \frac{mAL^2B}{4\pi^2 EI}\sin\left(\frac{2\pi}{L}x+\beta_R\right)\sin\left(\frac{2\pi}{L}x\right) \\ -\frac{mAL^2B}{4\pi^2 EI}\cos\left(\frac{2\pi}{L}x+\beta_R\right)\sin\left(\frac{2\pi}{L}x\right) + \sin\left(\frac{2\pi}{L}x+\beta_R\right) \\ 0 \end{pmatrix} dx. \quad (S3.16)$$

Based on simple trigonometry identities, $$\sin\left(\frac{2\pi}{L}x+\beta_R\right) \text{ and } \cos\left(\frac{2\pi}{L}x+\beta_R\right)$$

can be rewritten as:

$$\sin\left(\frac{2\pi}{L}x+\beta_R\right) = \sin\left(\frac{2\pi}{L}x\right)\cos(\beta_R) + \cos\left(\frac{2\pi}{L}x\right)\sin(\beta_R), \quad (S3.17A)$$

$$\cos\left(\frac{2\pi}{L}x+\beta_R\right) = \cos\left(\frac{2\pi}{L}x\right)\cos(\beta_R) - \sin\left(\frac{2\pi}{L}x\right)\sin(\beta_R). \quad (S3.17B)$$

By substituting Eq. (S3.17A-B) into Eq. (S3.16) and rearranging the equation, the deformed robot's $M_{net}$ can be expressed as:

$$M_{net} = \quad (S3.18)$$

$$\int_0^L mA \begin{pmatrix} \cos\left(\frac{2\pi}{L}x+\beta_R\right) + \frac{mAL^2B}{8\pi^2 EI}\sin\left(\frac{4\pi}{L}x\right)\sin(\beta_R) \\ \sin\left(\frac{2\pi}{L}x+\beta_R\right) - \frac{mAL^2B}{8\pi^2 EI}\sin\left(\frac{4\pi}{L}x\right)\cos(\beta_R) \\ 0 \end{pmatrix} dx +$$

$$\frac{m^2A^2L^2B}{4\pi^2 EI}\left[\int_0^L \sin^2\left(\frac{2\pi}{L}x\right)dx\right]\begin{pmatrix} \cos(\beta_R) \\ \sin(\beta_R) \\ 0 \end{pmatrix}.$$

As the first component on the right side of Eq. (S3.18) integrates the harmonic functions over one full wavelength, this component is computed to be zero. Therefore, by completing the integration for the second component on the right side of Eq. (S3.18), this equation can be simplified into:

$$M_{net} = \frac{m^2A^2L^2B}{8\pi^2 EI}\begin{pmatrix} \cos(\beta_R) \\ \sin(\beta_R) \\ 0 \end{pmatrix}. \quad (S3.19)$$

We remark that the direction of $M_{net}$ in Eq. (S3.19) is parallel to the first principal direction of B, i.e., B=B[COS $(\beta_R)$ sin$(\beta_R)$ 0]$^T$.

Next, we repeat similar derivations when B is parallel to the second principal direction, i.e., B=B[−sin$(\beta_R)$ cos$(\beta_R)$ 0]$^T$. Based on Eq. (S3.10), the robot will produce a sine shape with this B. Assuming small deflection conditions, its rotational deflection can be approximated as:

$$\theta(x) \approx \frac{dy}{dx} = \frac{mAL^2B}{4\pi^2 EI}\cos\left(\frac{2\pi}{L}x\right), \quad (S3.20)$$

and the corresponding rotational matrix in Eq. (S3.12) becomes:

$$R(x) \approx \begin{bmatrix} 1 & -\frac{mAL^2B}{4\pi^2 EI}\cos\left(\frac{2\pi}{L}x\right) & 0 \\ \frac{mAL^2B}{4\pi^2 EI}\cos\left(\frac{2\pi}{L}x\right) & 1 & 0 \\ 0 & 0 & 1 \end{bmatrix}. \quad (S3.21)$$

By substituting Eq. (S3.21) into Eq. (S3.12) and use steps similar to those presented in Eq. (S3.16-S3.18), the deformed robot's $M_{net}$ can then be expressed as:

$$M_{net} = \frac{m^2A^2L^2B}{8\pi^2 EI}\begin{pmatrix} -\sin(\beta_R) \\ \cos(\beta_R) \\ 0 \end{pmatrix}, \quad (S3.22)$$

and this shows that the generated $M_{net}$ is parallel to the second principal direction of B. Hence, Eqs. (S3.19) and (S3.22) conclude that the deformed robot will not be able to rotate about its z-axis when a B with small magnitude is applied parallel to either of the principal directions, i.e., there is no rotation when the robot deflections are small. Because superposition principle is applicable for the analysis shown in Eq. (S3.14-S3.22), we conclude that under small deflection conditions (i.e., B is small), the robot will not be able to rotate about its z-axis. Hence in such situations, the robot will only experience a shape-change in the xy plane as described in the main text and SI section S3A.

Conversely, because the superposition principle will no longer be applicable for a large B, the robot's $M_{net}$ in such situations will not necessarily be parallel with the applied B. This eventually will make the robot rotate until its $M_{net}$ is aligned with B, and the robot will assume either its 'C'- or 'V'-shape configuration when it stops rotating. The 'C'- or 'V'-shapes are the steady-state configurations because their generated $M_{net}$ is always naturally aligned with the applied B (as shown in FIG. 19b (IV-V)). Hence for large deflection cases, we can adjust the direction of B in the XY plane to rotate the 'C'- or 'V'-shape robot about its z-axis (FIG. 19c). The ability to control the robot's angular displacement about its z-axis is essential for achieving several modes of locomotion, as it allows the robot to produce the necessary tilting for jumping and walking, as well as enabling the rolling locomotion (SI section S5).

Finally, we will also discuss what happens when a mid-range B is applied, i.e., a B that is neither sufficiently small nor big. In this situation, two possible scenarios could occur. When a mid-range B is lower than a specific threshold, the deformed robot will not be able to generate an effective rigid-body rotation. As a result, the obtained shape of the robot can be predicted by solving Eq. (S3.2) numerically. On the other hand, if the mid-range B exceeds this threshold, the robot would rotate until its $M_{net}$ is aligned with B and it will assume either its 'C' or 'V'-shape configuration in steady-state conditions. Theoretically, this threshold represents the minimum required B for the deformed robot to generate a $M_{net}$ that is non-parallel to the applied field. However, in practice as our fabrication process is not perfect, it is not easy to quantify this threshold accurately. Hence, avoiding mid-range B and employing either small or large B would be the best to ensure that the robot is able to achieve all modes of locomotion. Indeed, we show that we are able to perform all modes of locomotion by using ranges of B that are sufficiently small or large.

II. Steering Strategy (Rotation about y-Axis)

As the robot's $M_{net}$ always resides in its xy plane (FIG. 19b), this implies that when a B that only has XY plane components is applied on the robot, a magnetic torque can re-orientate the robot until its local xy plane becomes parallel to the global XY plane shown in FIG. 6. Similarly, after making the robot's xy plane to be parallel with the global XY plane, we can use $B_z$ to create a magnetic torque that can rotate the robot about its y-axis and steer it along other desired directions. In contrast to rotating the robot about its z-axis, we can always rotate the robot about its y-axis regardless of the magnitude of B. More information regarding how to use external magnetic fields to steer a magnetic robot with a net magnetic moment along a desired direction can be found in references 1 and 3.

C. Predicting the Operating Range of B

The theoretical models presented in section 3A-B can help to determine the operating ranges of B such that the robot can generate the required time-varying shapes to enable different modes of locomotion. For locomotion modes enabled by small B, we can use Eqs. (S3.8) and (S3.10) to predict the required B for generating the necessary time-varying shapes. However, a recursive approach has to be used for determining the required B for locomotion modes that require a large B. This recursive approach is implemented by first specifying a B, and substitute it into Eq. (S3.2) to numerically solve for the curvature of the 'C'- or V'-shape configuration. If the obtained curvature is unsatisfactory, we will change another B, and repeat the same procedures until a suitable B is obtained.

S4—Analysis for Jumping

To analyze the jumping locomotion, we first specify the required B signals (section S4A). Subsequently, we provide a theoretical model, which can predict how high the robot can jump when we vary B (section S4B). Using this model, we then discuss how the jumping height of the soft robot is affected by its dimensions (section S4C).

A. Experimental Details

For the robot to jump along a desired direction (FIG. 20h, also in FIG. S4a), we specify the following B sequence (FIG. S5a):

1. The robot is first curled into a 'C'-shape configuration by specifying 8=16.5 mT and α=−90° (0 ms in FIG. S4a).

2. Subsequently, we use a step function to change the direction of B, rotating its direction 162° clockwise. This step function simultaneously induces a rigid-body rotation (clockwise in this case) as the robot's $M_{net}$ tends to align with the direction of B, as well as the robot's shape changes shown in 0-13.5 ms in FIG. S4a.

3. We maintain B (8=16.5 mT, α=72°) until the ends of the robot hit the ground (13.5 ms in FIG. S4a), allowing the robot to jump (13.5-16.9 ms in FIG. S4a).

As mentioned, such B sequence prompts two different mechanisms as the robot performs directional jumping. The first mechanism is the rigid-body rotation of the robot, induced by the rigid-body torque created from the interaction of $M_{net}$ and the flipped B (0-13.5 ms in FIG. S4a). The second mechanism is the shape-change, as the robot changes from its initial 'C'-shape (0 ms in FIG. S4a) to a flatter sheet (10.2 ms FIG. S4a) and then back to its 'C'-shaped configuration (10.2-13.5 ms in FIG. S4a). Both mechanisms help to increase the momentum of the robot until the robot strikes the substrate. Upon impact, the substrate then induces both a vertical and horizontal momentum for the robot to jump.

In the following discussion, we focus on the shape-change mechanism, for which we have devised a 'straight' (vertical) jumping strategy (FIG. S4b). Using robots with $\beta_R=-90°$, the required setup for experimental characterization reduces to the single pair of electromagnetic coils along the Y axis (FIG. 6). Robots with $\beta_R=45°$ can also perform straight jumping, though they require a more complex experimental setup, i.e., two pairs of electromagnetic coils to generate a step B along the α=135° direction, and this may induce unnecessary experimental errors. To further ensure a spatially uniform B, we adjusted the distance of the two coils to form a Helmholtz configuration. Using these experimental conditions, the robot jumps when we specify a step change of B along the Y-axis of the global reference system. Mathematically, B can then be simply expressed as B=[0 8 0]$^1$.

B. Theoretical Model

Here we provide a model for the straight jumping strategy. This model is based on an energy conservation approach, which first analyzes the energy states of the soft robot at two salient instants: 1) when it is initially flat on the substrate, and 2) the moment when it leaves the substrate. Based on the principle of energy conservation, the soft robot gains energy from the work done by the magnetic torque, W, between these two states. This energy is then re-distributed into three components: the change in strain energy, ΔS, and kinetic energy, ΔK, for the robot, and the frictional losses, $f_L$, during the jump of the robot. Mathematically, this implies that $$W - \Delta S - f_L = \Delta K. \tag{S4.1}$$

The frictional losses include energy loss from contact friction with the substrate, air drag, and viscoelastic losses within the soft robot. To simplify our analysis, here we will neglect the effects of frictional losses and assume that $f_L$ is equal to zero. Equation (S4.1) can therefore be simplified into $$W - \Delta S = \Delta K. \tag{S4.2}$$

Based on the Euler-Bernoulli equation, ΔS can be expressed as $$\Delta S = \frac{1}{2}\int_0^L EI\left(\frac{\partial \theta_f}{\partial s}\right)^2 - EI\left(\frac{\partial \theta_i}{\partial s}\right)^2 ds = \frac{1}{2}\int_0^L EI\left(\frac{\partial \theta_f}{\partial s}\right)^2 ds, \tag{S4.3}$$

where $\theta_\theta(s)$ represents the final angular deformation of the robot before it leaves the substrate and we assume that the initial shape of the robot is flat, i.e., $\theta_i(s)=0$.

On the other hand, the magnetic work done W can be expressed as a double integral:

$$W = \int_0^L [\int_{\theta_i}^{\theta_f} \tau_m A \, d\theta] ds. \quad (S4.4)$$

The inner integral represents the work done by the magnetic torque on an arbitrary infinitesimal volumetric element along the robot (FIG. S6). The upper limit of this integral represents the final angular deformation of the element before the robot leaves the substrate and the lower limit $\theta_i(s)=0$. Therefore, W can be obtained by the outer integral as we sum up the total work done over all the infinitesimal elements along the robot. By using Eqs. (S3.3-S3.4), the inner integral can be evaluated to be $$\int_0^{\theta_f} \tau_m A \, d\theta = \int_0^{\theta_f} \{(m_x B_y - m_y B_x) \cos\theta - (m_y B_y + m_x B_x) \sin\theta\} A \, d\theta. \quad (S4.5)$$

Because the magnetization profile components, $m_x$ and $m_y$, and the actuating fields, $B_x$ and $B_y$, are independent of $\theta$, Eq. (S4.5) can be evaluated to be $$\int_0^{\theta_f} \tau_m A \, d\theta = \{(m_x B_y - m_y B_x)\sin\theta_f + (m_y B_y + m_x B_x)(\cos\theta_f - 1)\}A. \quad (S4.6)$$

Finally, by substituting Eq. (S4.6) and our magnetic actuation signals ($B=[B_x \, B_y \, 0]^T = [0 \, B \, 0]^T$) back into Eq. (S4.4), we can express W as $$W = -mBA \int_0^L \cos(\omega_s s + \theta_f) ds. \quad (S4.7)$$

Physically, Eq. (S4.7) implies that the work done is proportional to the magnitude of the magnetization profile and the actuating field, and it is also dependent on the final shape of the robot before it leaves the substrate. By substituting Eqs. (S4.7) and (S4.3) back into Eq. (S4.2), we obtain a mathematical expression for $\Delta K$. Once $\Delta K$ is known, we apply the principle of energy conservation again, this time from the moment when the robot leaves the substrate till the moment when it reaches its maximum height, $H_{max}$. At the maximum height, we assume all the kinetic energy used for jumping is fully converted into gravitational potential energy such that $$M_{Rob} g H_{max} = \Delta K, \quad (S4.8)$$

where $M_{Rob}$ and g represent the mass of the robot and the gravitational constant, respectively. We note that Eq. (S4.8) is a simplified model because it does not account for frictional losses and also not all the kinetic energy in Eq. (4.2) is used for jumping, i.e., some of the kinetic energy is converted to excite other modes of vibration of the robot. By substituting Eqs. (S4.3) and (S4.7) into Eq. (S4.8) and by rearranging the equation, $H_{max}$ can be obtained as $$H_{max} = -\left(\frac{mBA}{M_{Rob}g}\right) \int_0^L \cos(\omega_s s + \theta_f) ds + \frac{EI}{2M_{Rob}g} \int_0^L \left(\frac{\partial \theta_f}{\partial s}\right)^2 ds. \quad (S4.9)$$

Using Eq. (S4.9), we can then predict the theoretical $H_{max}$ of the soft robot across different B. Equation (S4.9) shows that $H_{max}$ is independent of w but its highly non-linear nature makes it difficult to derive a simple scaling law for h and L. Despite so, we will show in the following sub-section that this model is able to predict that the sample robots in FIG. S7 can jump higher if they have a smaller h (FIG. S7a, b) and a larger L (FIG. S7a.c).

C. Discussion

To investigate how the jumping performance varies when the dimensions of the soft robot are changed, we fabricated six additional robots, each having a different L, w or h from the original robot shown in FIG. 19a. For these additional robots, we have measured their maximum jumping height for 13.5 mT≤B≤23.5 mT. We used image detection techniques in MATLAB and standard spline fitting methods to extract from the experiments the final shape of the robots before they left the substrate, i.e., the $\theta_f$ of the robots. Experimental and model-predicted values of $H_{max}$ are presented in FIG. S7. Because $\theta_f$ may vary in each experimental point, the model predicted points in FIG. S7 also have error bars.

Generally, while the model in Eq. (S4.9) agrees with the experimental trends, the predicted values of $H_{max}$ in FIG. S7 overestimate the actual values as they assume that there are no frictional losses and all kinetic energy of the robot is used for jumping.

The experimental dependency of jumping height on B parameterized by the dimensions of the robots is shown in FIG. S8. Based on the experimental data, robots can jump higher if they have a longer L or a thinner h and there are no observable effects when w is changed. This trend agrees with the model specified by Eq. (S4.9) (see model predicted curve in FIG. S7).

In summary, our experimental results suggest that the soft robot can jump higher if we increase L or decrease h for the straight jumping strategy. The predictions of the theoretical model agree with the experimental data.

S5—Analysis for Rolling

Here we analyze the rolling locomotion by first specifying the required B sequence (section S5A) and then providing a theoretical model, which can predict how fast the robot can roll as we vary the rolling frequency f of B (section S5B). Finally, we discuss how the rolling speed $V_{roll}$ of the robot is affected when we vary the robot's dimensions (section S5C).

A. Experimental Details

A schematic drawing for the robot rolling in FIG. 20e is illustrated in FIG. S10. This locomotion is realized by using the following B sequence in the XY plane (FIG. S9a):

1. An initial B (B=18.5 mT, α=0°) is imposed to curl the robot into a 'C'-shape as shown in FIG. S9b.
2. The deformed robot possesses $M_{net}$ as specified by Eq. (S3.12), allowing it to be steered by a rotating B in the XY plane. The rotating frequency is 5 Hz in FIG. 20e.
3. As B starts to rotate clockwise, a rigid-body magnetic torque, $\tau_{Roll}$, is induced onto the robot as the robot's $M_{net}$ tends to align with B. This torque makes the robot roll.
4. Once B stops rotating, the robot's $M_{net}$ fully aligns with B and $\tau_{Roll}$ is reduced to a null vector. Hence, the robot will stop rolling.

Mathematically, the sequence of B described above can be represented as:

$$B(t) = B \begin{pmatrix} \cos(2\pi ft) \\ \sin(2\pi ft) \\ 0 \end{pmatrix}, \quad (S5.1)$$

where f represents the frequency of the rotating B and it is ranged between 0<f≤40 Hz in all of our experiments. To fairly evaluate $V_{roll}$ for robots with differing dimensions, we had adjusted B for each robot such that all of them could produce the same curvature. This adjustment is described in the next subsection.

B. Theoretical Model

To enable the rolling locomotion, the magnitude of the rotating B has to be large to make the robot curve into a 'C'-shape. For the original robot shown in FIG. 19a, a B larger than 10 mT is selected to guarantee a sufficiently large robot deflection.

We assume the rolling locomotion akin to that of a wheel rolling on a flat substrate. This assumption is supported by the observation that the robot can curl into a 'C'-shape that resembles a circular wheel when we apply the rotating B. We have used MATLAB 2016 (boundary value problem solver) to numerically solve the governing Eq. (S3.2), and we then computed the net magnetic moment, $M_{net}$, of the robot in the 'C'-shape configuration with Eq. (S3.12). In the rolling locomotion, $M_{net}$ becomes a function of the rotational displacement of the robot, $\phi_R$ (FIG. S10), and mathematically it can be expressed as $$M_{net}(\phi_R) = M_{net} \begin{pmatrix} \cos(\phi_R) \\ \sin(\phi_R) \\ 0 \end{pmatrix}, \quad (S5.2)$$

where the scalar $M_{net}$ represents the magnitude of the net magnetic moment.

Once B starts rotating, a rigid-body torque, $\tau_{Roll}$, is applied on the robot as its net magnetic moment tries to align with the field. Mathematically, $\tau_{Roll}$ can be written as $$\tau_{Roll} = [0\ 0\ 1](M_{net} \times B) = M_{net}B\sin(2\pi ft - \phi_R). \quad (S5.3)$$

The magnitude of $\tau_{Roll}$ depends on the $M_{net}$ and B, and on the angle between them. As the robot rolls, the ground induces a pushing force, F, which propels the translation of the robot (FIG. S10). The translational equation of motion of the robot is $$F - C_T V_{roll} = M_{Rob}\dot{V}_{roll}, \quad (S5.4)$$

where $C_T$ represents the translational damping. Likewise, the equation of motion of the robot about the z-axis can be expressed as $$\tau_{Roll} - C_R\dot{\phi}_R - Fr_{eff} = J\ddot{\phi}_R, \quad (S5.5)$$

where $C_R$, $r_{eff}$ and J represent the rotational damping coefficient, radius of wheel and moment of inertia of wheel, respectively. Assuming that the robot does not slip as it rolls on the substrate, the kinematic relationship between the x and $\phi_R$ can be expressed as $$r_{eff}\dot{\phi}_R = V_{roll}, r_{eff}\ddot{\phi}_R = \dot{V}_{roll}. \quad (S5.6)$$

By substituting this no-slip condition into Eq. (S5.4), multiplying it by $r_{eff}$ and finally adding it to Eq. (S5.5), the governing dynamic equation for the rolling locomotion can be expressed as $$M_{net}B\sin(2\pi ft - \phi_R) = J_{eff}\ddot{\phi}_R + C_{eff}\dot{\phi}_R \quad (S5.7)$$

where $J_{eff} = M_{Rob}r_{eff}^2 + J$ and $C_{eff} = C_T r_{eff}^2 + C_R$. Since the size of the robot is relatively small, its small $J_{eff}$ enables the robot to quickly reach a steady-state velocity, which can be rewritten as $$\dot{\phi} = \frac{M_{net}B}{C_{eff}}\sin(2\pi ft - \phi_R). \quad (S5.8)$$

A common phenomenon for miniature, magnetically actuated rotating robots is that the angle between the actuating field and the robots' angular displacement becomes constant at steady-state speed[6,7]. Mathematically, this means that $\sin(2\pi ft - \phi_R)$ becomes a constant value in Eq. (S5.8). Equation (S5.8) also reveals that the maximum angular velocity of the robot occurs when the angle between the field and the robot's angular displacement becomes 90°, i.e., $$2\pi ft - \phi_R = \frac{\pi}{2} \text{ since } \sin(2\pi ft - \phi_R) = 1.$$

This maximum angular velocity is known as the step-out frequency for the soft robot, and it is represented by $$\dot{\phi}_{R,step-out} = \frac{M_{net}B}{C_{eff}}. \quad (S5.9)$$

Once the rotating frequency of B exceeds the step-out frequency, i.e., $2\pi f > \dot{\phi}_{R,step-out}$, the frequency of B is no longer synchronized with the robot's angular velocity and it is difficult to predict $\dot{\phi}_R$. The discussion for such conditions will, however, be beyond the scope of this paper.

We experimentally validated that our robots do not exceed the step-out frequency under the control signals we used. Therefore $2\pi ft - \phi_R = k$, where k is the constant lag angle between B and $\phi_R$, and it does not change with time once the robot reaches its steady-state speed. By differentiating this expression in terms of time, this implies that $$\dot{\phi}_R = 2\pi f. \quad (S5.10)$$

Based on Eq. (S5.10) and the no-slip condition in Eq. (S5.6), the governing equation for our rolling locomotion becomes $$V_{roll} = 2\pi r_{eff} f. \quad (S5.11)$$

$r_{eff}$ can be determined by first solving Eq. (S3.2) numerically using MATLAB 2016 (boundary value problem solver) to determine the rolling shape, i.e., the 'C'-shape, and then determine the parameters of the circle that best fits it. We remark that the effective circumference of the fitting circle, i.e., $2\pi r_{eff}$, is generally approximately 10% higher than the length of the robot. A simple scaling analysis can also be derived based on Eq. (S5.11) if we approximate $$r_{eff} \approx \frac{L}{2\pi}$$

and this will suggest that $V_{roll} \propto L$.

As m, B, E and other constants are independent of the dimensions of the robot, we can conclude that a higher B is required to roll stiffer robots, i.e., robots with smaller L or larger $h^3$. Indeed, to enable a fair comparison of rolling locomotion performance for robots of different dimensions, we have adjusted B in such a way that all of the robots could produce the same curvature. For the robots with length $L_{new}$ different from the reference L, the same curvature could be obtained when the magnitude of B, $B_{L,roll}$, became[3]:

$$B_{L,roll} = \left(\frac{L}{L_{new}}\right)^2 B. \quad (S5.12)$$

Likewise, we could obtain the same curvature for robots that had thickness $h_{new}$ by changing the magnitude of B, $B_{h,roll}$, to $$B_{h,roll} = \left(\frac{h_{new}}{h}\right)^2 B. \tag{S5.13}$$

Finally, varying w does not change the curvature if B is unchanged. Therefore, we used Eq. (S5.12-S5.13) in our experiments to adjust the corresponding B for robots with differing dimensions, allowing all of the robots to create a curvature equivalent to that of the original robot under B=18.5 mT.

C. Discussion

Here we discuss how the rolling speed $V_{roll}$ varies with the frequency f of the rotating B and the dimensions of the robot. For this purpose, we fabricated six additional robots where each of them has either a different L, w or h compared to the original robot.

The experimental data presented in FIG. S11 show that the $V_{roll}$ has a linear relationship with f at low values, e.g., f<10 Hz in FIG. S11a-b. Generally, our theoretical model agrees with the data, though it underestimates $V_{roll}$. This discrepancy could be justified by the fact that the actual 'C'-shape configuration of the robot is not a perfect circle, as assumed in the model. Moreover, the standard deviation of $V_{roll}$ increases when f becomes high, e.g., when 20 Hz≤f≤40 Hz in FIG. S11a-b. This occurs because for such high f the ends of the robot tend to impact the substrate with such a large force that it makes the robot jump. To avoid this less predictable behavior, we recommend constraining $V_{roll}$ within its linear regime.

The experimental data for the dependency of $V_{roll}$ on f parameterized by the dimensions of the robots, presented in FIG. S12, show no significant variations in $V_{roll}$ versus w and h. The $V_{roll}$, however, increases when the robots have larger L. This trend generally agrees with the predictions of Eq. (S5.11), as $r_{eff}$ becomes bigger when L increases.

In summary, the rolling speeds of the robots have a linear relationship with a low f. Robots with a larger L can roll faster. Rolling is also much more controllable for relatively low f (e.g., f≤4 Hz for our robots). Finally, according to Eqs. (S5.12) and (S5.13), it is easier to induce the curvature necessary for rolling (i.e., we can induce the same curvature using a lower B) for robots with larger L or smaller h. In this respect, we can use the same B to achieve the same curvature for robots that have different w.

S6—Analysis for Walking

In this section, we first specify the sequence of B required for walking (section S6A) and then provide a model that can predict the walking speed of our robot as we vary f and $B_{max}$, i.e., the maximum B value in one walking cycle (section S6B). Finally, we discuss how the robot dimensions affect its walking speed in section S6C.

A. Experimental Details

Driven by the B sequence shown in FIG. S13a in the XY plane, the soft robot can walk rightwards as shown in FIG. 20f. The B sequence can be described as follows:

1. The robot first anchors on its front end and starts to tilt forward. As it rotates, it also starts to deform into a 'C'-shape (0 ms-62 ms in FIG. 20f). To realize this motion sequence, the direction of B is fixed at α=150° while B is increased linearly until it peaks at $B_{max}$=10 mT.
2. The robot maintains the 'C'-shape and begins to anchor on its back end such that it can tilt backwards (62 ms-122 ms in FIG. 20f). To realize this motion, the direction of B changes linearly from α=150° to α=120° while maintaining B at 10 mT.
3. Finally, the robot extends its front end, allowing it to make a net stride forward (122 ms-210 ms in FIG. 20f). To realize this motion, the direction B is fixed at α=120° while its magnitude is decreased linearly from 10 mT to 0 mT.

To investigate how the walking locomotion is affected by the dimensions of the soft robot, we fabricated six additional robots that have either a different L, w or h compared to the original robot. Using these robots, we conducted two types of experiments, where we respectively evaluated the walking speed of the robots, $V_{walk}$, versus different f (from 2 Hz to 20 Hz) with $B_{max}$ fixed at 10 mT, and $V_{walk}$ versus different $B_{max}$ (from 8 mT to 16 mT) with f fixed at 5 Hz.

B. Theoretical Model

Based on our walking strategy, the net stride of the robot in one walking cycle, $S_{walk}$, is a function of the difference between the robot's curvature in the states shown at times 0 ms and 102 ms in FIG. 20f. More explicitly, $S_{walk}$ can be expressed as $$S_{walk}=S_1-S_2 \tag{S6.1}$$

where $S_1$ and $S_2$ represent the distance between the ends of the robot as illustrated in FIG. S14. Because B=0 in FIG. S14a, $S_1$ can be approximated as L. On the other hand, $S_2$ in FIG. S14b can be computed by first solving Eq. (S3.2) numerically with MATLAB 2016 (boundary value problem solver).

We assume that the soft robot can respond to the actuating fields when the frequency of B is low. In these regime, the walking speed, $V_{walk}$, can be approximated as the product of $S_{walk}$ and the walking frequency f:

$$V_{walk}=S_{walk}f=(L-S_2)f. \tag{S6.2}$$

Validity of Eq. (S6.2) assumes no-slip conditions at the anchored ends. Equations (S6.2) and (S3.2) suggest that $V_{walk}$ does not scale with w, and they also suggest that $V_{walk}$ has a non-linear relationship with L and h, as $S_2$ can only be solved numerically by Eq. (S3.2). However, Eq. (S3.2) does suggest that robots with larger L and thinner h can deform more to create a smaller $S_2$. This in turn suggests that Eq. (S6.2) predicts that robots with larger L and thinner h will walk faster.

C. Discussion

FIG. S15 compares the experimental data with corresponding theoretical predictions, based on Eq. (S6.2) and Eq. (S3.2), for $V_{walk}$ versus f. The experimental results suggest that $V_{walk}$ has a linear relationship with f at low frequencies. However, for higher values of f, there appear instances where $V_{walk}$ has a non-monotonic trend, e.g., $V_{walk}$ drops to zero after 14 Hz in the L=333 μm case (FIG. S15b(II)). This happens because, under such conditions, the ends of the robot approach the substrate so quickly (at the end of Step 2 in SI section S6A) that upon contact the robot is bounced backwards. Such bouncing reduces the effective net stride per walking cycle, making the robots slower, and in the case shown in FIG. S15b(II), $V_{walk}$ becomes 0 mm/s.

FIG. S16 compares the experimental data with corresponding theoretical predictions, based on Eq. (S6.2) and Eq. (S3.2), for $V_{walk}$ versus $B_{max}$. The experimental results show that $V_{walk}$ correlates positively with $B_{max}$. This agrees with our theoretical model, which predicts that a larger $B_{max}$ can induce a larger net stride, i.e., (L−$S_2$), in each walking cycle.

The experimental data for the dependency of $V_{walk}$ on f and $B_{max}$ parameterized by the dimensions of the robots are respectively shown in FIG. S17 and FIG. S18. The results in FIG. S17 suggest that, in the linear regime where f≤11 Hz, more compliant robots (i.e., with larger L or smaller h) walk faster when $B_{max}$ is fixed. This happens because the more compliant robots can produce a larger net stride per walking cycle. Additionally, the robots with larger L are expected to walk faster thanks to a relatively larger body-length. Our experimental data do not show any obvious correlation between $V_{walk}$ with w.

In general, while the theoretical predictions in Eq. (S6.2) and Eq. (S3.2) tend to overestimate $V_{walk}$, they agree with the trend of the experimental data (FIG. S15 and S16). Indeed, our model predicts that robots with smaller h and larger L walk faster while w does not affect $V_{walk}$. The predicted speeds are larger than the experimental speeds because the robots are observed to slip at their anchor points on the substrate, and slippage reduces the net stride of the robots in each walking cycle. Furthermore, due to fabrication uncertainties (section S1D), the robots are not perfectly flat even for B=0. Therefore, also by approximating $S_1$ with L our model tends to overestimate the net stride in each walking cycle.

S7—Analysis for Meniscus Climbing

In this section, we analyze the robot's meniscus climbing by specifying the required sequences of B for this locomotion (section S7A) and then proposing a quasi-static, force-based model which can predict the minimum required field magnitude, $B_{min}$, to effectively let the robot climb up to the top of a positive liquid meniscus (section S7B). Finally, we discuss how the robot dimensions affect meniscus climbing in section S7C.

A. Experimental Details

Driven by the B sequence of FIG. S19 in the XY plane, the water meniscus climbing shown in FIG. 20b that prompts a subsequent landing onto the adjacent platform, is achieved by the following steps:

1. The initial B (B=18.5 mT, α=315°) is imposed to let the robot assume a 'C'-shape with upward curvature. The robot achieves in 520 ms a stable position along the meniscus.
2. B is subsequently rotated counter-clockwise toward α=157° to make the robot climb further up. After 4.6 s of B is on, the robot reaches contact with the wall of the platform. The subsequent rotation progressively pushes the upper portion of the robot out of water while being supported by the curled lower portion of the robot on the meniscus (4.8 s-12.1 s).
3. Finally, B is turned off and the robot rests on the edge of the adjacent platform.

The above description uses a 'C'-shape configuration to climb the meniscus. If there is no need to push the upper portion of the robot out of the water, we remark that the meniscus climbing locomotion can also be realized when the robot has cosine-shaped small deflection (FIG. 19bIII). In the following section, we propose a quasi-static model of the soft robot's water meniscus climbing, which describes the process till the robot touches the wall of the platform. The corresponding experiment we performed is shown in FIG. S20. A B pointing upwards and of increasing magnitude was imposed to progressively curve the robot, and the smallest B magnitude $B_{min}$ which made the robot touch the wall at the top of the meniscus was recorded. As the robot's $M_{net}$ is always aligned with B under small deflection conditions (section S3B), the following model does not consider magnetic torque.

B. Theoretical Model

When contacting water from air, our soft robots get almost completely immersed in water (FIG. S20) and strongly pinned at the water/air interface, as confirmed by the conformal attachment of the triple contact line to the robot's perimeter during meniscus climbing (see e.g., FIG. 3d).

The robots stably reside at the water/air interface thanks to the generalized Archimedes principle, i.e., the combined effect of buoyancy, acting on the surface of the robots in contact with water, and of surface curvature, acting on their contact perimeter. The generalized buoyancy force is quantified by the total weight of water displaced by the robots, which includes the water displaced both by the robots' body (i.e., inside the contact line) and by the menisci along their perimeter (i.e., outside)[8]. Given the conformal contact line pinning along its perimeter, a floating body can move upward along a positive liquid meniscus provided that the quasi-static work the body makes on the system, by extending and/or curving the water interface, compensates the energy required to climb the gravitational potential.

Here we first describe a two-dimensional force-based analytical model for an arc-shaped, soft floating robot (arc-shaped model, in short) to explain the mechanics of meniscus climbing and predict the body curvature that allows the robot, with known geometrical and material parameters, to climb the height of a sloped water meniscus. We then derive a model for cosine-shaped robots (i.e., cosine-shaped model) to predict the minimal value of B, $B_{min}$, that makes the robot climb the complete height of the meniscus.

I. Arc-Shaped Model

The two-dimensional geometry of reference is sketched in FIG. S21a. According to experiments, we assume the hydrophobic robot body fully immersed in water with only its top surface in contact with air. The triple contact line is consequently pinned at the perimeter of the top robot surface. Contact line pinning leaves the edge angles $\theta_1$ and $\theta_2$ undetermined, thus free to conform to boundary conditions within the limits imposed by canthotaxis, specifically by the Gibbs' criterion. This has two important consequences. First, edge angles are not imposed by material properties, and so they are largely independent of robot's pose (described by the tilt angle α) and curvature (by the radius of curvature R and the angle ϕ). As a corollary, the physical cause of meniscus climbing is in our case not primarily related to surface tension effects. Second, by extending the canthotaxis sector, the robot's surface hydrophobicity enhances contact line pinning and thus the stability of the robot position on the water surface.

The mechanism underlying a soft robot's meniscus climbing is based on buoyancy. When assuming a curved shape, the robot (of density $\rho_r$) displaces an additional volume of water (of density $\rho_w$) from the surface (see FIG. 20b, reproduced in FIG. 519b). In presence of a positive water meniscus, the additional buoyancy enables the robot to move up along the interfacial profile. The five variables in the problem ($\theta_1$, $\theta_2$, α, R, and ϕ, see FIG. S21a) can be determined by satisfying conditions for mechanical and hydrostatic equilibrium of the curved robot at a distance d from the adjacent, vertical wall. The wall intersects the water surface profile, H(x), at a fixed contact angle $\theta_0$. In experiments, both the vertical position H(0) of the contact line at the wall and $\theta_0$ were not affected by the presence of the robot (FIG. S20).

The shape of liquid interfaces in hydrostatic equilibrium is described by the Young-Laplace equation $$\gamma \frac{\partial^2 H(X)}{\partial X^2} = \rho g H(X). \tag{S7.1}$$

The unperturbed profile $H_u$ of the meniscus (i.e., in absence of the robot) is determined by the boundary conditions $$\frac{\partial H(X)}{\partial X} = H'(X) = -\cot\theta_0$$

and $H(+\infty)=0$, leading to $$H_u(X) = L_C \cot\theta_0 e^{-X/L_C}, \quad (S7.2)$$

where we define the capillary length $L_C=\sqrt{\gamma/\rho g}=2.7$ mm. Hence $H_u(0)=L_C \cot\theta_0$.

The profile of the water surface $H_r$ joining the wall to the closest robot edge is in turn determined by the Young-Laplace equation and the boundary conditions $H'(x)=\cot\theta_0$ and $H'(d)=\cot\theta_1$, leading to $$H_r(X) = L_C \frac{\cot\theta_1 \cosh\left(\frac{X}{L_C}\right) + \cot\theta_0 \cosh\left(\frac{d-X}{L_C}\right)}{\sinh\left(\frac{d}{L_C}\right)}. \quad (S7.3)$$

Assuming $H_u(0)=H_r(0)$ according to experiments, the following condition links d to $\theta_1$:

$$\cot\theta_1 = -\cot\theta_0 e^{-\frac{d}{L_C}}. \quad (S7.4)$$

Mechanical equilibrium is imposed by normal and tangential force balances, with respect to the direction identified by a, and by torque balance. The three balances are respectively described by $$0 = \gamma\left(-\cos\left(\theta_1 - \frac{\pi}{2} - \alpha_m\right) + \cos\left(\theta_2 - \frac{\pi}{2} + \alpha_m\right)\right) + \quad (S7.5)$$
$$(\Delta\rho g LT - \rho_w g A_{cs})\sin\alpha_m$$

$$0 = \quad (S7.6)$$
$$\gamma\left(\sin\left(\theta_1 - \frac{\pi}{2} - \alpha_m\right) + \sin\left(\theta_2 - \frac{\pi}{2} + \alpha_m\right)\right) + (\Delta\rho g LT - \rho g A_{cs})\cos\alpha_m$$

$$0 = \gamma\lambda(\sin\delta_1 - \sin\delta_2) + (R - d_{cs})\sin\alpha \cdot \rho_w g A_{cs} \quad (S7.7)$$

where $$\Delta\rho = \rho_r - \rho_w, \quad A_{cs} = \frac{R^2}{2}(\phi - \sin\phi),$$
$$\lambda = R\frac{\sin(\phi/2)}{\cos\beta}, \quad B = \operatorname{atan}\left(\frac{1-\cos(\phi/2)}{\sin(\phi/2)}\right),$$
$$\delta_1 = \beta - \left(\theta_1 - \frac{\pi}{2} - \alpha_m\right), \quad \delta_2 = \beta - \left(\theta_2 - \frac{\pi}{2} + \alpha_m\right),$$

and the distance of the centroid of the circular segment from the center of curvature is $$d_{cs} = \frac{4R\sin^3(\phi/2)}{3(\phi - \sin\phi)}.$$

In Eqs. (S7.5-S7.7), the first terms represent the corresponding projection of the surface tension force, the latter term the effect of gravity and buoyancy. Finally, the conservation of robot length provides the last equation as $$R\phi = L. \quad (S7.8)$$

The system of nonlinear equations was solved numerically (MATLAB 2016, nonlinear system solver). In FIG. S22, we compare experimental and predicted values of robot's body curvature when first in contact with the wall at the top of the meniscus (i.e., for d→0). The actual shape of the deformed robot body was fitted with a circular profile in the same way as in SI section S5b.

II. Cosine-Shaped Model

To link body curvature to prescribed B, we derived a cosine-shaped version of the previous model to specifically describe a cosine shape robot lying at the top of the water meniscus, i.e., for d→0. The reference two-dimensional geometry is sketched in FIG. S21b. In this case, we assume the ends of the robot pinned at the water-air interface, and that the latter has a constant (linear) slope that, from Eq. (S7.2), can be described as $H'(0)=-\cot\theta_0$. From Eq. (7.4) we also get $\theta_1=\pi-\theta_0$. Under these conditions, horizontal force balance determines $\theta_2=\theta_0$. Accordingly, the tensile components of the surface tension acting on the ends of the robot are aligned with the water-air interface. Since the vertical projections of the surface tension force are of equal magnitude and opposite in direction, vertical force balance then imposes the equilibrium of weight and buoyancy of the robot. This implies the coincidence of center of gravity and center of buoyancy, as well as balance of torques. The buoyancy of the robot with cosine shape of magnitude D and spatial frequency $\omega_s$ can be calculated as $$F_B = \rho_w w g \int_0^L [h + D(1-\cos(\omega_s x))]dx = \rho_w w g(A+h)L, \quad (S7.9)$$

and the balance of robot buoyancy and robot's body weight leads to $$D = h\left(\frac{\rho_r}{\rho_w} - 1\right), \quad (S7.10)$$

where the second factor is always positive for $\rho_r > \rho_w$. Finally, by using Eq. (S3.8) the prescribed $B_{min}$ to climb the entire meniscus height is computed as $$B_{min} = \frac{8\pi^3 DEI}{mAL^3} = \left(\frac{\rho_r}{\rho_w} - 1\right)\frac{2\pi^3 Eh^3}{3 \, mL^3}. \quad (S7.11)$$

The above equation shows that $B_{min} \propto L^{-3}$, $h^3$. Comparison of experimental and model-predicted values of $B_{min}$ are presented in FIG. S23.

C. Discussion

To discuss how the minimal prescribed B, $B_{min}$ to climb the entire meniscus height, varies against the robot's dimensions, we include the experimental data of four additional robots that have either a different L, h compared to the original robot (FIG. 19a). As shown in FIG. S22, the arc-shaped model correctly predicts how L and h can impact the meniscus climbing performance: shorter and thicker robots require correspondingly smaller R (i.e., larger curvature) to climb the full meniscus. Similarly, FIG. S23 shows that Eq. (S7.11) of the cosine-shaped model, specific for the robot in contact with the wall at the top of the water meniscus, can provide estimates of upper bounds on the values of B in accord with the experimentally recorded values.

With regard to the latter model, we remark that the simplifying assumption of constant linear slope of the water-air interface holds in principle for bodies of length $L \ll L_C$, for which the Taylor series expansion of the exponential meniscus profile (Eq. (S7.2)) can be approximated with its linear term. This condition is admittedly not quite met by our robots. In spite of this discrepancy, the model yields reasonable values for the prescribed $B_{min}$.

In all cases, w is excluded from consideration, since the 2D nature of the models implicitly assumes infinitely wide robots. In experiments, the finite width of the actual robots introduces an additional curvature of the water surface, in the direction perpendicular to the 2D model plane (FIG. 3d). This transverse curvature is not contemplated in the model. Such inherent discrepancy may partly account for the discrepancy in the results. An additional approximation was introduced in the arc-shaped model by assuming that the additional volume of displaced water is equal to that of the circular segment subtended by the curved robot. This is admittedly a simplifying overestimate of the water volume additionally displaced from the surface, which may explain the model's systematic overestimate of R.

S8—Analysis for Undulating Swimming

In this section, we analyze the undulating swimming by first providing the required sequence of B (section S8A) and then a model that can approximate our robots' swimming speed (section S8B). Finally, we discuss how the robot's dimensions can affect its swimming speed in section S8C.

A. Experimental Details

Similar to the rolling locomotion (SI section S5A), we use a rotating B in the XY plane to enable undulating swimming (FIG. S24). The key difference between these two modes of locomotion is that B has to be much smaller here (e.g., 1 mT to 5 mT) to prevent the robot from curling up into a 'C'-shape. With this rotating B, the robot is able to create an undulating traveling wave along its body such that it can produce an effective swimming gait similar to a Taylor swimming sheet. For the undulating swimming locomotion, the frequency of the rotating B, f, ranges from 40 Hz<f≤160 Hz, and B is expressed as $$B(t) = \begin{pmatrix} B_x \\ B_y \\ 0 \end{pmatrix} = B \begin{pmatrix} \cos(2\pi f t) \\ \sin(2\pi f t) \\ 0 \end{pmatrix}. \tag{S8.1}$$

B. Theoretical Model

The speed of the undulating swimming depends heavily on the highest rotational frequency of B that the robot can respond to. Therefore, we need to estimate the robot's mechanical bandwidth, i.e., its two lowest non-zero fundamental natural frequency $\omega_{n,2}$ and $\omega_{n,3}$. This computation can be achieved by a simple vibrational analysis, which assumes small deformations within the robot. Using this assumption, we analyze an arbitrary infinitesimal element of the robot, dx, at time t (see FIG. S25). Based on Newton's force law, the equation of motion of such element along the vertical axis is given as $$-Cw\dot{y} + \frac{\partial v}{\partial x} = \rho_r A \ddot{y}. \tag{S8.2}$$

where C and v represent the damping coefficient and internal shear force, respectively, while $\rho_r$ represents the robot's density and y refers to the vertical deflection. Physically, $-Cw\dot{y}$ and $\rho_r A\ddot{y}$ in Eq. (S8.2) represent the damping and inertial forces acting on the element, respectively.

In a similar manner, we can use $\tau=J\alpha$ to obtain the rotational equation of motion for this element about its bending axis:

$$\frac{\partial v}{\partial x} = -\frac{\partial^2 M_b}{\partial x^2} - \frac{\partial \tau_m}{\partial x} A. \tag{S8.3}$$

The variable $M_b$ represents the bending moment acting on the element, and based on the Euler-Bernoulli equation, it can be approximated to be $$EI \frac{\partial^2 y}{\partial x^2}$$

for small deflections. Therefore, by substituting Eq. (S8.3) into Eq. (S8.2), we can obtain the governing equation for the beam:

$$-Cw\dot{y} - EI \frac{\partial^4 y}{\partial x^4} - \frac{\partial \tau_m}{\partial x} A = \rho_r A \ddot{y}. \tag{S8.4}$$

We utilize the well-established mode-shape analysis to evaluate this partial differential equation. We first perform a free-vibration analysis to obtain the robot's mode shapes, i.e., we temporarily remove the damping forces and magnetic torques from Eq. (S8.4). Subsequently, we use the variable separation method for y such that $$y(x,t) = F(x)G(t), \tag{S8.5}$$

where $F(x)$ is solely a function of x and $G(t)$ is only a function of time. By substituting Eq. (S8.5) into Eq. (S8.4) (without the damping effects and magnetic actuation) and rearranging the terms, we obtain:

$$-\frac{EI}{\rho_r A}\left(\frac{\partial^4 F}{\partial x^4}\right)\left(\frac{1}{F}\right) = \left(\frac{1}{G}\right)\ddot{G}. \tag{S8.6}$$

Based on classical vibration analysis, both sides of Eq. (S8.6) are independent of x and t, and they can be equated to become a function of the $R^{th}$ natural frequency, $\omega_{n,R}^2$, of the robot:

$$\left(\frac{1}{G}\right)\ddot{G} = -\omega_{n,R}^2, \tag{S8.7}$$

and $$-\frac{EI}{\rho_r A}\left(\frac{\partial^4 F}{\partial x^4}\right)\left(\frac{1}{F}\right) = -\omega_{n,R}^2, \tag{S8.8}$$

After solving the homogeneous equation in Eq. (S8.8), we can express the $R^{th}$ mode shape of the robot ($F_R$) with $\omega_{n,R}$:

$$F_R = A_R e^{\frac{\sqrt{\omega_{n,R}}}{\beta} x} + B_R e^{-\frac{\sqrt{\omega_{n,R}}}{\beta} x} + C_R \cos\left(\frac{\sqrt{\omega_{n,R}}}{\beta} x\right) + D_R \sin\left(\frac{\sqrt{\omega_{n,R}}}{\beta} x\right), \tag{S8.9}$$

where $$\beta^4 = \frac{EI}{\rho r^A}$$

and the variables $A_R$, $B_R$, $C_R$ and $D_R$ are constants dependent on the robot's boundary conditions. Because the robot has free ends, we substitute the following free-free boundary conditions into Eq. (S8.9):

$$\begin{cases} \frac{\partial^2 y}{\partial x^2}(x=0) = \frac{\partial^2 y}{\partial x^2}(x=L) = 0 \\ \frac{\partial^3 y}{\partial x^3}(x=0) = \frac{\partial^3 y}{\partial x^3}(x=L) = 0 \end{cases} \quad (S8.10)$$

Physically, the boundary conditions in Eq. (S8.10) dictate that there are no shear forces and bending moments acting on the free ends of the robots. Based on these boundary conditions, we can obtain the following characteristic equation for the robot:

$$\cos\left(\frac{\sqrt{\omega_{n,R}}}{\beta}L\right)\left(e^{\frac{\sqrt{\omega_{n,R}}}{\beta}L} + e^{-\frac{\sqrt{\omega_{n,R}}}{\beta}L}\right) = 2. \quad (S8.11)$$

Once the characteristic equation has been solved numerically, the robot's three lowest natural frequencies are given as:

$$\frac{\sqrt{\omega_{n,1}}}{\beta}L = 0, \quad \frac{\sqrt{\omega_{n,2}}}{\beta}L = 4.73 \text{ and } \frac{\sqrt{\omega_{n,3}}}{\beta}L = 7.85. \quad (S8.12)$$

The first mode, $\omega_{n,1}$, represents the robot's rigid-body motion, while the second and third mode, $\omega_{n,2}$ and $\omega_{n,3}$, are the two lowest non-zero fundamental natural frequency of the robot. As the first mode does not describe the shape change of the robot with respect to the actuating magnetic field's frequency, we begin our frequency response analysis with $\omega_{n,2}$ and $\omega_{n,3}$. Based on Eq. (S8.12), these two natural frequencies can be expressed as:

$$\omega_{n,2} = 4.73^2 \sqrt{\frac{E}{12\rho_r}}\left(\frac{h}{L^2}\right) \text{ and } \omega_{n,3} = 7.85^2 \sqrt{\frac{E}{12\rho_r}}\left(\frac{h}{L^2}\right). \quad (S8.13)$$

The mode shapes corresponding to $\omega_{n,2}$ and $\omega_{n,3}$ affect the small deflection cosine and sine shapes shown in FIG. 19b(II-III), respectively. Therefore, by using Eq. (S8.13), Eq. (S8.9) and Eq. (S8.5), the undulating traveling wave generated along the soft robot's body can be expressed as:

$$y(x,t) = \left(\frac{mAL^3B}{8\pi^3 EI}R_1\right)\left[\cos\left(\frac{2\pi}{L}x\right)\cos(2\pi ft)\right] + \left(\frac{mAL^3B}{8\pi^3 EI}R_2\right)\left[\sin\left(\frac{2\pi}{L}x\right)\sin(2\pi ft)\right], \quad (S8.14)$$

where the variables $R_1$ and $R_2$ represent the asymptotic approximation of the Bode magnitude function of ideal $2^{nd}$ order systems, which can be expressed as:

$$R_1 = \begin{cases} 1, & f < \omega_{n,2} \\ \left(\frac{\omega_{n,2}}{2\pi f}\right)^2 & f \geq \omega_{n,2} \end{cases}, \quad R_2 = \begin{cases} 1, & f < \omega_{n,3} \\ \left(\frac{\omega_{n,3}}{2\pi f}\right)^2 & f \geq \omega_{n,3} \end{cases}. \quad (S8.15)$$

To better analyze Eq. (S8.14), we rearrange its terms to become:

$$y(x,t) = \left(\frac{mAL^3B}{8\pi^3 EI}R_1\right)\left[\cos\left(\frac{2\pi}{L}x\right)\cos(2\pi ft) + \sin\left(\frac{2\pi}{L}x\right)\sin(2\pi ft)\right] + \left(\frac{mAL^3B}{8\pi^3 EI}\right)(R_2 - R_1)\left[\sin\left(\frac{2\pi}{L}x\right)\sin(2\pi ft)\right]. \quad (S8.16)$$

Physically, the first and second components on the RHS of Eq. (S8.16) represent the traveling and stationary waves along the robot's body, respectively. As the stationary wave component is a time-symmetrical motion, it does not propel the robot at low Reynolds number regime i.e., Re<<1. Hence this component can be excluded, and the effective undulating swimming gait of the robot, i.e., the effective traveling wave, can be expressed as $$y(x,t) = \left(\frac{mAL^3B}{8\pi^3 EI}R_1\right)\left[\cos\left(\frac{2\pi}{L}x\right)\cos(2\pi ft) + \sin\left(\frac{2\pi}{L}x\right)\sin(2\pi ft)\right]. \quad (S8.17)$$

Based on the Taylor's swimming sheet model, the swimming speed, $V_{swim}$, of this effective undulation swimming gait can be represented as $$V_{swim} = \frac{2\pi^2}{L}\left(\frac{mAL^3B}{8\pi^3 EI}R_1\right)^2 f, \quad (S8.18)$$

where f represents the traveling wave's frequency (coincident with the rotation frequency of B). The equation implies that: 1) when $f<\omega_{n,2}$, $V_{swim} \propto L^5$, $h^{-4}$, 2) when $f>\omega_{n,2}$, $V_{swim} \propto L^{-3}$. Because this locomotion can be represented as a low pass system, our scaling analysis will be based on the range of f smaller than $\omega_{n,2}$.

Equation (S8.18) is valid for two types of boundary conditions: 1) the robot is swimming in the bulk of a fluid, and 2) the robot is swimming on an air-fluid interface. The key assumptions for the Taylor's swimming sheet model in Eq. (S8.18), however, is that it assumes low Reynolds number, i.e., Re<<1, and also the wavelength is much larger than the traveling wave's amplitude, i.e., $$L >> \frac{mAL^3B}{8\pi^3 EI}R_1.$$

C. Discussion

To discuss how the undulating swimming speed, $V_{swim}$, varies against the robots' dimensions, we include the experimental data of six additional robots that have either a different L, w or h compared to the original robot (FIG. 19a).

We conducted two types of experiments on these robots, to respectively evaluate their 1) $V_{swim}$ versus f, and 2) $V_{swim}$ versus B. In all of these experiments, our robots were pinned at the air/water interface.

For the first type of experiments, we fixed B at 5 mT and varied f from 40 Hz to 160 Hz. The experimental results are shown in FIG. S26 together with the theoretical predictions based on Eq. (S8.18). The experimental data indicate that, for all robots, $V_{swim}$ peaks at a robot-specific frequency, and these peak frequencies range between 60 Hz to 100 Hz. Our theoretical model predicts the existence of peak swimming speeds for the robots, though it is unable to capture the specific f at which the peak speed occurs. Despite this limitation, the model can approximate $V_{swim}$ versus f to be around one order of magnitude. The biggest discrepancy between the theoretical predictions and experimental results is illustrated in FIG. S26c(II), for which the experimentally obtained $V_{swim}$ is about 20 times faster than the predicted speed when f>100 Hz.

For the second type of experiments, we varied B from 1 mT to 5 mT while fixing f at 40 Hz. The experimental results are shown in FIG. S27 together with the theoretical predictions based on Eq. (S8.18). Our experimental results show that has a positive correlation with B and this agrees with our theoretical prediction. In general, the model can approximate versus B within the same order of magnitude for all the robots.

The experimental data for the dependency of $V_{swim}$ on f and B parameterized by the dimensions of the robots are shown in FIGS. S28 and S29. In general, these experimental data show that robots with larger L can swim faster and that w does not have an obvious correlation with $V_{swim}$, and these phenomena agree with our theoretical predictions. However, in contrast to our theoretical predictions, our experiments indicate that robots with larger h will swim faster.

The discrepancies between the experimental results and theoretical predictions can be attributed to several factors. First, the Taylor swimming sheet model in Eq. (S8.18) assumes Re<<1, whereas our characterization experiments displayed in FIG. S28 and S29 show that Re is to be between 4.6 and 190 for the original robot used in the main text, and between 2.54 and 676 for all the robots tested in SI. Since inertial effects are not included in the model, a discrepancy between the model and the data is expected. Indeed, to our best knowledge, precise solution of swimming at high Reynolds number usually should be solved numerically and it is non-trivial to include the inertia effects in our analytical model. Second, the soft robots violate the model assumption that the swimmer's wavelength is much bigger than its traveling wave's amplitude, as the amplitude and wavelength are in the same order of magnitude in some conditions. Third, uncertainties in our fabrication process cause our robots to have a residual small curvature even in its rest state (SI section 1D and FIG. S1e). Such uncertainty makes the amplitude of the sine shape smaller than predicted (see FIG. 19b(II)). The ensuing non-ideal traveling wave across the robot body introduces an additional discrepancy between the model and the experimental results. Lastly, we did not consider surface tension effects in the model because the dynamic angles formed by water at the edges of the robots, which depend on the amplitude and frequency of the traveling wave as well as the material composition of the robots, are not trivial to be accounted for.

In summary, our experimental data suggest that robots with larger h and L can swim faster, while no obvious correlation between $V_{swim}$ and w has been observed. For most cases, our theoretical model provides an order-of-magnitude accurate approximation for $V_{swim}$. Therefore, the model can be used as a guide for designers to estimate the swimming speed of future soft robots that can produce a similar swimming gait. We will try to develop a more accurate model that can predict $V_{swim}$ at high Re regime and account for the robot's surface effects in the future. We will also further improve our fabrication method such that the robots can produce a better undulating traveling wave along their body.

S9—Analysis for Crawling

To analyze the crawling locomotion, here we specify the B sequence required to invoke this locomotion (section S9A), and based on our observations from the experiments conducted for seven soft robots with different dimensions (section S9B), we propose a suitable fitting model to account for it (section S9C).

A. Experimental Details

The crawling locomotion shown in FIG. 20g was performed in a glass tunnel of rectangular cross-section (0.645 mm×2.55 mm) using a rotating B in the XY plane with frequency f of 20 Hz (counter-clockwise) and B of 30 mT (FIG. S30). The B sequence here can be described by Eq. (S8.1). While the crawling locomotion is possible for B>2 mT for the original robot, we used B=30 mT for the experiment in FIG. 20g to obtain a noticeable crawling displacement per cycle. Because the crawling robots were constrained by the walls, their deflections were small even when a large B was applied.

To better understand the crawling locomotion, we fabricated six additional robots, having either a different L, w or h compared to the original robot shown in FIG. 19a, and conducted two types of experiments to study respectively 1) crawling speed, $V_{crawl}$, versus f (from 20 Hz to 140 Hz) while fixing B at 10 mT, and 2) $V_{crawl}$ versus B (from 2 mT to 18 mT) while fixing f at 20 Hz.

B. Discussion

Similar to the Taylor swimming gait presented in section S8, a rotating B is used for generating a traveling wave along the robots' body to enable the crawling locomotion (FIG. S30). The key difference between crawling and undulating swimming, however, is that the crawling direction is parallel to the propagation direction of the traveling waves while the motion of the swimming gait is anti-parallel to its traveling wave.

The experimental results in FIG. S31 show the variation of $V_{crawl}$ versus f parameterized by the dimensions of the robots. It suggests that $V_{crawl}$ of almost all robots increases linearly with f until f=40 Hz. When f reaches 60 Hz, $V_{crawl}$ for the robot with h=333 μm starts to decline. Such phenomenon affects also other robots when f becomes higher. We remark that this happens when the traveling wave can no longer produce constant amplitude: The robot is still able to crawl, but the relationship between $V_{crawl}$ and f is no longer linear.

The experimental data for the dependency of $V_{crawl}$ on B parameterized by the dimensions of the robots are shown in FIG. S32. In general, we observe a positive correlation between $V_{crawl}$ and B, until $V_{crawl}$ starts to saturate for relatively large B. Such saturation of $V_{crawl}$ could be explained by the change of the contact area between the robot and the tunnel as we vary B (FIG. S33). Using for instance the original robot (with dimensions of 3.7 mm×1.5 mm×0.185 mm), we observe that $V_{crawl}$ starts to saturate after B exceeds 14 mT, and that this corresponds to a saturation of the contact length between the robot and the inner surface of the tunnel (FIG. S33). This is expected, since the amplitude of the traveling wave across the robot's body length within the tunnel is eventually constrained by the cross-section of the tunnel.

At last, we do not observe an obvious correlation between the robots' crawling speed and their dimensions L, w, or h: For any specific value of f and B, $V_{crawl}$ appears similar for all robots.

C. Fitting Model

The observations reported in the previous subsection suggest that $V_{crawl}$ can be approximated with a polynomial function of f and by an exponential function of B. We consequently provide the following fitting model:

$$V_{crawl} = B^a (k_2 f^2 + k_1 f + k_0), \quad (S9.1)$$

where a, $k_0$, $k_1$, and $k_2$ are the fitting parameters. Dimensions of the robots are not included in the model, since they did not show any obvious co-relationship with the experimental crawling speeds. To estimate the best fitting parameters, we formulated the following optimization problem:

$$\min \sum_{i=1}^{n} [V_{crawl,i} - B_i^a (k_2 f_i^2 + k_1 f_i + k_0)]^2, \quad (S9.2)$$

where the subscript i represents the corresponding $i^{th}$ data point in the plots of FIG. S31 and FIG. S32. Numerical solutions of Eq. (S9.2) with MATLAB 2016 found the best fitting parameters to be a=0.606, $k_2$=0.005, $k_1$=0 and $k_0$=−0.009. The $V_{crawl}$ predicted for each robot using the fitted model is plotted in FIGS. S34 and S35. We remark that the applicability of this fitted crawling model is limited to soft robots that have dimensions of 185 μm≤h≤333 μm, 2.4 mm≤L≤5 mm and 0.75 mm≤w≤2 mm, crawling in a glass tunnel that has a rectangular cross-section of 0.645 mm×2.55 mm using a rotating B that has the following range of parameters: 2 mT≤B≤18 mT and 20 Hz≤f≤140 Hz.

S10—Analysis for Jellyfish-Like Swimming

We discuss the jellyfish-like swimming by first specifying typical required sequences of B to enable this locomotion (section S10A) and then describing our experimental results for seven robots of different dimensions (section S10B). Deriving a comprehensive analytical model for such complex swimming gait (Re>1) is an open quest[14] and is beyond the scope of this paper. Therefore, here we provide a fitting model that can approximate the observed swimming speed of our robots (section S10C).

A. Experiment Details

To perform the jellyfish-like swimming locomotion for the original robot shown in FIG. 20a, we used the sequences of B given in FIG. S36a in the XY plane, where the maximum B, $B_{max}$=17 mT and f=25 Hz. Theoretically, B should oscillate along α=135° (equivalently to α=315°) to create similar 'C'-shape and 'V'-shape configurations that are shown in FIG. 19b. Due to fabrication uncertainty, FIG. S36b however shows that the robot can perform this locomotion when B is oscillating along the direction α=105° and α=285°. We have therefore calibrated the applied B for this specific robot in our experiments.

To characterize the jellyfish-like swimming, six additional robots with different L, w or h compared to the original robot were also fabricated. Like the jumping locomotion described in SI section S4, the characterization here is done with robots that have $\beta_R$=−90°, instead of $\beta_R$=45° as this allows us to simplify our setup to become a pair of Helmholtz coil. Using these experimental conditions, the robot can generate a jellyfish-like swimming locomotion when we prescribed a B sequence that has time-varying magnitude along the Y-axis of the global reference system. Mathematically, B can then be simply expressed as B=[0 B 0]$^T$.

Using these robots, we have conducted two types of experiments to evaluate respectively 1) the jellyfish-like swimming speed of the robots, $V_{jf}$ versus f (from 20 Hz to 40 Hz) with $B_{max}$ fixed at 20 mT, and 2) $V_{jf}$ versus $B_{max}$ (from 20 mT to 40 mT) with f fixed at 20 Hz.

B. Discussion

The prescribed B sequence (FIG. S36a) is meant to make the robot implement a slow recovery stroke where the robot changes from its 'C'-shape to 'V'-shape configuration (0 ms-19.5 ms in FIG. 20a) and a fast power stroke (19.5 ms-32 ms in FIG. 20a), which makes the robot change back to its 'C'-shape configuration again. Based on the FIG. S38 and S39, this swimming gait has Reynolds number that ranges from 74 to 190 for the original robot described in main text, and from 39 to 421 for all the robots tested in the SI. This gait resembles that of an actual jellyfish swimming, e.g., as presented in According to that study, part of the remarkable efficiency of jellyfish swimming is to be attributed to exploiting the vortex rings produced by the sequence of power and recovery strokes. We evidenced in FIG. S37 the generation of fluid vortices in the wake of our robots' jellyfish-like swimming locomotion by using 45 μm diameter polystyrene tracer microspheres (Polysciences, Inc).

Dependency of the experimental $V_{jf}$ on f is shown in FIG. S38, where the three sub-figures allow to better identify trends of the robots' swimming speed as we change their dimensions. As shown, except for the robot with L=4.35 mm (FIG. S38b) and w=2 mm (FIG. S37c), $V_{jf}$ peaks within 30 Hz≤f≤40 Hz and starts to decay afterwards. Indeed, for f>40 Hz, the robots are observed to become unable to fully complete their recovery and power strokes within each period.

Dependency of the experimental $V_{jf}$ on $B_{max}$ is shown in FIG. S39. In general, we observe that the robots swim faster as we increase $B_{max}$. However, $V_{jf}$ of more compliant robots start to decrease when $B_{max}$ exceeds a robot-specific threshold value. For example, the robot with h=108 μm starts to swim slower after $B_{max}$ exceeds 25 mT (FIG. S39a). This arguably happens because once $B_{max}$>25 mT the speed of the robot's recovery stroke becomes so fast that the robot is observed to produce significant downward motion. Such retarding effect is also observed in other robots, such as the robot with h=142 μm in FIG. S39a and the robot with L=5 mm in FIG. S39b.

Based on the experimental data shown in FIG. S38 and S39, we observe that more compliant robots (i.e., larger L, smaller h) swim faster for $B_{max}$<30 mT. This is expected, since these robots can create larger power strokes compared to their stiffer counterparts when subjected to the same $B_{max}$. Based on FIG. S38c and S39c, w only affects the dependency of $V_{jf}$ on f but not on $B_{max}$. Based on FIG. S38c, robots with larger w generally have a relatively lower $V_{jf}$ as we increase f.

C. Fitting Model

The observations presented above suggest that we can fit polynomial functions for both f and $B_{max}$. Moreover, as robots with different dimensions have peak speeds for different values of f and $B_{max}$, the coefficients of the polynomial functions need be a function of h, L and w. In view of these observations, we propose the following fitting model:

$$V_{jf} = \left[\sum_{i=0}^{2} k_i h^{a_i} L^{b_i} B_{max}^i\right]\left[\sum_{j=0}^{3} k_{3+j} h^{a_{3+j}} L^{b_{3+j}} w^{c_j} f^j\right], \quad (S10.1)$$

where $k_i$, $a_i$, $b_i$, and $c_i$ are the fitting parameters. To estimate the best fitting parameters, we formulate the following optimization problem:

$$\min \sum_{k=1}^{n} \left[ V_{jf,k} - \left[ \sum_{i=0}^{2} k_i h^{a_i} L^{b_i} B_{max,k}^i \right] \left[ \sum_{j=0}^{3} k_{3+j} h^{a_{3+j}} L^{b_{3+j}} w^{c_j} f_k^j \right] \right]^2, \quad (S10.2)$$

where the subscript k represents the corresponding $k^{th}$ data point in the plots presented in FIG. S38 and FIG. S39. By solving Eq. (S10.2) numerically with MATLAB 2016, we present the obtained fitting parameters in Table S3. The fitting model in Eq. (S10.1) shows that the relationship between $V_{jf}$ and the robot's dimensions is highly nonlinear.

The values of $V_{jf}$ predicted for each robot by the fitted model are shown in FIG. S40 and FIG. S41. We remark that the applicability of this fitted swimming model is for soft robots that have dimensions of 108 µm≤h≤185 µm, 3.7 mm≤L≤5 mm and 1.5 mm≤w≤2.5 mm, using a sequence of B that has the following range of parameters: 20 mT≤$B_{max}$≤40 mT and 20 Hz≤f≤40 Hz.

S11—Transition Modes

A. Immersion

Driven by the B sequence shown in FIG. S42a in the XY plane, the immersion shown in FIG. 20d is realized by the following steps:
1. The initial B (δ=20 mT, α=90°) is imposed to curl the robot downward (32 ms in FIG. 2d).
2. The robot rotates counterclockwise to reduce body contact with the water/air interface to a minimum (41 ms in FIG. 20d), leaving a single end of the robot pinned to the water surface.
3. A quick 180° flipping of the external B disengages the pinned end of the robot from the water surface (66 ms in FIG. 20d, corresponding to 0.86 time unit in FIG. S42). Consequently, the robot, denser than water, sinks.

We remark that for our robots, with main dimension L≈$L_C$, the Bond number Bo=$\rho g L^2/\gamma$=$(L/L_C)^2$≈1, therefore the magnitude of surface tension effects cannot be neglected compared to gravitational ones. Immersion in the liquid bulk requires that the robots break the surface tension of water. The minimum force $F_{im}$ necessary to break the contact between a single robot end and the water/air interface (as for the robot configuration in FIG. 3b) is of the order of γp, where p=2(w+h) is the perimeter of the cross-section of the robot and γ=72 mN·m$^{-1}$ is the surface tension of pure water at room temperature. In the case of the original robot, $F_{im}$≈243□243 he surface tension of pure water at room temperature. In tB in step 3 above.

B. Landing

Driven by the B sequence shown in FIG. S43 in XY plane, the transition from the top of the water meniscus to the adjacent platform shown in FIG. 20c is realized by the following steps:
1. The initial B (B=11.7 mT, α=270°) is imposed to curl the robot (2.8 s in FIG. 20c, 0 time unit in FIG. S43a). During this motion, water can easily dewet the robot surface (see next subsection).
2. Subsequently the B starts to rotate clockwise. The B magnitude decreases to 4.7 mT at the 0.26 time unit in FIG. S43a since most of the robot has peeled away from the water surface and a large B is no longer necessary.

Here we want to highlight that, due to residual strain energy caused by fabrication uncertainty (section S1D), this specific robot in FIG. 20c can perform rigid body rotation even when B ceases to be 4.7 mT. We have therefore calibrated the applied B for this specific robot in our experiments.

C. Effect of Robot's Surface Properties

The native elastomer surface of the robot is hydrophobic and microscopically rough (SI section S1B). The low wettability of the robot surface, and particularly the high receding water contact angle (~78°, see SI section S1B), leaves the receding triple contact lines free to move during the rotation of the robot. Hence, the robot can easily peel away from the water surface to stand on the adjacent solid substrate (FIG. 20c).

Surface hydrophobicity also enhances the pinning of the robot at the water/air interface, because it extends the angular range that can be spanned by the edge angles without displacing the position of the contact line on the robot body. In combination with its microscale roughness, surface hydrophobicity promotes the capture and adhesion of microscopic air bubbles on the robot surface upon immersion in water from air. The presence of a plastron, i.e., a sparse layer of microbubbles, is revealed by the shiny appearance of the robot underwater, caused by the light refracted at the water/air interface of the bubbles. The plastron marginally increases the water volume displaced by the submerged robot, and thus its buoyancy.

Moreover, surface hydrophobicity energetically promotes the emersion of the robot from the water bulk to the water surface, since the replacement of the elastomer/water interface with a full elastomer/air interface during emersion decreases the interfacial energy of the system. On the other hand, for the same reason, hydrophobicity also makes it harder for the robot to disengage from the water surface during immersion.

S12—Scaling Analyses Summary

A. Scaling Analysis for Robot's Physical Parameters

Here, we provide a simple scaling analysis for the robot's physical parameters. First, the magnitude of the magnetization profile for the infinitesimal elements shown in FIG. S3 scales proportionally with h and w, while the robot's mass and the magnitude of net magnetic moment, $M_{net}$, scales proportionally with h, L and w. Second, the second moment of inertia of the robot, l, has the following scale laws: l∝$h^3$ and l∝w. The parameter I will be important for describing the bending stiffness of the robot.

B. Scaling Analyses for Locomotion Modalities

Based on the modeling and experimental results discussed in SI sections S4-10, this sub-section and Table S4 will provide an overview of scaling analyses for each locomotion modality. We also suggest the operational range of f for each locomotion modality. As long as f is within this range, all of our tested robots are able to execute their desired locomotion successfully. Table S4 also includes the best performance index observed from each locomotion modality.

We remind that our analyses and discussions are intended to facilitate future studies on soft-bodied locomotion. In the future, we will also expand these analyses such that they can be used for optimizing the performance of miniature robots with multi-locomotive capabilities.

1. Jumping. Performance index: maximum jumping height, $H_{max}$.
    Theoretically, $H_{max}$ is independent of w, and its relationships with L and h are highly non-linear. The theory, however, still suggests that $H_{max}$ has a positive correlation with L and a negative correlation with h.
    Experimentally, we observe that robots with larger L and thinner h can jump higher. The data do not show observable trends for w. Hence, these experimental results agree with the trend predicted by the theory.

2. Rolling. Performance index: rolling speed, $V_{roll}$.
   Theoretically, $V_{roll}$ is independent of w and h when the rolling robots have similar curvatures. By using simple approximations, we can deduce that $V_{roll} \propto L$. Experimentally, good control over rolling is achieved for all the robots when f is between 0 Hz and 4 Hz (FIG. S12). Our data also suggest that when the robots have similar curvatures, robots with larger L will roll faster. There are no observable effects for w and h. These experimental results agree with the trend predicted by the theory.

3. Walking. Performance index: walking speed, $V_{walk}$.
   Theoretically, $V_{walk}$ is independent of w and its relationship with L and h is non-linear. However, the theory does imply that $V_{walk}$ has a positive correlation with L and a negative correlation with h.
   Experimentally, good control over walking is achieved for 2 Hz≤f≤11 Hz (FIG. S17). Robots with larger L and thinner h are observed to walk faster when subjected to the same $B_{max}$ (FIG. S18). The data do not show observable trends for w. These experimental results agree with the trend predicted by the theory.

4. Meniscus climbing: Performance index: minimum required B, $B_{min}$ to reach the top of the meniscus.
   Theoretically, $B_{min} \propto \propto L^{-3}, h^3$. The current model does not account for the effects of w.
   Experimentally, all the tested robots can climb to the top of the water meniscus shown in FIG. S20 for $B_{min}$>6 mT (FIG. S23). Robots with a larger L and thinner h require a smaller $B_{min}$ to ascend to the top. These experimental results agree with the trend predicted by the theory.

5. Undulating swimming: Performance index: swimming speed, $V_{swim}$.
   Theoretically, we have: 1) when $f < \omega_{n,2}$, $V_{swim} \propto L^5, h^{-4}$; 2) when $f > \omega_{n,2}$, $V_{swim} \propto L^{-3}$. As the robotic system is a low-pass system, we will consider only the first condition (i.e., when $f < \omega_{n,2}$) for the scaling analysis. $V_{swim}$ is always independent of w.
   Experimentally, all the tested robots can swim successfully when f is between 40 Hz and 160 Hz (FIG. S28). Robots with larger L and thicker h can swim faster (FIG. S29). The experimental data do not show observable trends for w. There exists a discrepancy between the experimental and theoretical scaling for h.

6. Crawling: Performance index: crawling speed $V_{crawl}$.
   Experimentally, good control over crawling is achieved for 20 Hz≤f≤40 Hz (FIGS. S31). The data suggests that $V_{crawl}$ has no observable dependency on L, w, and h.
   Based on the experiment data, the fitting model suggests that $V_{crawl}$ is independent of w, L, and h.

7. Jellyfish-like swimming: Performance index: swimming speed V.
   Experimentally, all the tested robots can swim successfully for 30 Hz≤f≤40 Hz (FIGS. S38). It is observed that $V_{jf}$ may peak at certain $B_{max}$ (FIG. S39), which depends on specific robot design. After exceeding this $B_{max}$, the robots may produce very fast recovery strokes that reduce $V_{jf}$. Before reaching this $B_{max}$, we observe that robots with larger L and thinner h swim faster. The dimension w only affects the dependency of $V_{jf}$ on f, but not on B: robots with larger w generally have a relatively lower $V_{jf}$ as we increase f.

Based on the experimental data, the fitting model suggests that the $V_{jf}$ has a highly non-linear relationship with L, h, and w. The values for the fitting parameters are provided in Table S3.

In the dimension range we have investigated, our theoretical and fitting models predict that a larger L and a smaller h are always preferred for multimodal locomotion as it can help the robot to move faster and jump higher. The models also suggest that w will only affect the jellyfish-like swimming locomotion and minimizing w can help to increase this swimming speed.

C. Upper and Lower Bounds for L, w, and h

Based on our models discussed above, the robot may not be able to fulfill all modes of locomotion if its L is too small, or when its h and w are too large. In addition, the upper bound of L, w, and h is typically constrained by the size requirements of specific applications as well as the maximum allowable workspace of the electromagnetic coil setup that generates the spatially uniform B. The lower bound of h and w is set by our current fabrication limits where we could only demold robots with h>40 μm and w>0.3 mm repeatedly. The lower bound of L is 1 mm because it is very challenging to manually wrap sub-millimeter beams onto the circular jigs, shown in FIG. S1a, during the magnetization process.

S13—Multimodal Locomotion

Here, we describe the procedures to implement the robot's multimodal locomotion shown in FIG. 3. In FIG. 3a-d, the environment is composed of laser-milled, poly(methyl methacrylate) platforms. The platform is treated with oxygen-plasma and has a water contact angle<10°. The platform is encased in a Plexiglas box (52 mm×32 mm×25 mm). The liquid in this environment is de-ionized water.

In FIG. 3a, the robot first uses the rolling locomotion to fall onto the water surface. After dipping into water, the robot drifts slightly away from the platform along the meniscus and starts swimming after it has stabilized. A clockwise B (B=3 mT, 25 Hz) is applied to let the robot swim rightwards. In FIG. 3b, the robot sequentially bends downwards on the water surface and rotates counterclockwise to sink into the water, and subsequently it uses the jellyfish-like locomotion to swim back to the water surface in FIG. 3c.

FIG. 3d shows the robot using four locomotion modes to navigate through liquid and solid surfaces. After climbing onto the solid substrate, the robot uses the directional jumping strategy to overcome the otherwise unsurmountable obstacle. By exploiting the robot's net magnetic moment, we rotate the robot to its required initial pose for implementing the directional jumping. Once the robot has jumped across this obstacle, it starts to walk. The robot 10 incurs slight slipping before and after jumping across the obstacle. This slipping is induced by unwanted magnetic gradient-based pulling forces generated by the spatial gradients of B, which are present because the robot has exceeded the 95% homogeneous region that can provide spatially-uniform B for the robot (see SI section S2). We also remark that this slipping generally happens when the robot has only one end in contact with the substrate. Since the friction is the smallest at this moment, even a small magnetic gradient-based pulling force can translate the robot. However, while there exists such an external disturbance for our robot, it is worth noting that the robot can still walk successfully even against the gradient after jumping over the obstacle. Moreover, since the deformed robot has a net magnetic moment, we are able to steer the robot along a desired direction even after it was disrupted by the magnetic gradient-based pulling forces (see SI section S3B).

In FIG. 3e, the robot first walks towards a glass tunnel (inner diameter: 1.62 mm), which eventually blocks its path. As the tunnel is too small for the robot to walk in it, the robot switches to its crawling locomotion by changing the magnetic field input to a rotating B. After the robot has crawled through the tunnel, it resumes its walking locomotion until it leaves the working space.

S14—Toward Biomedical Applications

A. Locomotion in a Surgical Phantom

Here we demonstrate that our robot can use a combination of meniscus climbing, landing, rolling and jumping to fully explore a surgical human stomach phantom (FIG. 21a).

The robot moves back to the starting point very quickly, because it is pulled by unwanted magnetic gradient-based pulling forces generated by the spatial gradients of B, which are present because the robot is outside the region that can provide spatially-uniform B (see SI section S2). While there exists such an external disturbance for our robot, it is worth noting that the robot can still roll successfully under such conditions.

B. Ultrasound-Guided Locomotion

Here we demonstrate that our robot has the potential to be integrated with biomedical imaging systems towards realizing potential in-situ applications like minimally invasive surgery. In particular, we demonstrate ultrasound-guided locomotion (FIG. 21b, FIG. S44). For the experiments, we have used three different biological phantoms to mimic biomedical landscapes, i.e., a water reservoir, tunnels and gaps. We inserted the ultrasonic scanning head of the system (Fujifilm, Vevo3100 Imaging System) from the top of our magnetic setup and put it in contact with the phantoms through a thin layer of ultrasonic gel. The ultrasound system was found able to track the position of our robots while they were performing jellyfish-like swimming, crawling, and rolling within the narrow spaces concealed by chicken muscle tissue. This allowed us to image and track the robots as they navigated in the phantoms. We were able to produce clear images of the robots while having no disruptions to our actuation system.

We also report that while the technicians who worked with us on the ultrasonic setup can easily detect the motions of the robot from the ultrasound images, it is possible to develop imaging algorithms to automate this process in the future.

C. Cargo Delivery

The design of the modified robot, presented in FIG. 21d, for selective, magnetically-triggered drug release, presented is shown in FIG. 18. An extra strap is added to the original robot body. For clarity, we only mark out the $m_y$ component of the strap's magnetization profile, as it is the dominant and functional component in releasing the drug. During locomotion, the cargo is mechanically bound on the robot by inserting the strap head into a hole on the robot's body. When a large B along the y-axis, $B_y$ (~19 mT), is applied, the magnetic torque bends and unlocks the strap to release the cargo. Due to the restriction of the hole, a smaller $B_y$ (<18 mT in our case) is not strong enough to open the strap and hence this could allow us to preserve our locomotion modes.

S15—Spatial Gradient of B

By creating a spatially non-uniform B, we can exert magnetic forces on miniature devices that have a net magnetic moment $M_{net}$. The mathematical description for these applied forces can be expressed as:

$$F = (M_{net} \cdot \nabla) B. \tag{S15.1}$$

The method that uses the spatial gradients of B to translate the miniature robots is typically known as magnetic gradient-based pulling or gradient pulling[1,5]. As our robots can possess an effective $M_{net}$ when they deform, we can also use the spatial gradients of B to exert magnetic gradient-based pulling on the robots such that their locomotion capabilities can be enhanced. For instance, we can use magnetic gradient-based pulling to modulate the robot's jump height for the jumping locomotion.

Theoretically, magnetic gradient-based pulling may also levitate a magnetic robot and make it traverse across different terrains and obstacles. However, this approach is not practical as the dynamics of this actuation mode is inherently unstable, especially if the small-scale robot has to be levitated against gravity. Furthermore, Abbot et al. has shown that time-asymmetrical locomotion like the undulating swimming gait is more energy efficient than simple magnetic gradient pulling actuation methods, i.e., they produce higher propulsion forces. It is also easier to actuate miniature magnetic robots using B than its spatial gradients when their distance from the external electromagnets increases. As many biomedical applications require the external electromagnets to be placed outside of the human body, the considerable distance between the electromagnets and the proposed robots would make magnetic gradient-based pulling methods less appealing.

Supporting Figures Also Appended to the Application

FIG. 22. Magnetization process of the soft magneto-elastic robot, the experimental results for the magnetization magnitude and Young's modulus of similar magnetic elastomers with differing mass ratios, and the experiment for showing different rest state residual curvatures. (a) Sketch of the elastomeric beam, loaded with NdFeB microparticles, wrapped around a cylindrical glass rod (perimeter: 3.7 mm) and magnetized by a uniform 1.65 T magnetic field B produced by a vibrating sample magnetometer (VSM). The relative orientation $\beta_R$ determines the phase shift in the resulting magnetization profile. (b) The programmed magnetization profile in the unwrapped robot body in its local xyz frame ($\beta_R=45°$). (c) Experimental values of the magnetization magnitude for soft magnetic materials with different mass ratios. (d) Experimental values of E for soft magnetic materials with different mass ratios. The mass ratio is defined as the ratio of mass of NdFeB particles to the mass of Ecoflex-10, e.g., 0.25:1, 0.5:1, and we normalize these ratios such that it is always one part on the Ecoflex-10 side. Each data point in (c) and (d) was evaluated with three samples (n=3). (e) The robot has two rest state residual curvatures (shown in III, V), which can be alternated via shape change. The five shapes of the robot are achieved sequentially by subjecting the robot to the B field sequence specified below the snapshots.

Figure 23:
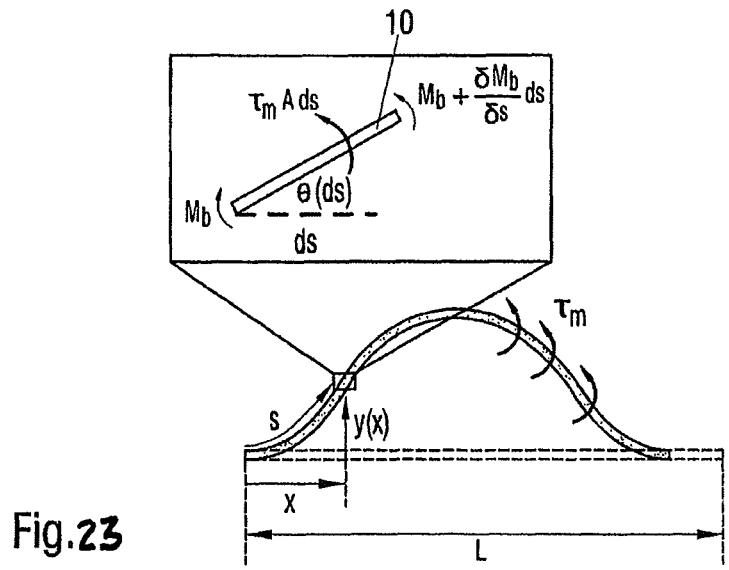

FIG. 23. Quasi-static analysis of the soft robot. Sketch of the geometry is not to scale for representation purposes. The bending moment acting on an infinitesimal element of the robot under steady-state deformation is shown in the inset.

Figure 24:
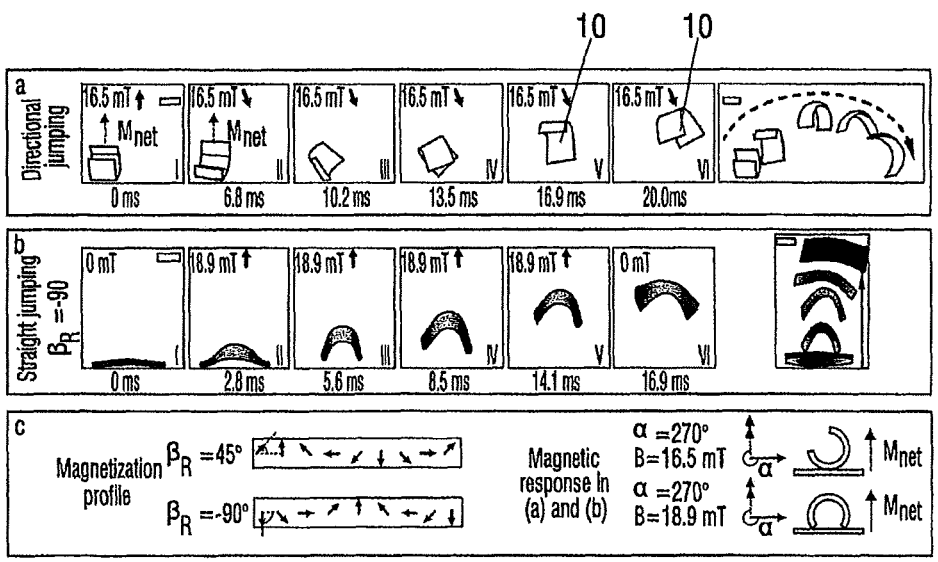

FIG. 24. Soft robots implementing jumping locomotion. (a) Directional jumping by a soft robot with $\beta_R=45°$ (also shown in FIG. 20h). (b) Straight jumping by a soft robot with $\beta_R=-90°$. The magnetization profiles of the robots shown in (a,b) and their corresponding responses to the applied field are sketched in (c). Scale bars: 1 mm.

Figure 25:
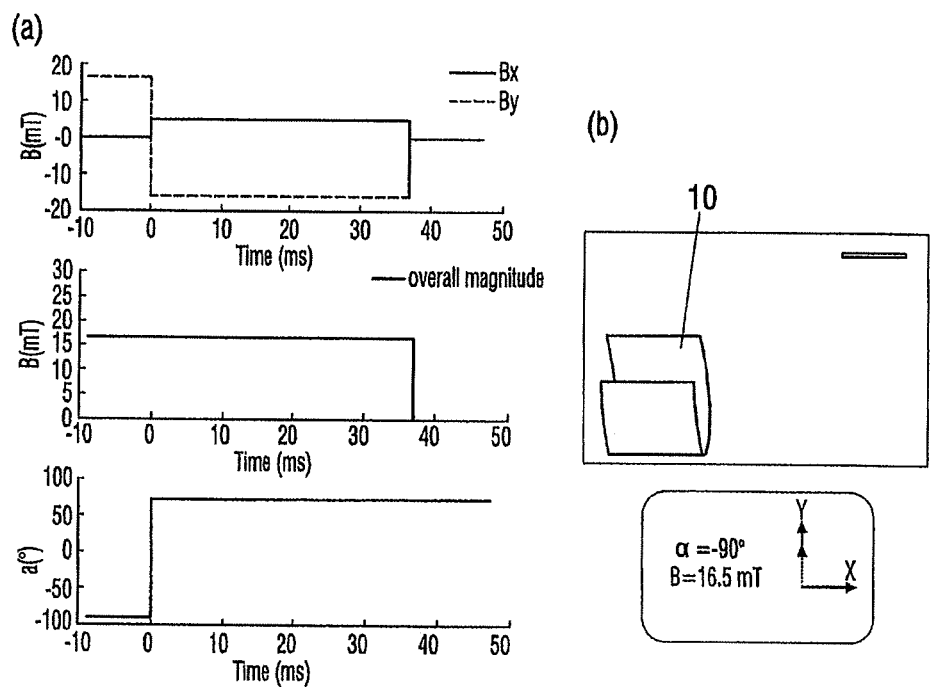

FIG. 25. The required B for the directional jumping locomotion. (a) Time sequence of B. $B_x$ and $B_y$ represent the magnitude of B projected along the X- and Y-axis of the global coordinate system. (b) shows the initial shape of the soft robot before it jumps ($\square_R$=45° and reproduced from FIG. 20h). Scale bar: 1 mm.

Figure 26:
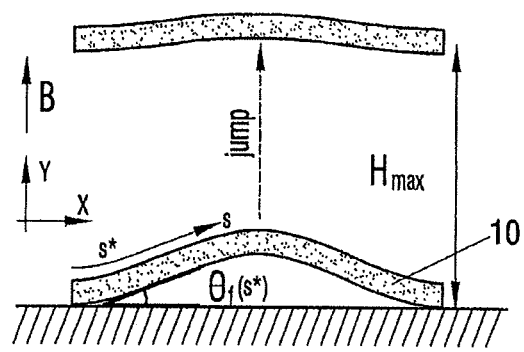

FIG. 26. Sketch for the analysis of the straight jumping locomotion (not to scale).

Figure 27:
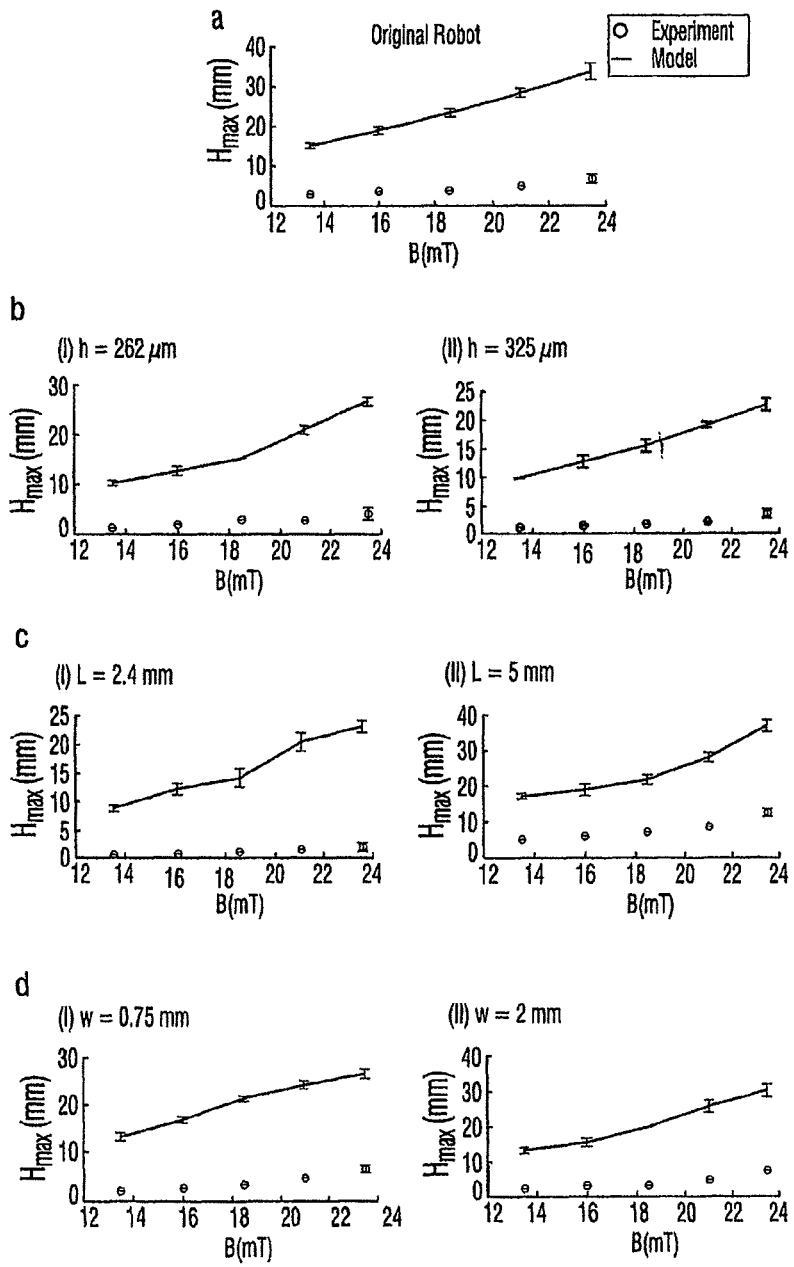

FIG. 27. Experimental and model-predicted results for Hmax in the straight jumping locomotion. (a) Results for the original robot (dimensions defined in FIG. 19a). (b) Results for robots that have a different h from the original robot. (c) Results for robots that have a different L from the original robot. (d) Results for robots that have a different w from the original robot. Each experimental data point presents the mean and standard deviation of three trials. Error bars in model-predicted values reflect the dispersion in image analysis (n=3).

Figure 28:
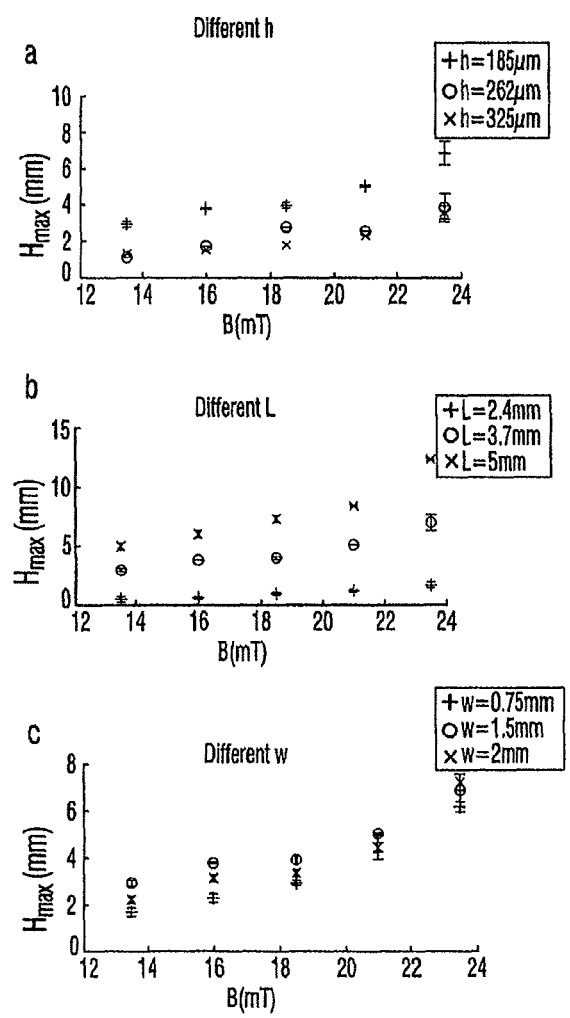

FIG. 28. The compiled experimental data, displaying how the robot's dimensions will affect $H_{max}$ for the straight jumping locomotion ($H_{max}$ versus B). (a) Complied experimental results for robots that have different h. (b) Complied experimental results for robots that have different L. (c) Compiled experimental results for robots that have different w. Each experimental data point presents the mean and standard deviation out of three trials.

Figure 29:
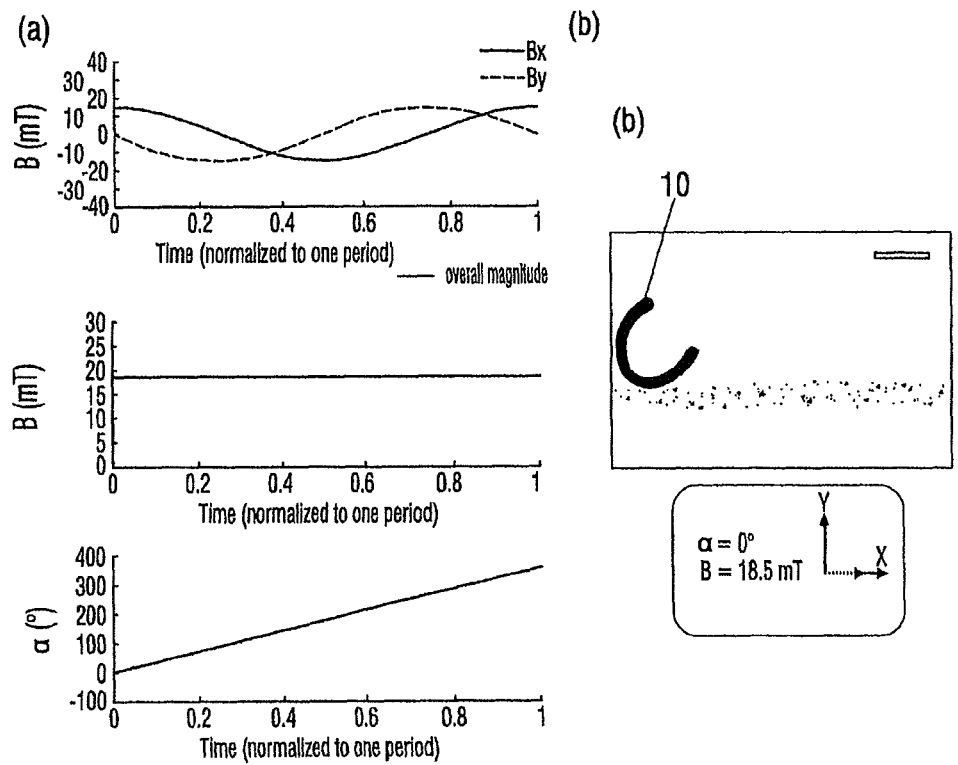

FIG. 29. The required B for the rolling locomotion. (a) Time sequence of the rotating B. $B_x$ and $B_y$ represent the magnitude of B projected along the X- and Y-axis of the global coordinate system. (b) The video snapshot shows the initial 'C-shape' configuration of the robot before it rolls (reproduced from FIG. 20e). Scale bar: 1 mm.

Figure 30:
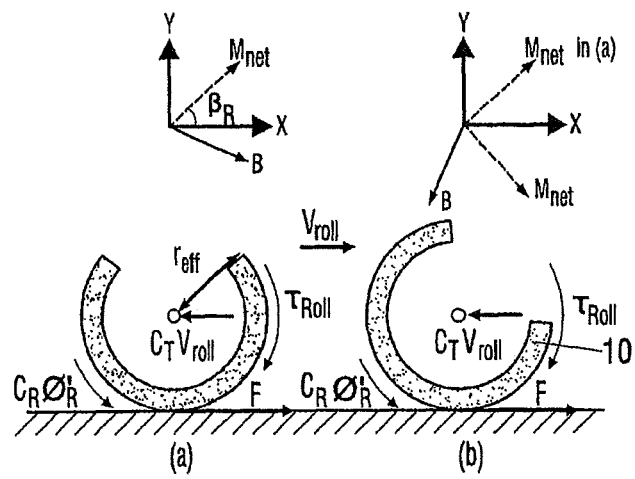

FIG. 30. Sketch for the analysis of the rolling locomotion (not to scale). The illustration shows the robot (a) before and (b) after it has rotated a rotational displacement of $\phi_R$. The center of mass is marked out by the black dot. This sketch also shows the applied forces and torques on the robot as it rolls.

Figure 31:
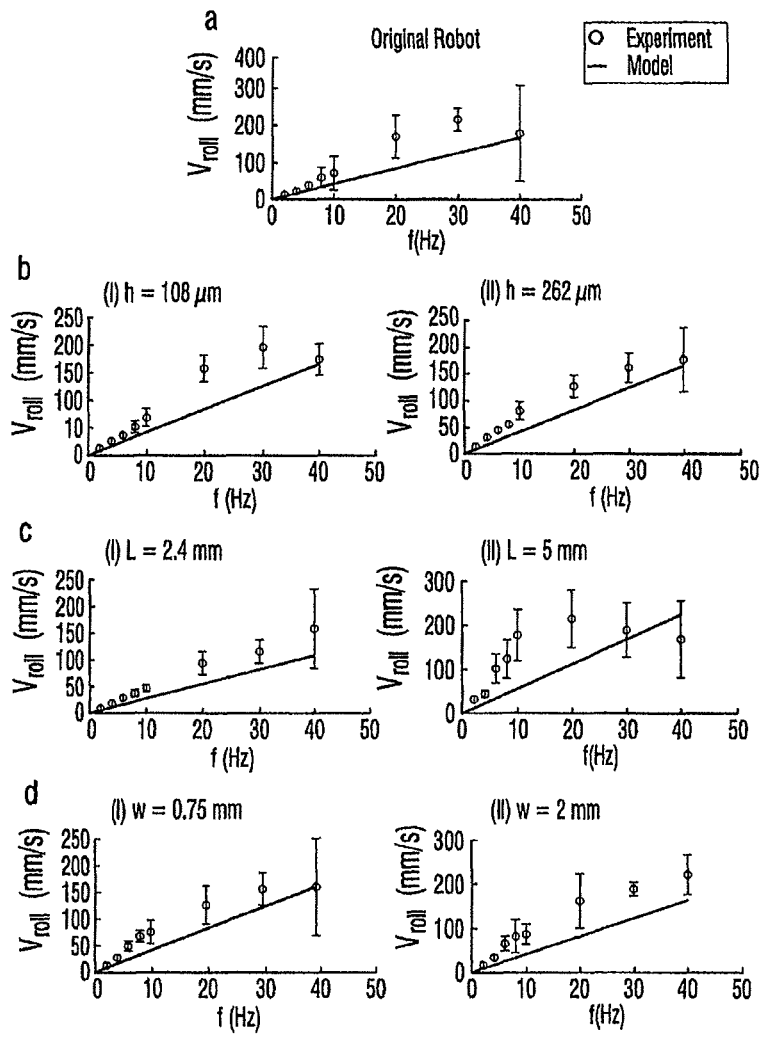

FIG. 31. Experimental and model-predicted results for the rolling locomotion ($V_{roll}$ versus f). The applied B for all the robots is adjusted in such a way that all these robots can produce a curvature similar to that of the original robot when it is subjected to B=18.5 mT. (a) Results for the original robot (defined in FIG. 19a), where the applied B=18.5 mT. (b) Results for robots that have a different h from the original robot. (I) B=6.3 mT (II) B=37 mT. (c) Results for robots that have a different L from the original robot. (I) B=44 mT (II) B=10 mT. (d) Results for robots that have a different w from the original robot. B=18.5 mT for both (I) and (II). Each experimental data point presents the mean and standard deviation out of three trials (n=3).

Figure 32:
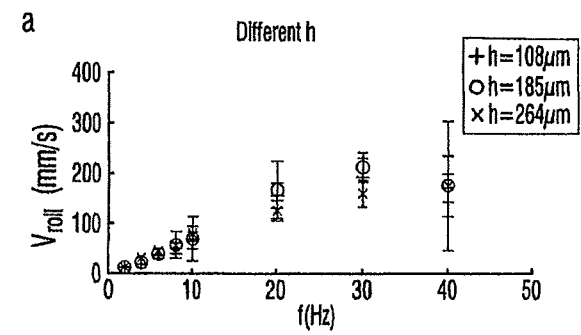
Figure 32:
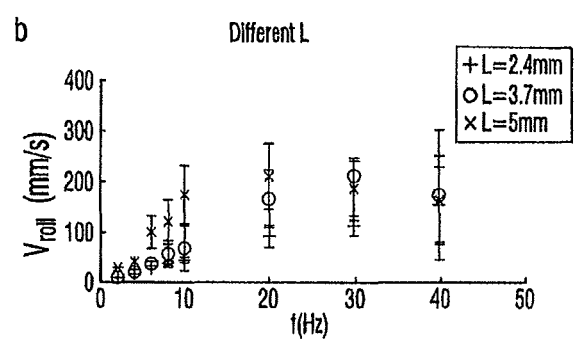
Figure 32:
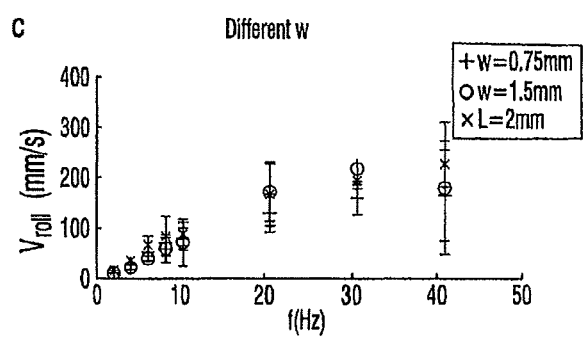

FIG. 32. The compiled experimental data, displaying how the robot's dimensions will affect $V_{roll}$ for the rolling locomotion ($V_{roll}$ versus f). B is adjusted to make all the soft robots have similar curvature as that of the original one when it is subjected to B=18.5 mT. (a) Compiled experimental results for robots that have different h. B=18.5 mT (h=185 µm), B=6.3 mT (h=108 µm). B=37 mT (h=264 µm). (b) Compiled experimental results for robots that have different L. B=18.5 mT (L=3.7 mm), B=44 mT (L=2.4 mm), B=10 mT (L=5 mm). (c) Compiled experimental results for robots that have different w. B=18.5 mT for all the three cases. Each experimental data point presents the mean and standard deviation out of three trials.

Figure 33:
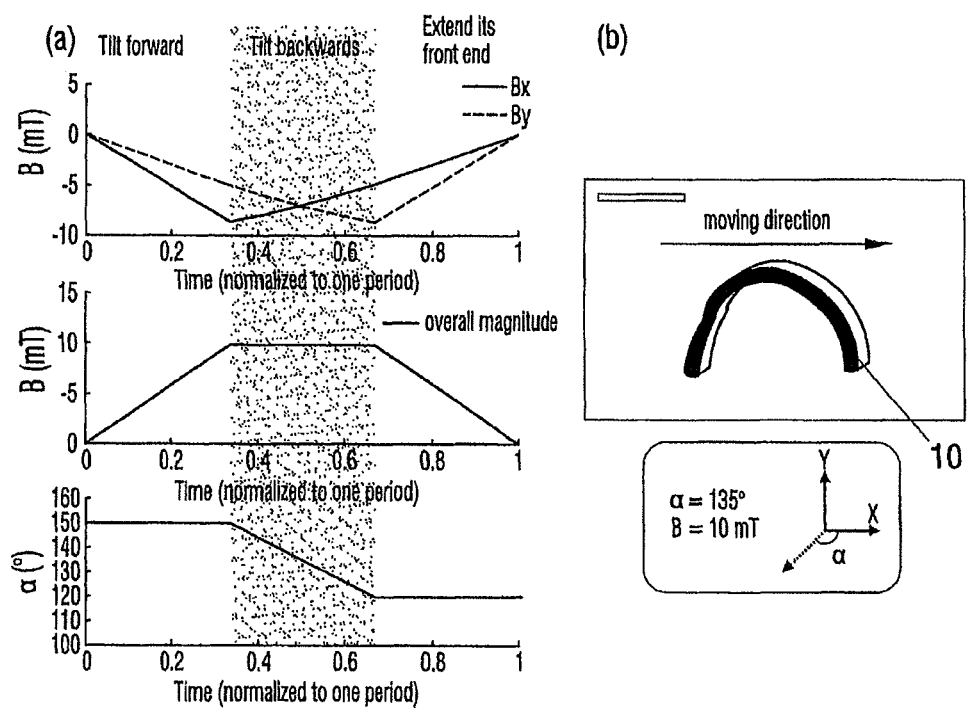

FIG. 33. The required B for the walking locomotion. (a) Time sequence of B. This sequence can be sub-divided into three phases, i.e., 1) tilt forward, 2) tilt backwards, and 3) extend its front end. $B_x$ and $B_y$ represent the magnitude of B projected along the X- and Y-axis of the global coordinate system. (b) The video snapshot shows the 'C'-shape configuration during it walks (reproduced from FIG. 20f). Scale bar: 1 mm.

Figure 34:
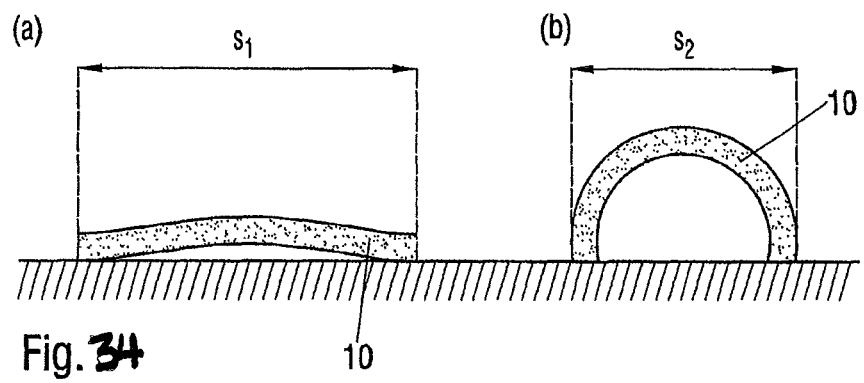

FIG. 34. (a) Stretched and (b) curled state of the robot during a walking cycle (not to scale).

Figure 35:
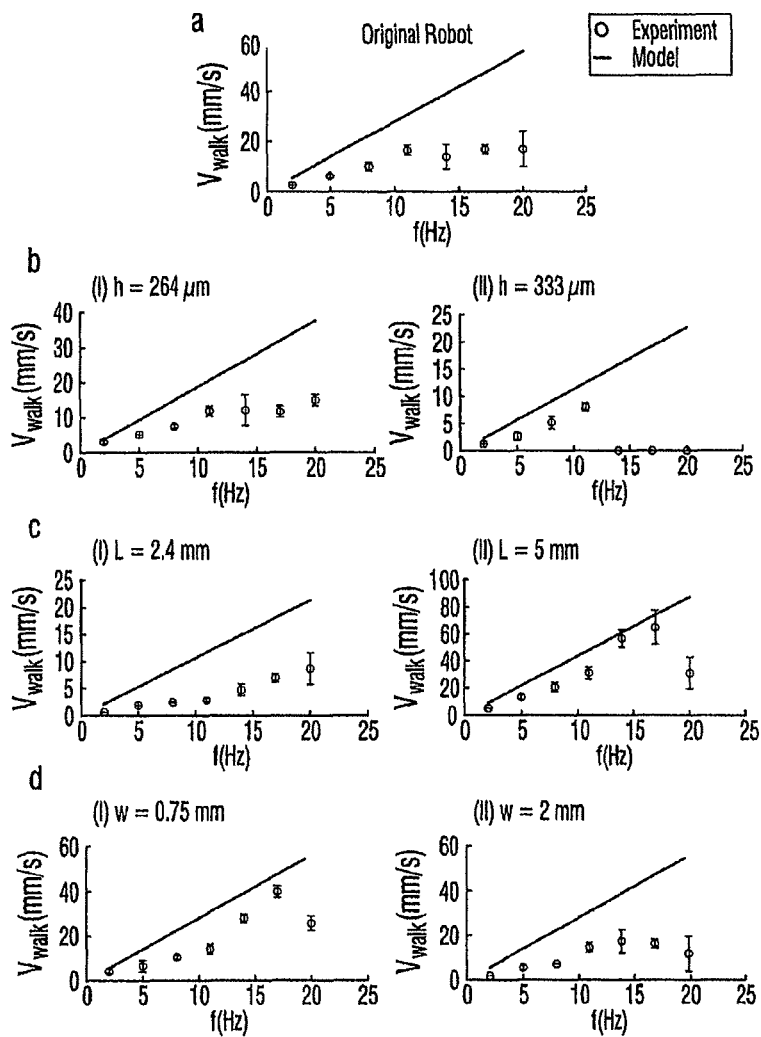

FIG. 35. Experimental and model-predicted results for the walking locomotion ($V_{walk}$ versus f while $B_{max}$ is fixed at 10 mT). (a) Results for the original robot (defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 36:
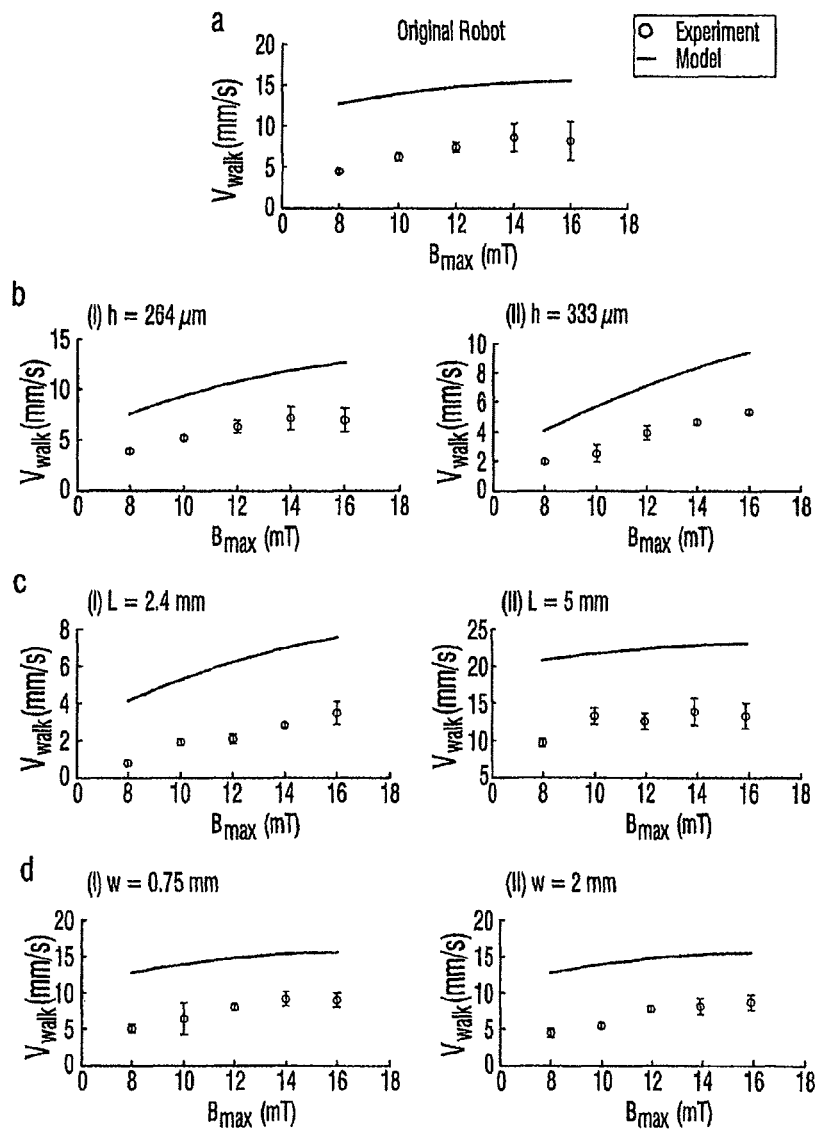

FIG. 36. Experimental and model-predicted results for the walking locomotion ($V_{walk}$ versus $B_{max}$ while f is fixed at 5 Hz). (a) Results for the original robot (defined in FIG. 19a). (b) Results for robots that have a different h from the original robot. (c) Results for robots that have a different L from the original robot. (d) Results for robots that have a different w from the original robot. Experimental data points present mean and standard deviation out of three trials (n=3).

Figure 37:
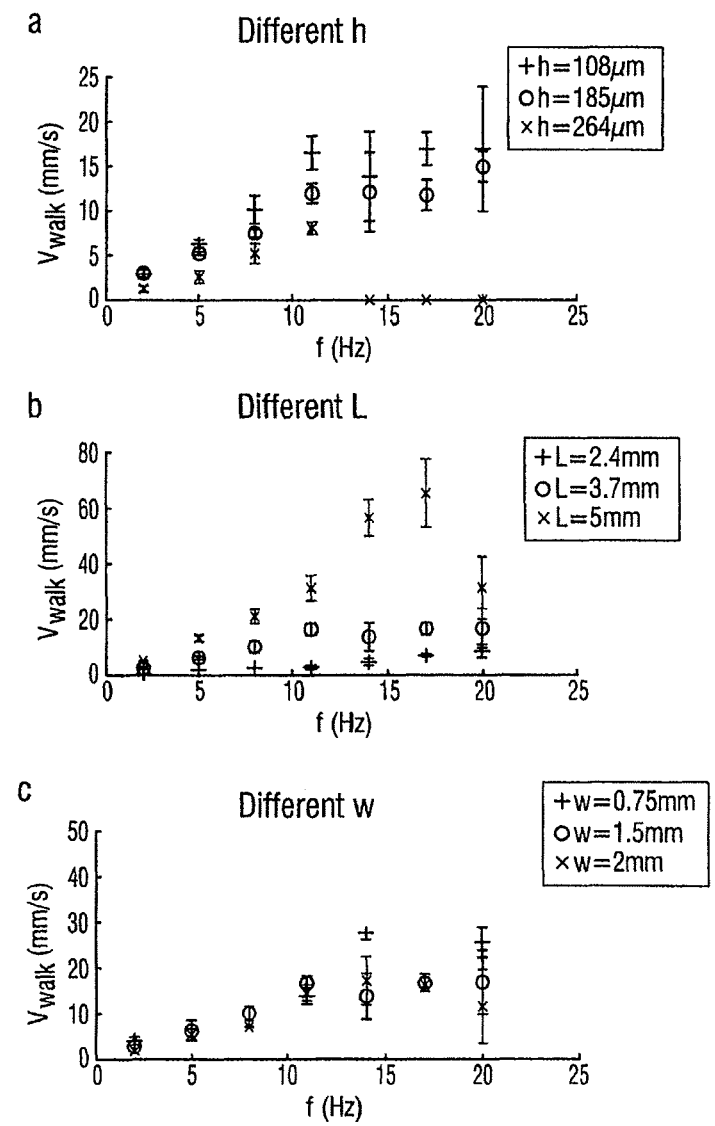

FIG. 37. The compiled experimental data, displaying how the robot's dimensions will affect $V_{walk}$ for the walking locomotion ($V_{walk}$ versus f while $B_{max}$ is fixed at 10 mT). (a) Compiled experimental results for robots that have different h. (b) Compiled experimental results for robots that have different L. (c) Compiled experimental results for robots that have different w. Each experimental data point presents the mean and standard deviation out of three trials (n=3).

Figure 38:
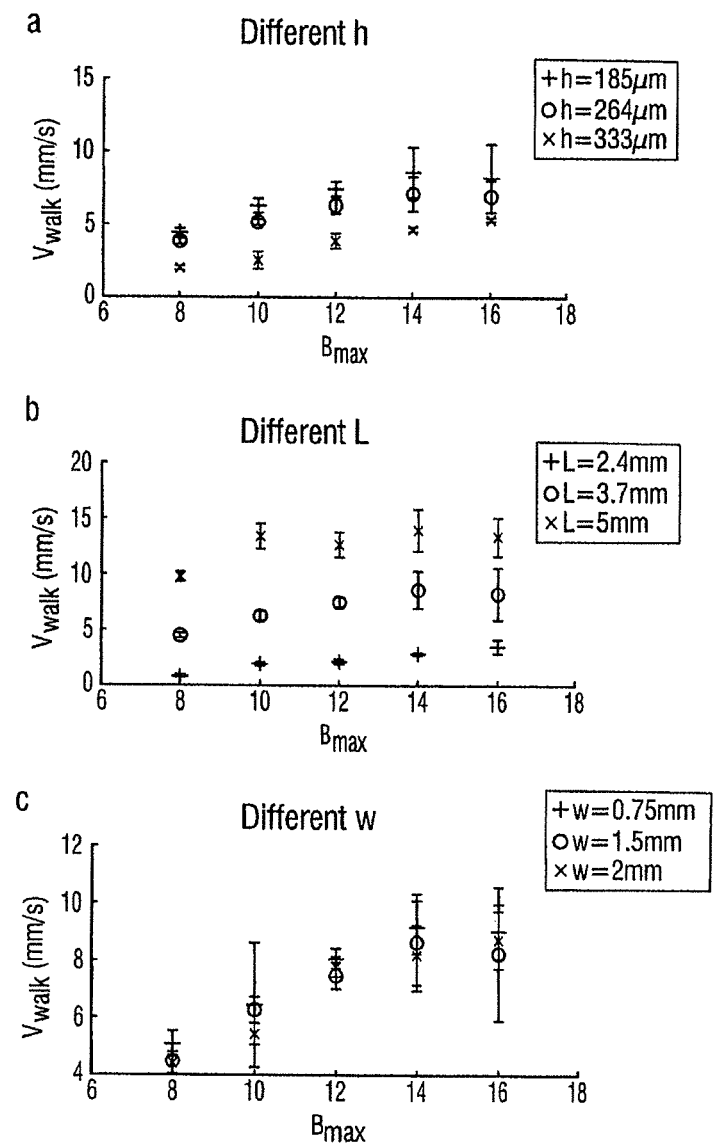

FIG. 38. The compiled experimental data, displaying how the robot's dimensions will affect $V_{walk}$ for the walking locomotion ($V_{walk}$ versus $B_{max}$ while f is fixed at 5 Hz). (a) Compiled experimental results for robots that have different h. (b) Compiled experimental results for robots that have different L. (c) Compiled experimental results for robots that have different w. Each experimental data point presents the mean and standard deviation out of three trials (n=3).

Figure 39:
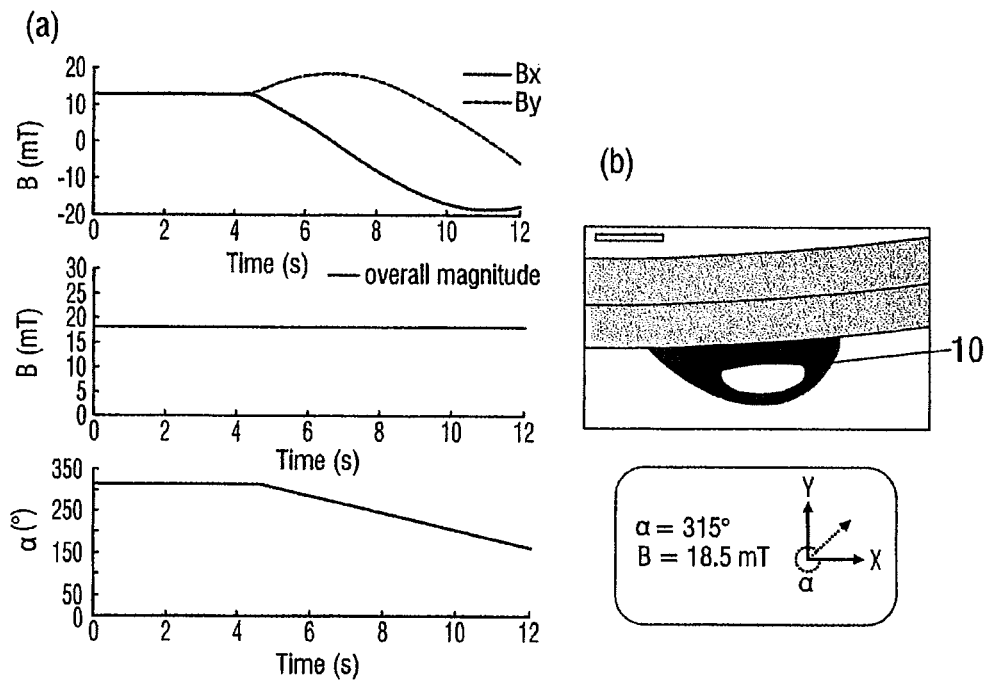

FIG. 39. The required B for the meniscus climbing locomotion. (a) Time sequence of B. $B_x$ and $B_y$ represent the magnitude of the B projected along the X- and Y-axis of the global coordinate system. (b) The video snapshot shows that the robot in a 'C'-shape configuration (for B with $\square$=315°) displaces water from the water-air interface, as evidenced by the air engulfed within its body, while remaining pinned to the water surface. Scale bar: 1 mm.

Figure 40:
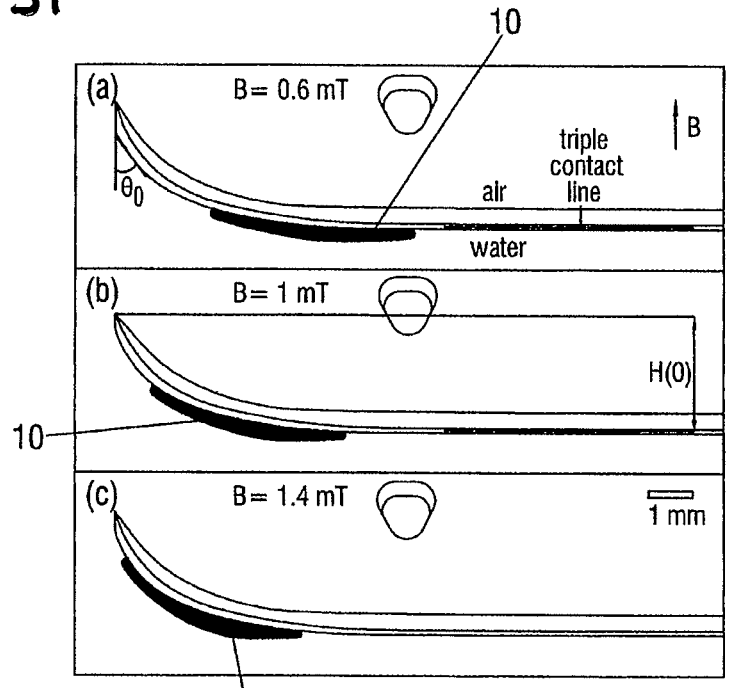

FIG. 40. Meniscus climbing by a magnetic soft robot that has an L of 5 mm. The sequential snapshots show side-views of selected, stable positions assumed by the robot along a positive water meniscus for increasing values of body curvature induced by the external B. The robot is fully immersed in water, its shape conforms to the local interface profile, and the perimeter of its top surface is pinned at the water-air interface.

Figure 41:
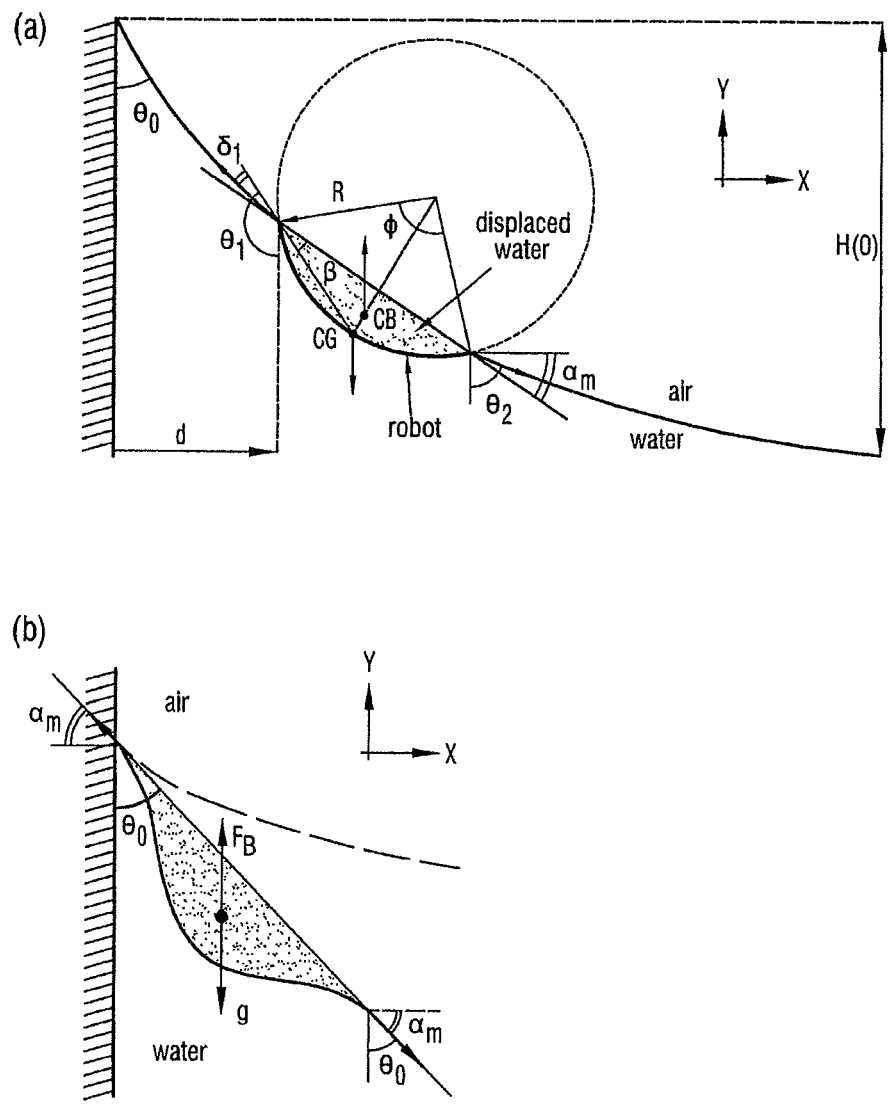

FIG. 41. Sketches of the geometries for the meniscus-climbing models. a) Geometry for the arc-shaped meniscus-climbing model. CG and CB represent respectively the center of gravity of the immersed robot and the center of buoyancy of the displaced water volume. b) Geometry for the cosine-shaped meniscus-climbing model. The model specifically describes the soft robot in close proximity of the adjacent wall at the top of the positive water meniscus, and assumes coincidence of gravity and buoyancy centers. The sketches are not to scale for illustration purposes.

Figure 42:
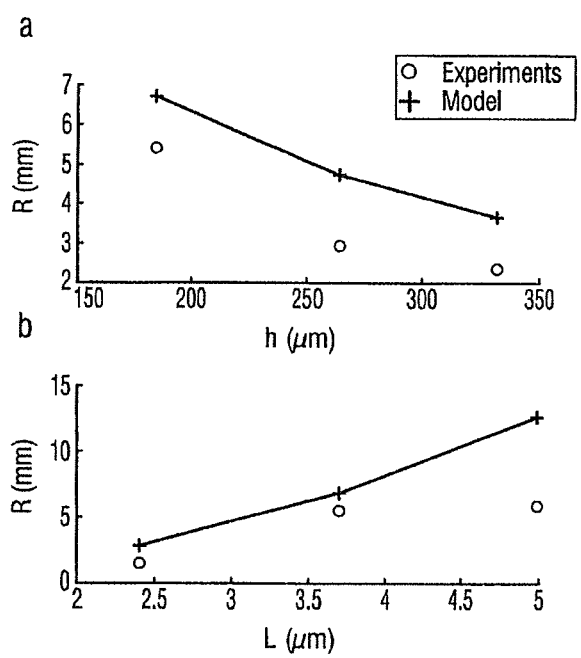

FIG. 42. Results for the meniscus-climbing locomotion (robot curvature versus robot dimensions). Comparison of experimental and model-predicted values of curvature radius for soft robots climbing the entire height of the water meniscus (i.e., for d→0, FIG. S21a).

Figure 43:
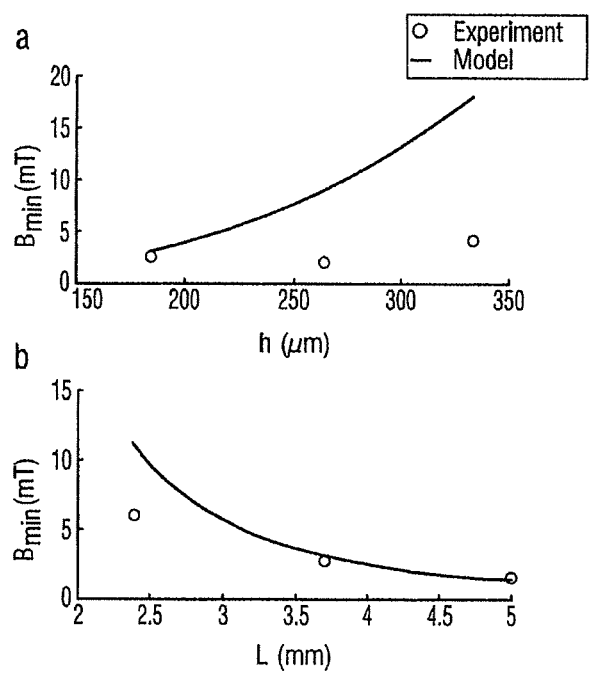

FIG. 43. Results for the meniscus-climbing locomotion ($B_{min}$ as a function of robot dimensions). Comparison of experimental and model-predicted values of $B_{min}$ required for soft robots to climb the entire height of the water meniscus (i.e., for d→0, FIG. S21a).

Figure 44:
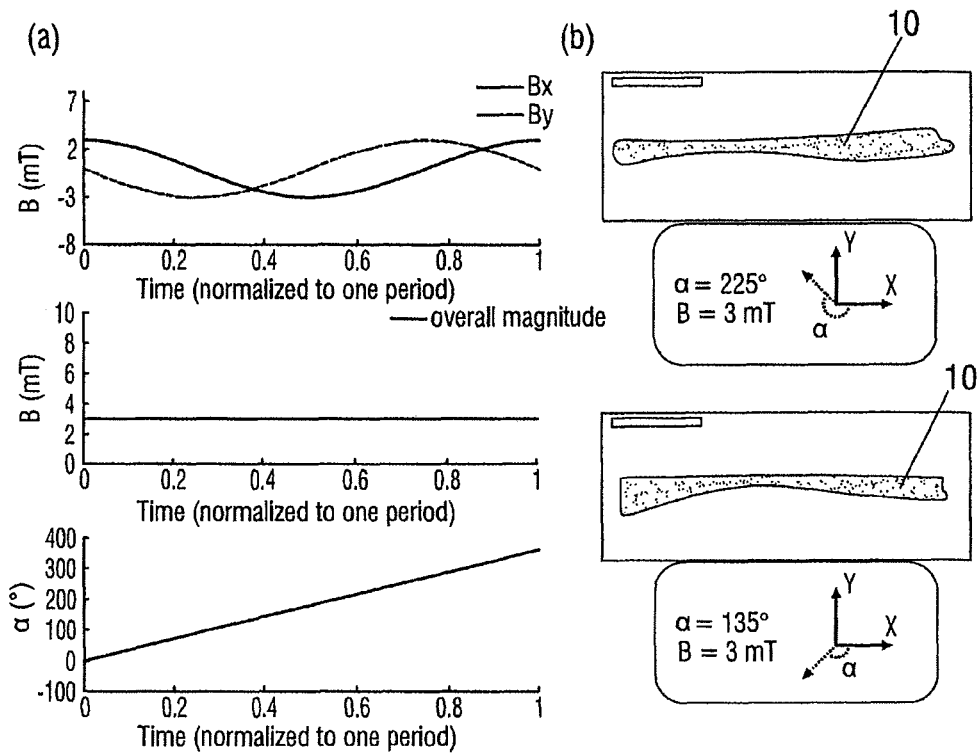

FIG. 44. The required B for the undulating swimming locomotion. (a) Time sequence of B (f=40 Hz, B=3 mT). $B_x$ and $B_y$ represent the magnitude of B projected along the X- and Y-axis of the global coordinate system. (b) The video snapshot shows the corresponding small-deformation shapes of the original robot (FIG. 19b). Scale bar: 1 mm.

Figure 45:
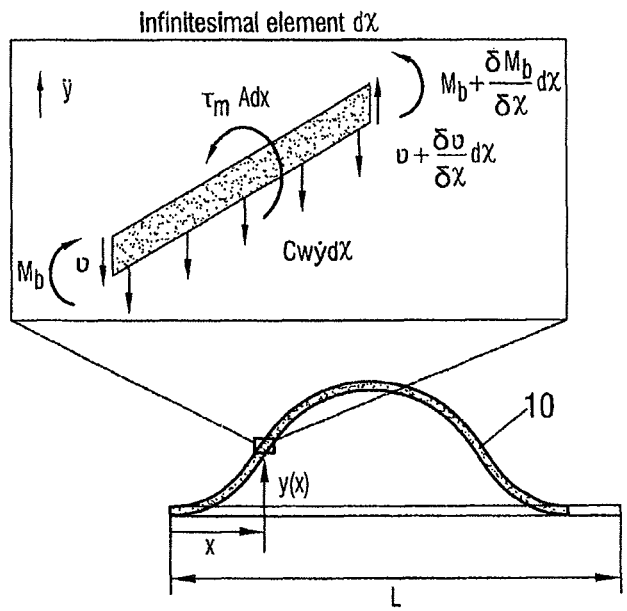

FIG. 45. Vibrational analysis of a soft robot. Sketch of the geometry highlighting forces and torques acting on an infinitesimal element of the robot (not to scale).

Figure 46:
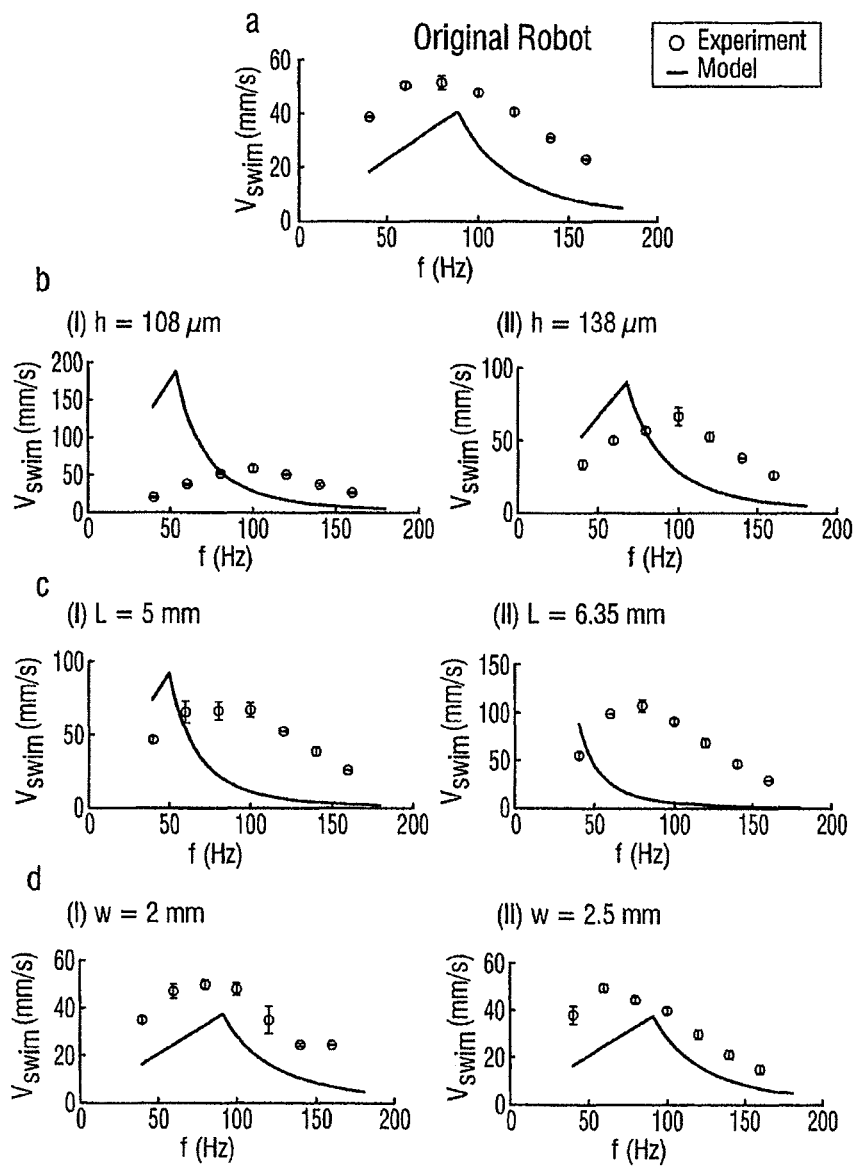

FIG. 46. Experimental and model-predicted results for the undulating swimming locomotion ($V_{swim}$ versus f while B is fixed at 5 mT). (a) Results for the original robot (defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 47:
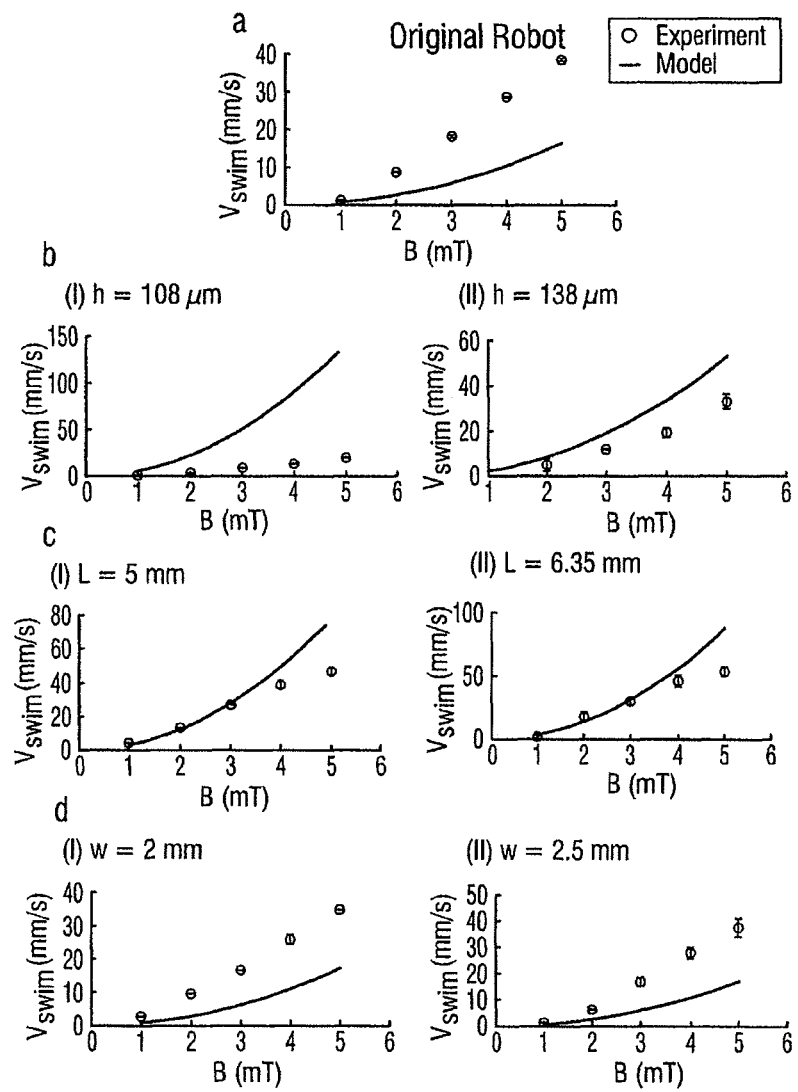

FIG. 47. Experimental and model-predicted results for the undulating swimming locomotion ($V_{swim}$ as a function of B while f is fixed at 40 Hz). (a) Results for the original robot (defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 48:
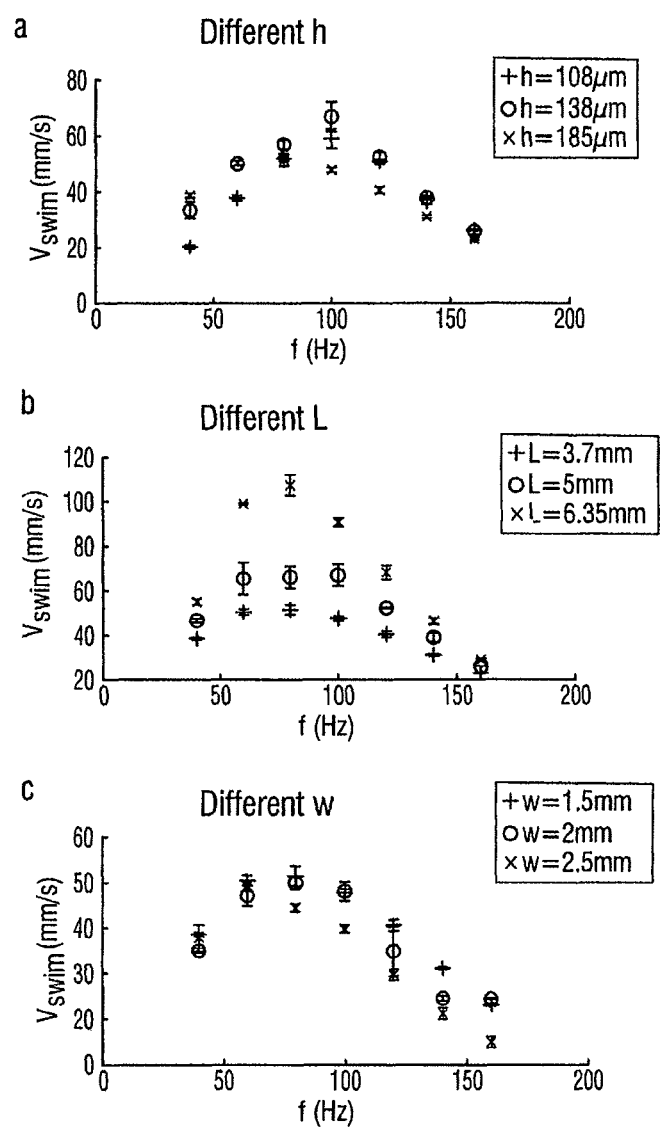

FIG. 48. The compiled experimental data, displaying how the robot's dimensions will affect $V_{swim}$ for the undulating swimming locomotion ($V_{swim}$ as a function of f while B is fixed at 5 mT). (a) Compiled experimental results for robots that have different h. (b) Results for robots that have different L. (c) Compiled experimental results for robots that have different w. Each experimental data point presents the mean and standard deviation out of three trials (n=3).

Figure 49:
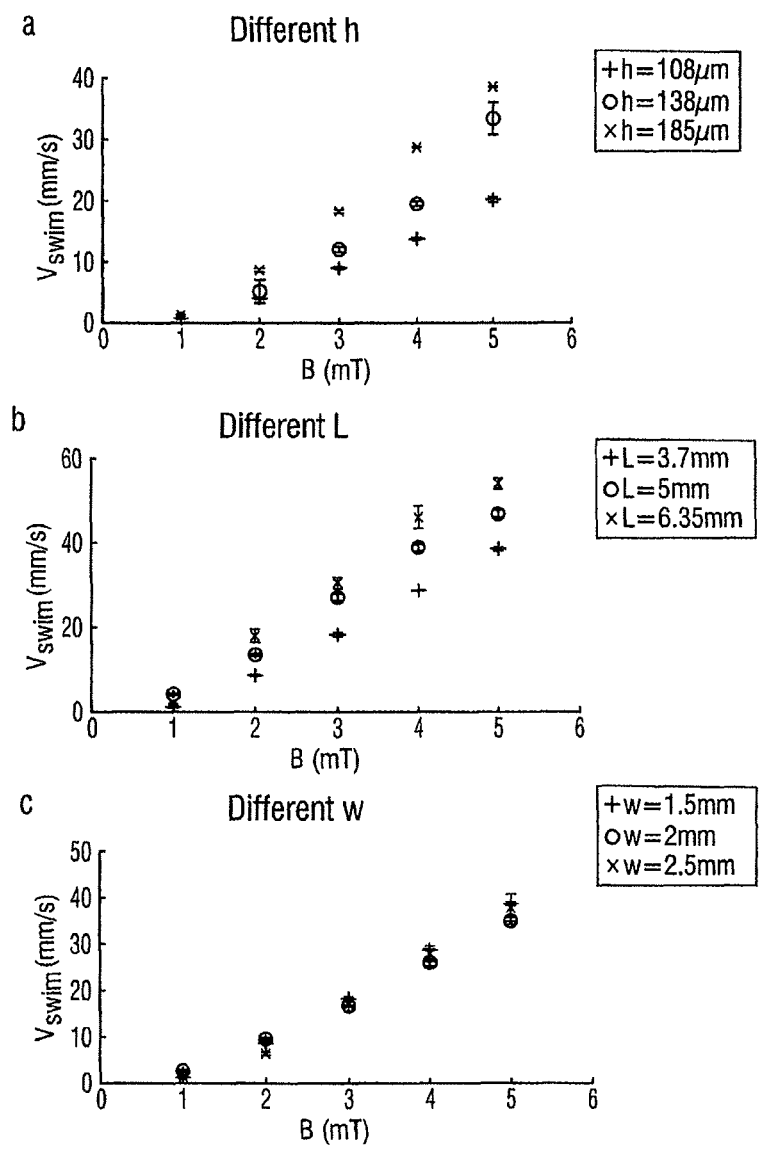

FIG. 49. The compiled experimental data, displaying how the robot's dimensions will affect $V_{swim}$ for the undulating swimming locomotion ($V_{swim}$ as a function of B while f is fixed at 40 Hz). (a) Compiled experimental results for robots that have different h. (b) Compiled experimental results for robots that have different L. (c) Compiled experimental results for robots that have different w. Each experimental data point presents the mean and standard deviation out of three trials (n=3).

Figure 50:
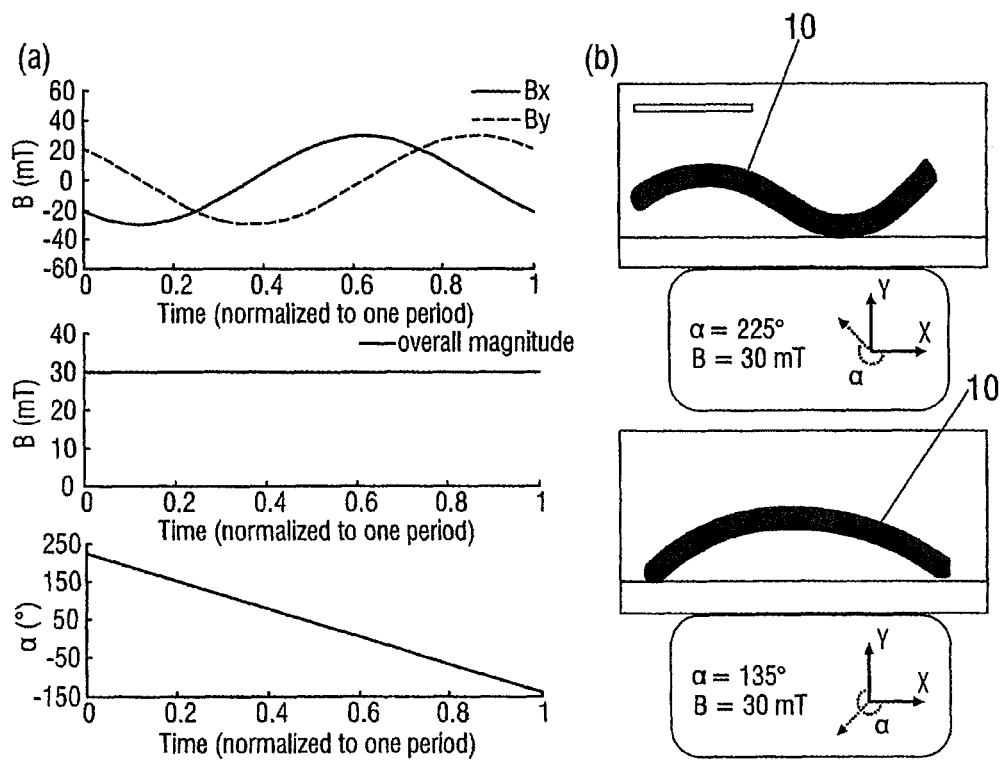

FIG. 50. The required B for the crawling locomotion. (a) Time sequence of B. $B_x$ and $B_y$ represent the magnitude of B projected along the X- and Y-axis of the global coordinate system. (b) shows the instants of the robot when it creates the deformed sine (top) and the cosine (bottom) shapes during a crawling cycle. Scale bar: 1 mm.

Figure 51:
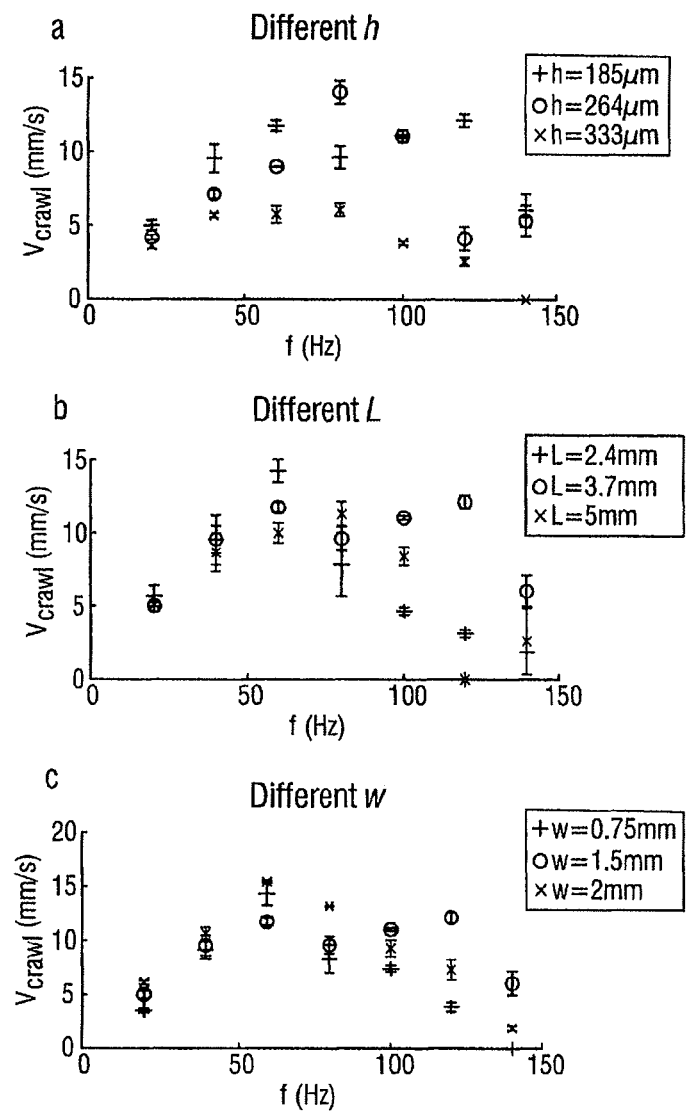

FIG. 51. The compiled experimental data, displaying how the robot's dimensions will affect $V_{crawl}$ for the crawling locomotion ($V_{crawl}$ as a function of f while B is fixed at 10 mT). (a) Compiled experimental results for robots that have different h. (b) Compiled experimental results for robots that have different L. (c) Compiled experimental results for robots that have different w. Each experimental data point presents the mean and standard deviation out of three trials (n=3).

Figure 52:
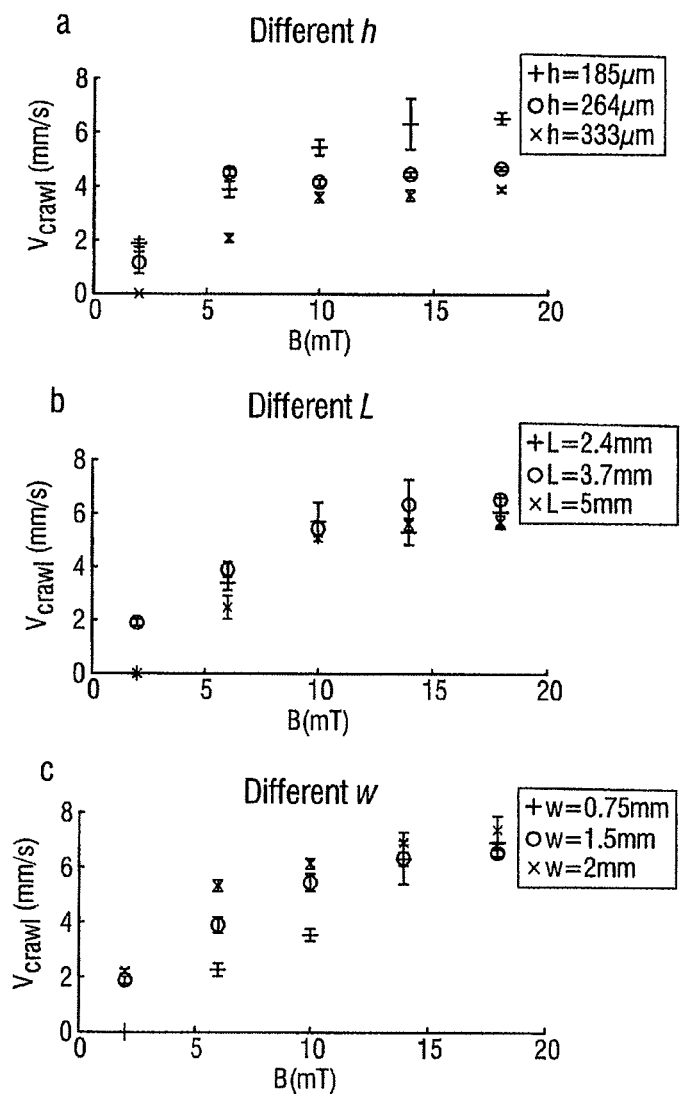

FIG. 52. The compiled experimental data, displaying how the robot's dimensions will affect $V_{crawl}$ for the crawling locomotion ($V_{crawl}$ as a function of B while f is fixed at 20 Hz). (a) Compiled experimental results for robots that have different h. (b) Compiled experimental results for robots that have different L. (c) Compiled experimental results for robots that have different w. Each experimental data point presents the mean and standard deviation out of three trials (n=3).

Figure 53:
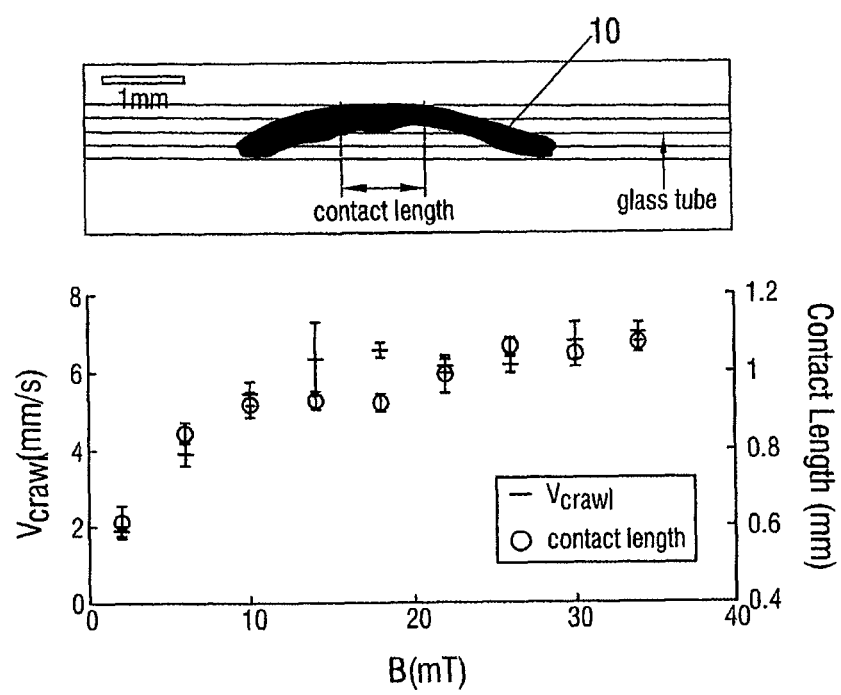

FIG. 53. Crawling speed and contact length between the original robot and the inner tunnel surface as a function of B (f is fixed at 20 Hz). The contact length is defined in the top subfigure, and is assumed uniform across the width of the robot, i.e., contact area=contact length×w. The flat lining of the contact length correlates with the saturation of the crawling speed. Each experimental data point presents the mean and standard deviation out of three trials (n=3).

Figure 54:
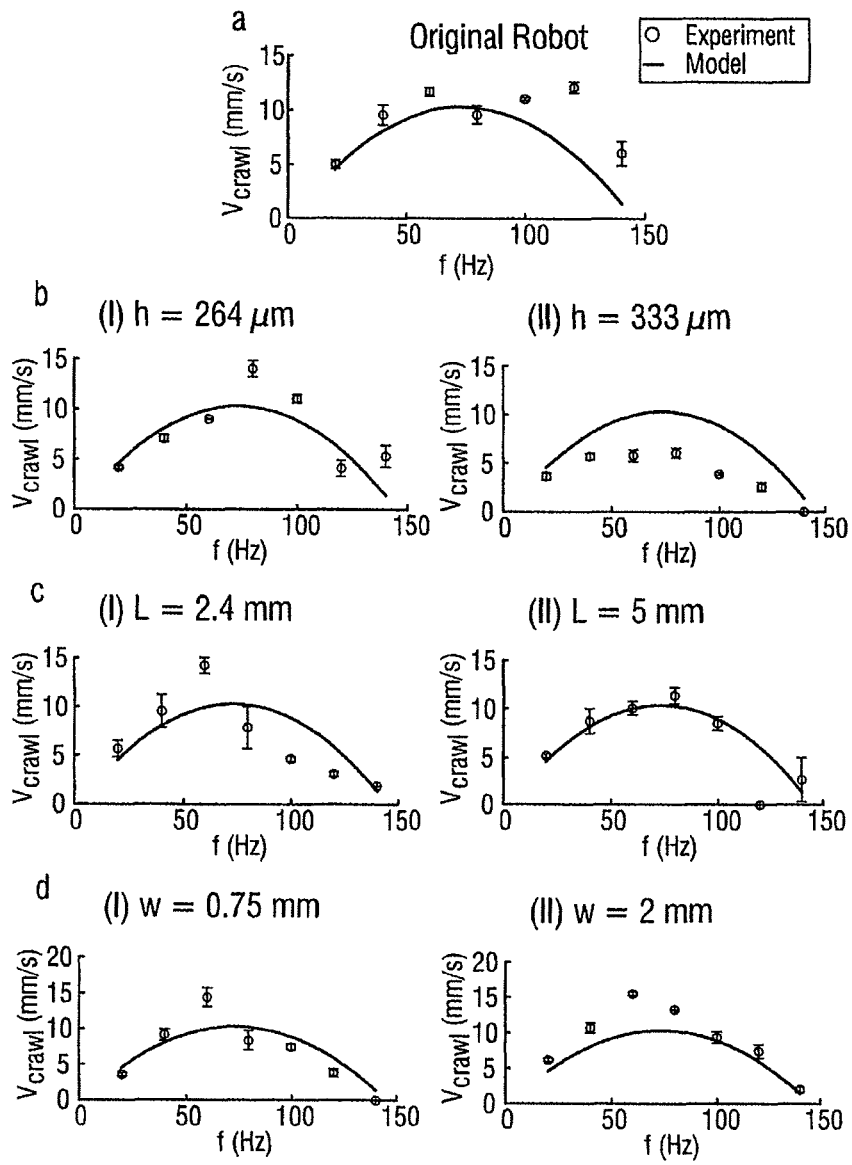

FIG. 54. Experimental and model-predicted results for the crawling locomotion ($V_{crawl}$ as a function off while B is fixed at 10 mT). (a) Results for the original robot (defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 55:
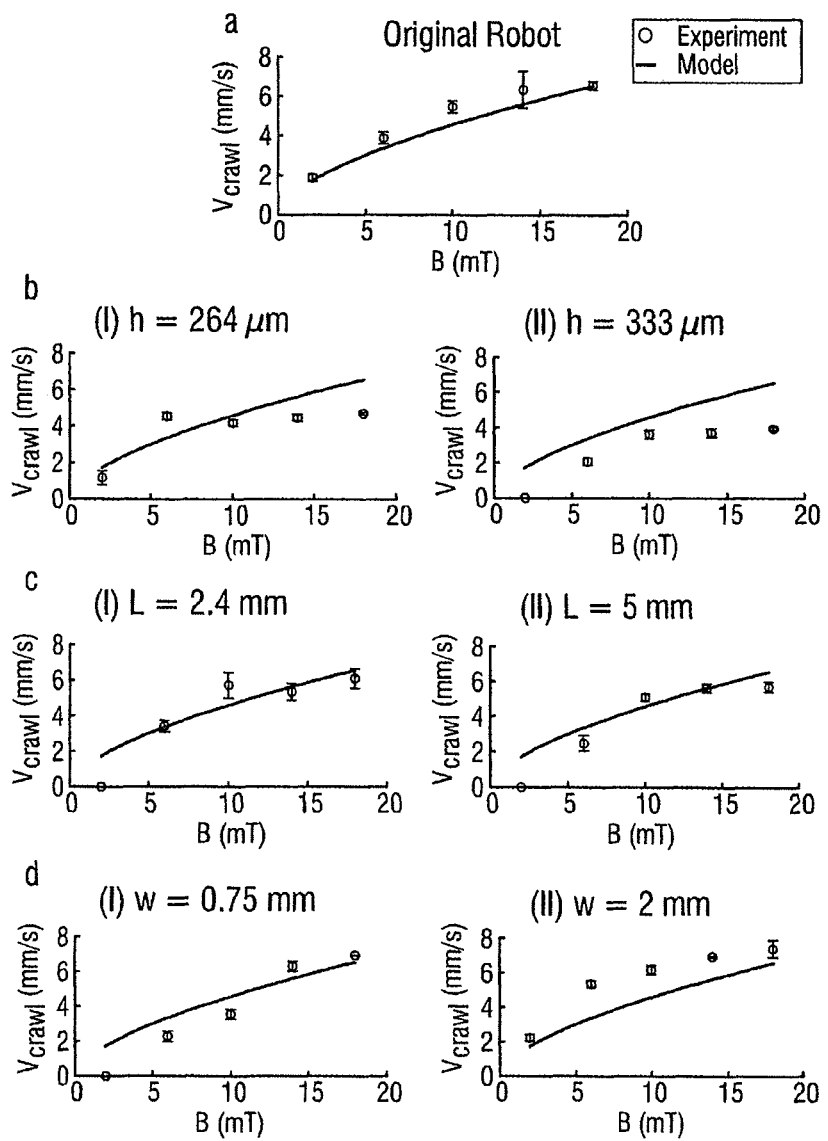

FIG. 55. Experimental and model-predicted results for the crawling locomotion ($V_{crawl}$ as a function of B while f is fixed at 20 Hz). (a) Results for the original robot (defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 56:
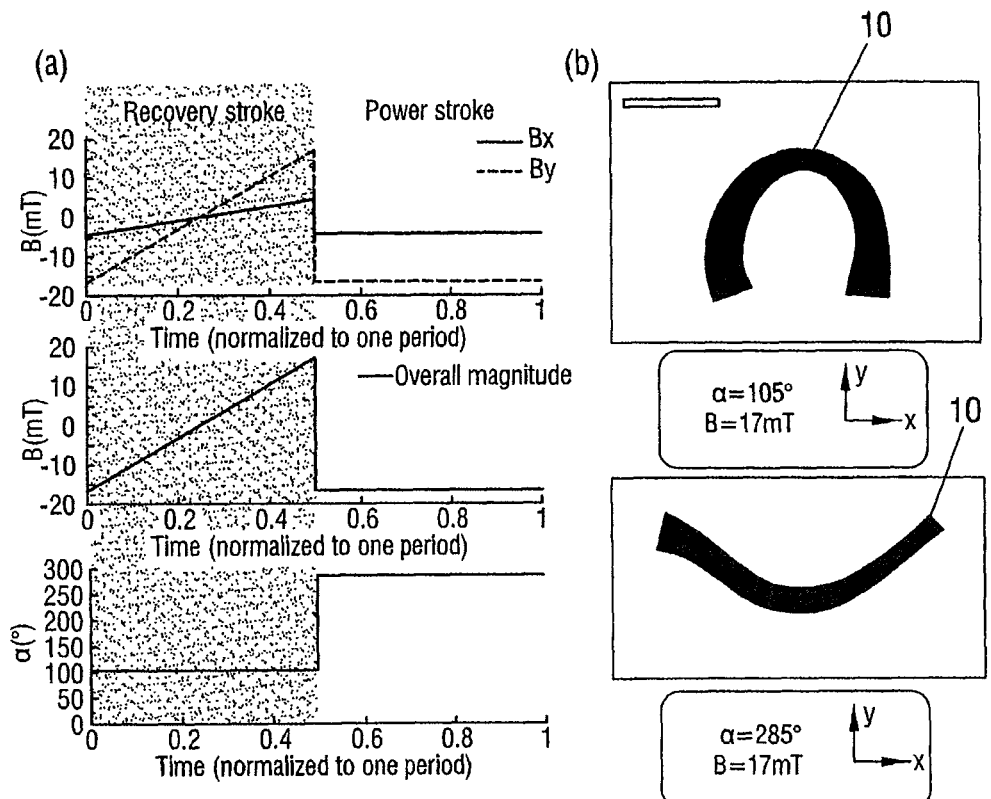

FIG. 56. The required B for the jellyfish-like swimming locomotion. (a) Time sequence of B. $B_x$ and $B_y$ represent the magnitude of B projected along the X- and Y-axis of the global coordinate system. (b) The video snapshots show the 'C'- and 'V'-shape configurations assumed by the robot before the recovery stroke (top) and before the power stroke (bottom), respectively. Scale bar: 1 mm.

Figure 57:
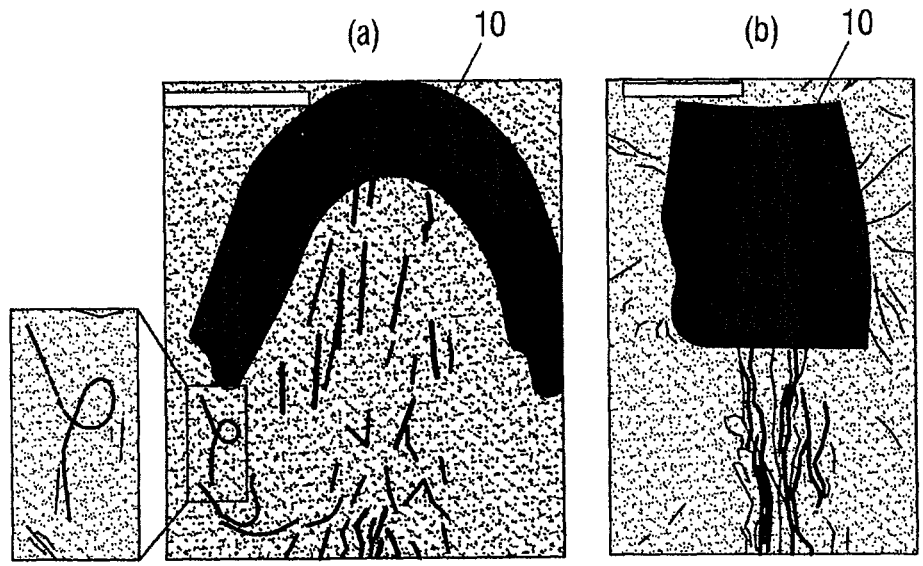

FIG. 57. Fluid vortices produced by the power stroke during the jellyfish-like swimming locomotion. The video snapshots in (a) and (b) respectively show the front and lateral views of two experiment trails recorded separately. The flow was traced using polystyrene particles (diameter: 45 μm). The original robot (dimensions defined in FIG. 19a) was used for this experiment. 40 frames recorded at 2000 fps (corresponding to a time period of 20 ms) were overlapped to produce the images. Scale bars: 1 mm.

Figure 58:
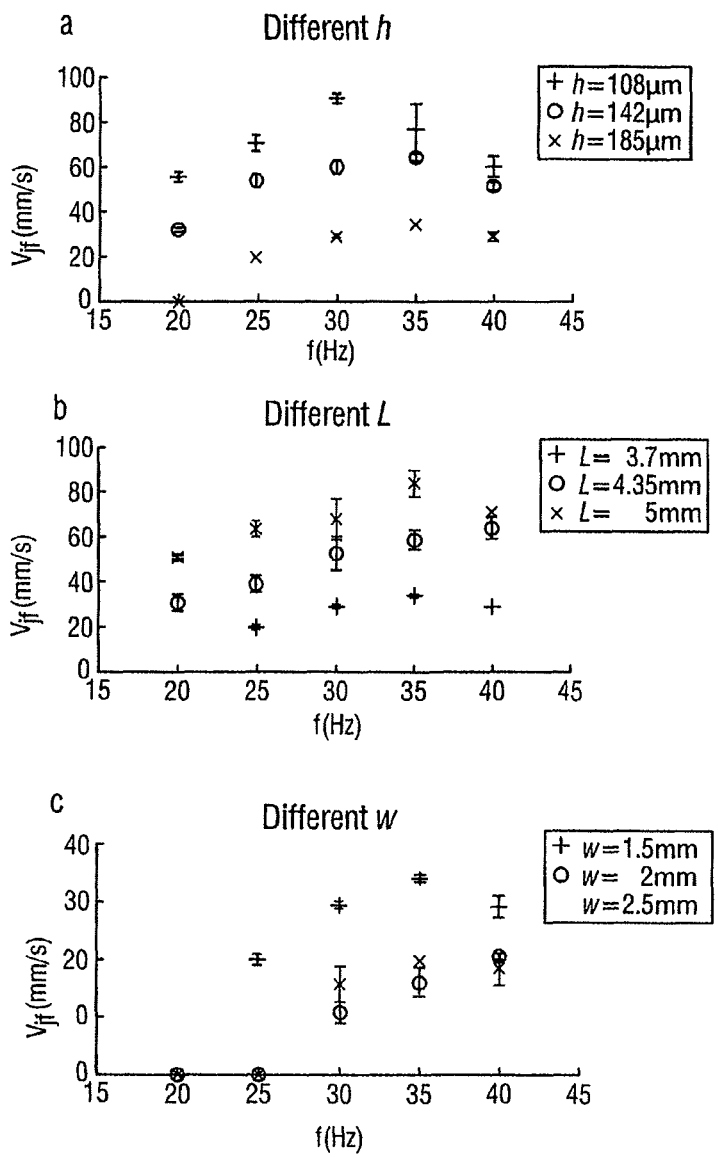

FIG. 58. The compiled experimental data, displaying how the robot's dimensions will affect $V_{jf}$ for the jellyfish-like swimming locomotion ($V_{jf}$ as a function of f while $B_{max}$ is fixed at 20 mT). (a) Compiled experimental results for robots that have a different h from the original robot. (b) Compiled experimental results for robots that have a different L from the original robot. (c) Compiled experimental results for robots that have a different w from the original robot. Each experimental data point presents the mean and standard deviation out of three trials (n=3).

Figure 59:
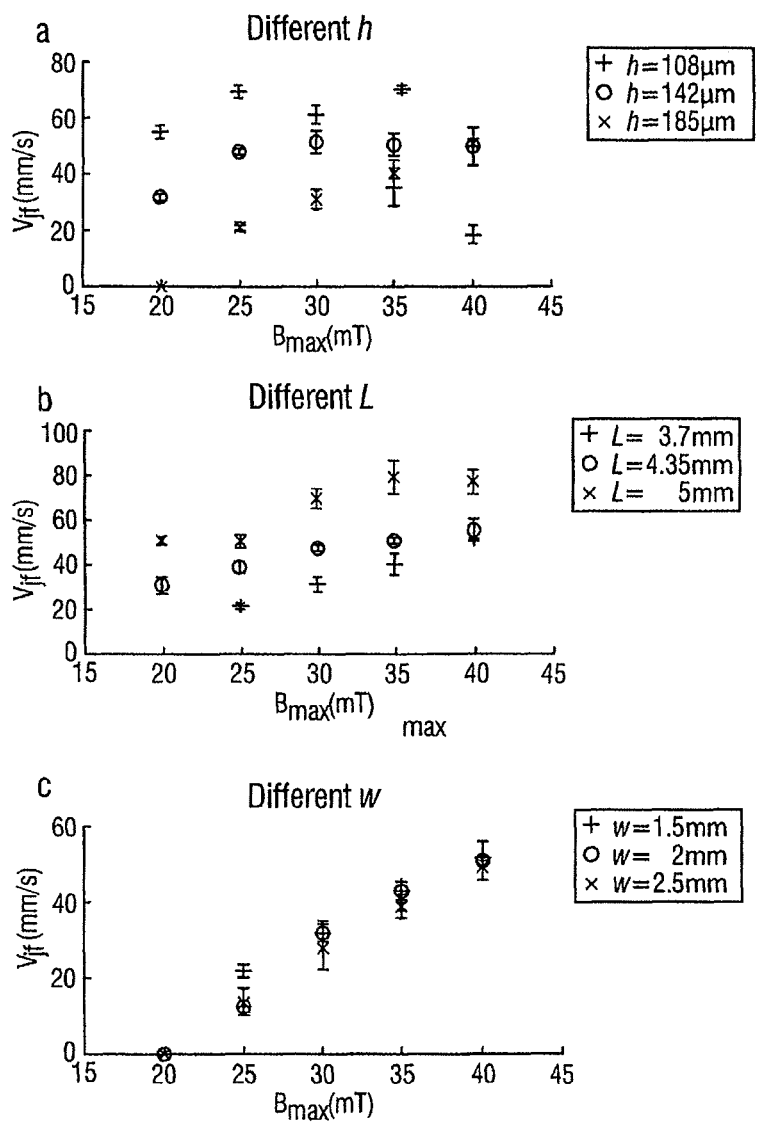

FIG. 59. The compiled experimental data, displaying how the robot's dimensions will affect $V_{jf}$ for the jellyfish-like swimming locomotion ($V_{jf}$ as a function of $B_{max}$ while f is fixed at 20 Hz). (a) Compiled experimental results for robots that have a different h from the original robot. (b) Compiled experimental results for robots that have a different L from the original robot. (c) Compiled experimental results for robots that have a different w from the original robot. Each experimental data point presents the mean and standard deviation out of three trials (n=3).

Figure 60:
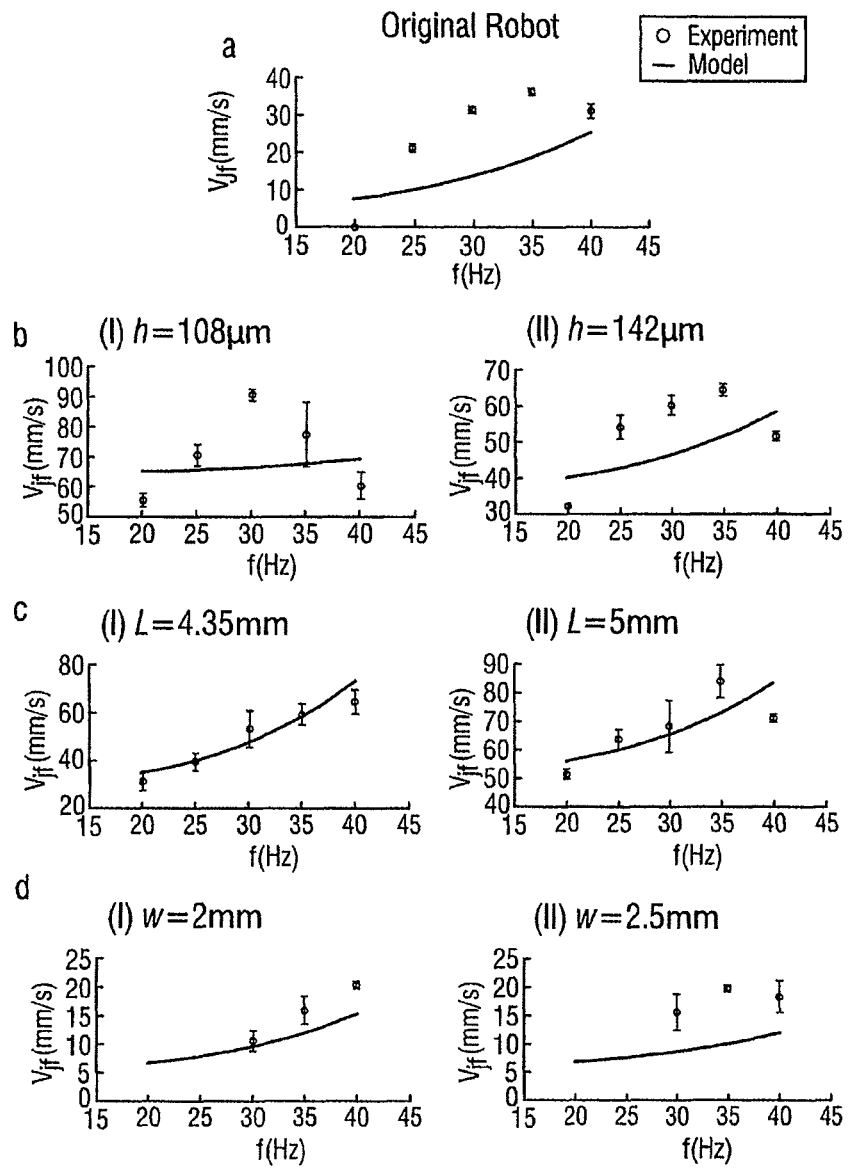

FIG. 60. Experimental and model-predicted results for the jellyfish-like swimming locomotion ($V_{jf}$ as a function of f while $B_{max}$ is fixed at 20 mT). (a) Results for the original robot (dimensions defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 61:
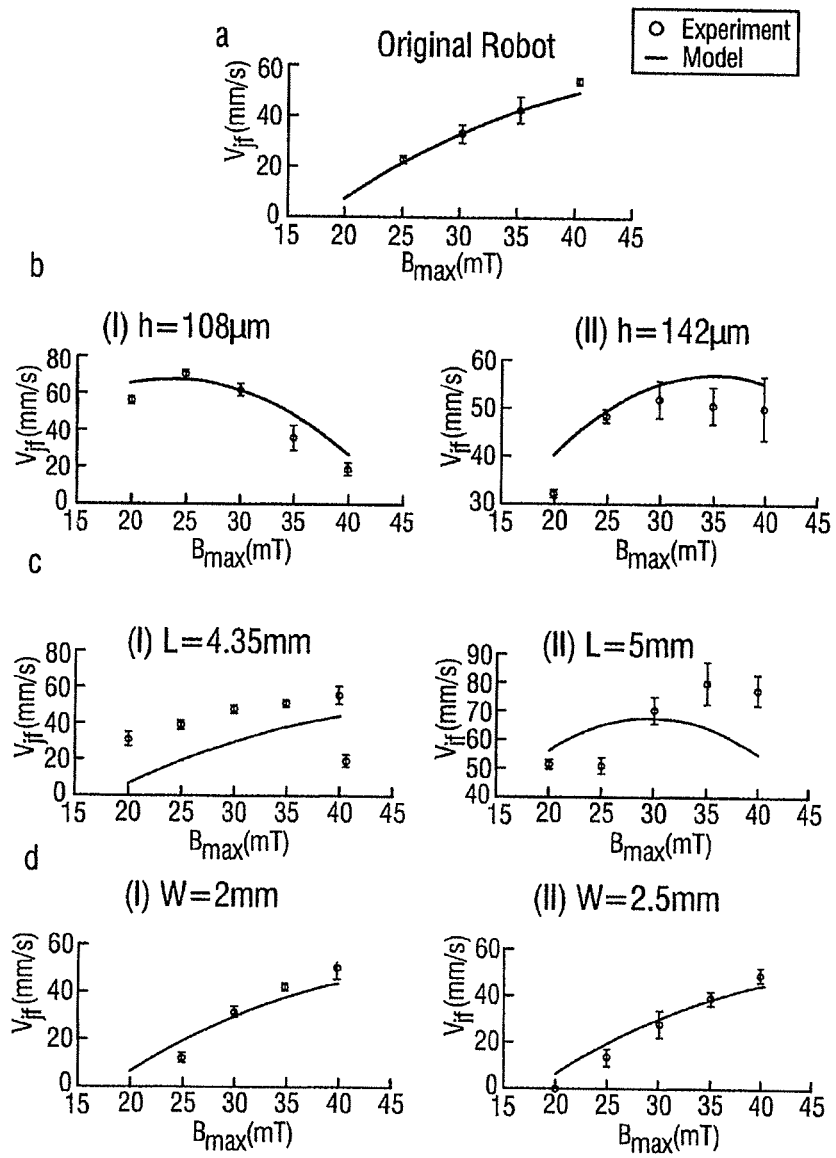

FIG. 61. Experimental and model predicted results for the jellyfish-like swimming locomotion ($V_{jf}$ as a function of $B_{max}$ while f is fixed at 20 Hz). (a) Results for the original robot (dimensions defined in FIG. 19a). (b) Results for robots that have a different h from the original robot. (c) Results for robots that have a different L from the original robot. (d) Results for robots that have a different w from the original robot. Each experimental data point presents the mean and standard deviation out of three trials (n=3).

Figure 62:
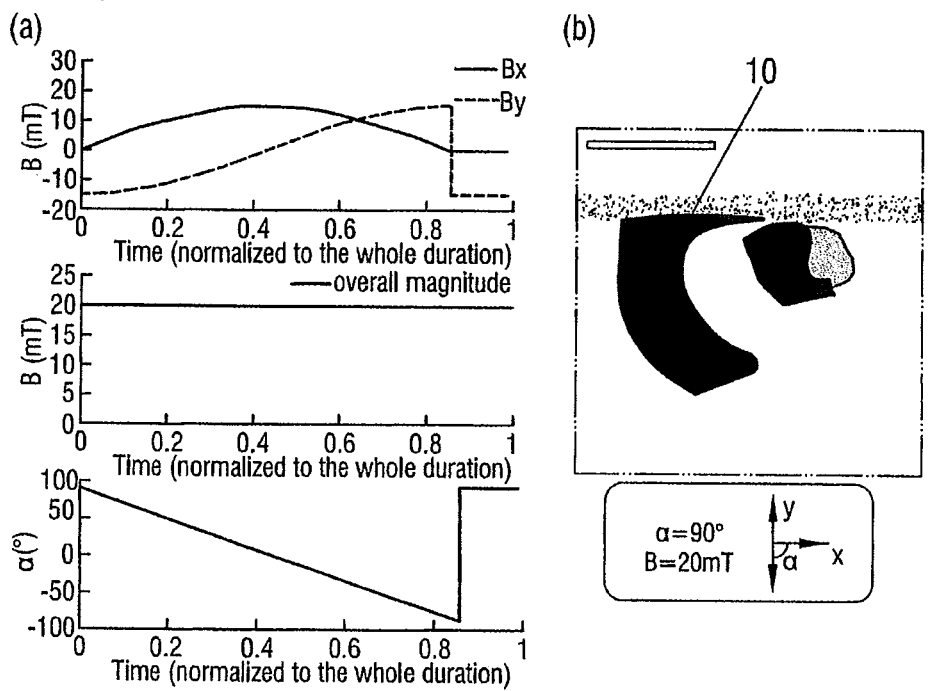

FIG. 62. The required B for the immersion locomotion. (a) Time sequence of B. $B_x$ and $B_y$ represent the magnitude of B projected along the X- and Y-axis of the global coordinate system. (b) The video snapshot shows the initial configuration of the robot for the immersion (reproduced from FIG. 20d). Scale bar: 1 mm.

Figure 63:
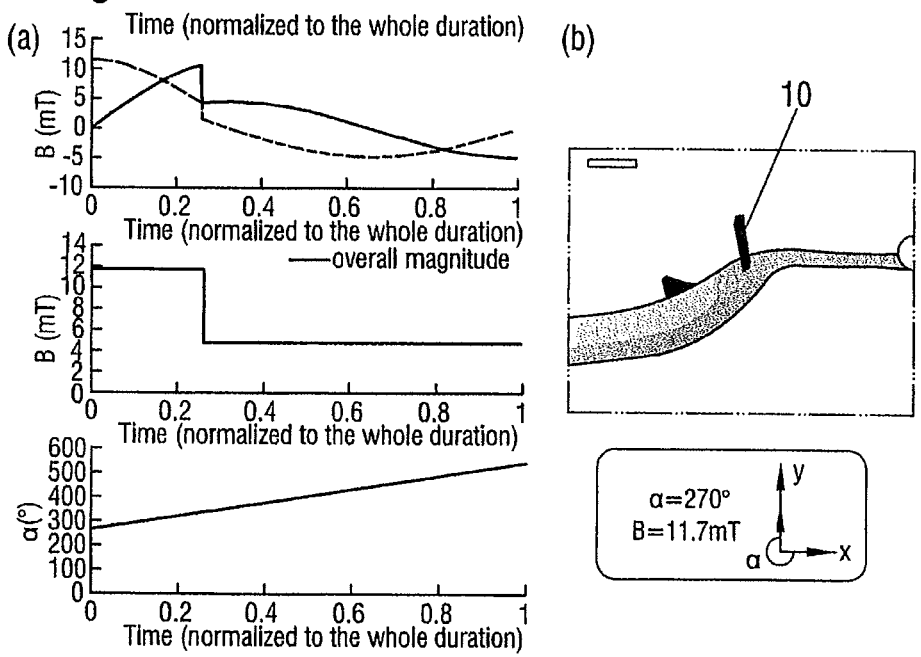

FIG. 63. The required B for the landing locomotion. (a) Time sequence of B. $B_x$ and $B_y$ represent the magnitude of B projected along the X- and Y-axis of the global coordinate system. (b) The video snapshot shows the initial configuration of the robot for the landing (reproduced from FIG. 20c).

Figure 64:
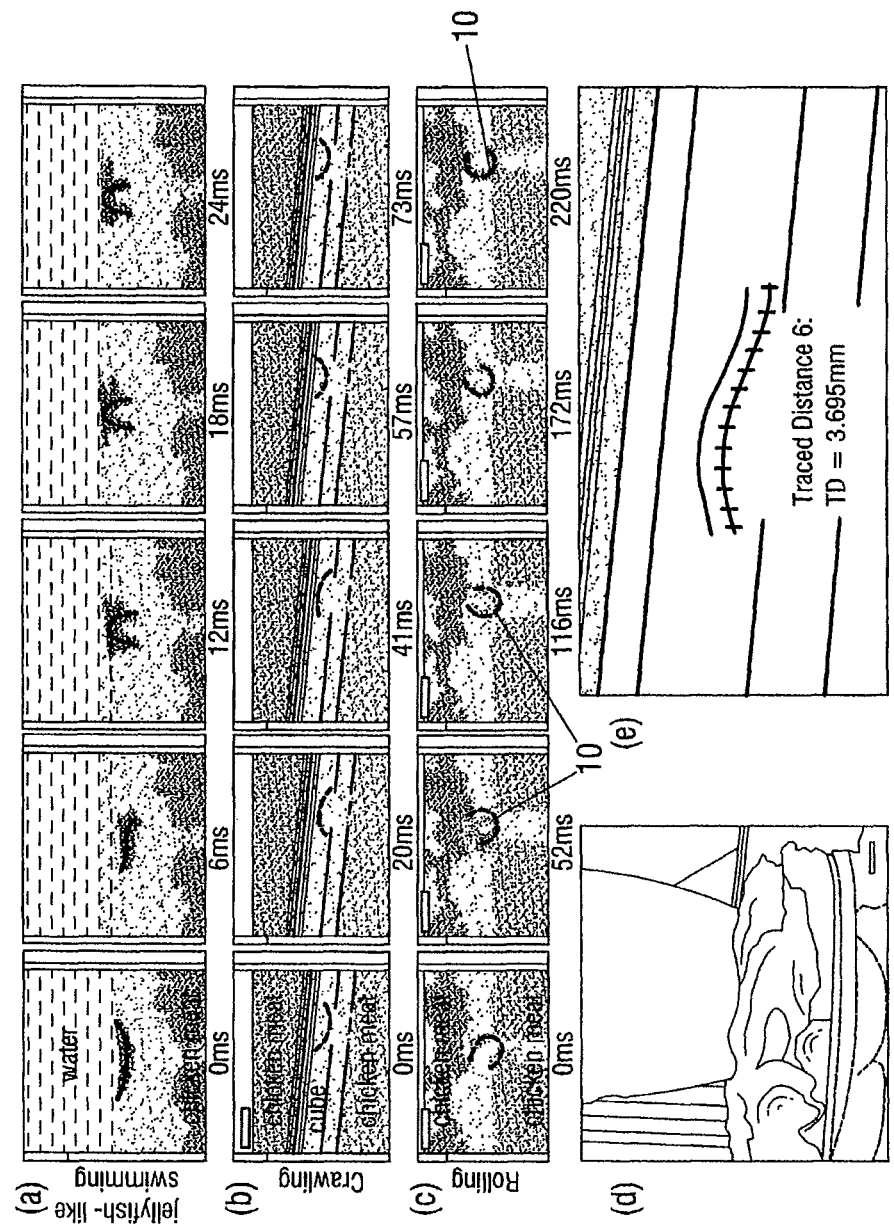

FIG. 64. Ultrasound-guided locomotion. Here, the dimensions of the robots are similar to the original robot (FIG. 19a), i.e., L=3.7 mm, w=1.5 mm and h=0.185 mm. The robot is marked out by red dotted line in a-c. (a) The robot with $\beta_R=-90°$ uses the jellyfish-like swimming locomotion with the following parameters of B sequence: f=30 Hz and $B_{max}=30$ mT. This experiment is conducted in a phantom where the bottom and top parts of the swimming reservoir were made by chicken muscle tissue. (b) The robot with $\beta_R=45°$ crawls by using the following parameters of rotating B sequence: f=10 Hz and B=10 mT. This experiment was performed in a silicone tube (inner diameter of 2 mm) buried inside the chicken muscle tissue (see (e) for an enlarged image). (c) The robot with $\beta_R=45°$ rolls with the following parameters of rotating B sequence: f=2 Hz and B=15 mT. This is a re-plot of FIG. 21b. The rolling experiment is conducted in the gap created between two layers of chicken muscle tissue. (d) The ultrasound scanning head and the chicken muscle tissue phantom when they are placed in the electromagnetic setup shown in FIG. S2. (e) An enlarged image of the robot when it is within the buried tube. Scale bars are: 1 mm (a-c) and 1 cm (d).

Supporting Tables

TABLE S1

Nomenclature.
General theory

| | |
|---|---|
| L | Length of the robot |
| w | Width of the robot |
| h | Thickness of the robot |
| t | Time |
| B | Magnetic field |
| $B_{xy}$ | A vector representing the xy plane components |

TABLE S1-continued

Nomenclature.
General theory

| | |
|---|---|
| $B_i$ | Projection of B along the i-axis |
| B | Magnitude of B |
| $B_{max}$ | Maximum magnetic field magnitude in the prescribed B sequence |
| □ | Field angle of B defined in FIG. 1 |
| $\beta_R$ | Phase shift of the robot on the starting magnetization |
| m | Magnetization |
| $m_i$ | Projection of m along the i-axis |
| m | Magnitude of m(s) |
| $M_{net}$ | Net magnetic moment |
| $M_{net}$ | Magnitude of the net magnetic moment |
| $M_b$ | Bending moment acting on the element |
| $\omega_S$ | Spatial angular frequency of m(s) |
| A | Robot's cross-sectional area |
| I | Second moment of area |
| E | Young's modulus |
| y | Vertical deflection defined in FIG. S3 |
| s | Coordinate along beam's length |
| $\tau_m$ | Actuating magnetic torque on infinitesimal element shown in FIG. S3 |
| $\tau_{RB}$ | Magnetic torque that induces rigid-body motion |
| f | Frequency of the rotating B |
| $k_i$ | Constants of integration |
| | Analysis for jumping |
| W | Magnetic work done |
| $\Delta S$ | Change in strain energy |
| $f_L$ | Frictional losses |
| $\Delta K$ | Change in kinetic energy |
| $\theta_f$ | Final angular deformation of the element before the robot leaves the substrate |
| $\theta_i$ | Initial angular deformation of the element of the robot |
| $H_{max}$ | Maximum jumping height |
| $M_{Rob}$ | Mass of the robot |
| g | Gravitational constant |
| | Analysis for rolling |
| $V_{roll}$ | Rolling speed |
| $\phi_R$ | Rotational displacement of the robot |
| $\phi_{R_{step-out}}$ | Step-out frequency |
| $\square_{Roll}$ | Rigid-body torque for rolling |
| F | Pushing force from the ground |
| $C_T$ | Translational damping |
| $C_R$ | Rotational damping |
| $C_{eff}$ | Effective rotational damping |
| $r_{eff}$ | Effective radius for rolling |
| J | Moment of inertia |
| $J_{eff}$ | Effective moment of inertia |
| $B_{L, roll}$ | B required to maintain a curvature similar to the original robot when L varies |
| $B_{h, roll}$ | B required to maintain a curvature similar to the original robot when h varies |
| | Analysis for walking |
| $V_{walk}$ | Walking speed |
| $S_i$ | The distance between the ends of the robot as illustrated in FIG. S14 |
| | Analysis for meniscus climbing |
| $H_i(x)$ | Profile of water/air interfaces |
| $\rho_r$ | Density of the robot |
| $\rho_w$ | Density of water |
| $\theta_0$ | Water contact angle on the wall |
| $\theta_1, \theta_2$ | Edge angles at the robot's ends |
| R, $\phi$ | Radius and sector angle of the circle fitting the deformed robot shape |
| $\alpha_m$ | Angular orientation of the robot |
| $A_{cs}$ | Area of the circular segment |
| $d_{cs}$ | Distance of the centroid of the circular segment from the center of curvature |

TABLE S1-continued

Nomenclature.
General theory

| | |
|---|---|
| $F_B$ | Buoyancy force of the robot |
| D | Magnitude of the cosine shape |
| $B_{min}$ | Minimum B required to make the robot to climb to the meniscus top |

Analysis for undulating swimming

| | |
|---|---|
| $V_{swim}$ | Speed of undulating swimming |
| C | Damping coefficient along the y-axis |
| v | Vertical shear force |
| $\omega_{n,R}$ | The natural frequency of the $R^{th}$ mode shape of the robot |
| $R_1$ and $R_2$ | Asymptotic approximation of the Bode magnitude function of an ideal $2^{nd}$ order system for the $1^{st}$ and $2^{nd}$ mode-shapes |
| $F_R$ | $R^{th}$ mode shape of the robot |

Analysis for crawling

| | |
|---|---|
| $V_{crawl}$ | Speed of crawling locomotion |
| a, $k_i$ | Fitting parameters |

Analysis for jellyfish-like swimming

| | |
|---|---|
| $V_{jf}$ | Speed of jellyfish-like swimming |
| $k_i$, $a_i$, $b_i$ | Fitting parameters |

TABLE S2

Physical properties of the robot.

| Physical properties (Original soft robot) | Value |
|---|---|
| Average diameter of NdFeB microparticles | 5 µm |
| Average density of NdFeB microparticles | 7.61 g/cm$^3$ |
| Ecoflex-10 polymer matrix density | 1.04 g/cm$^3$ |
| Effective density of the robots | 1.86 g/cm$^3$ |
| Magnetization magnitude | 62,000 ± 10000 A/m |
| Effective Young's modulus of the robots | 8.45 × 10$^4$ ± 2.5 × 10$^3$ Pa |
| Contact angle | 116° ± 3° (Static advancing) |
| | 78° ± 2° (Static receding) |
| Capillary length $L_c$ | 2.7 mm |
| Surface roughness | 0.63 ± 0.02 µm ($R_a$) |
| | 4.37 ± 0.28 µm ($R_z$) |

TABLE S3

Summary of the fitting parameters for the jellyfish-like swimming locomotion.

| Fitting Parameters | Optimal Fitted Values |
|---|---|
| $a_0$ | 7.1968 |
| $a_1$ | 6.744 |
| $a_2$ | 8.6248 |
| $a_3$ | 4.9297 |
| $a_4$ | 11.7241 |
| $a_5$ | 1.5778 |
| $a_6$ | −2.6213 |
| $b_0$ | −8.914 |
| $b_1$ | 4.6897 |
| $b_2$ | 28.960 |
| $b_3$ | 5.7409 |
| $b_4$ | −11.0260 |
| $b_5$ | −10.1775 |
| $b_6$ | −2.4962 |
| $c_0$ | −2.3454 |
| $c_1$ | 25.2537 |
| $c_2$ | 8.6974 |
| $c_3$ | 0.4930 |
| $k_0$ | −7.4319 |
| $k_1$ | 6.3250 |
| $k_2$ | −242.4006 |
| $k_3$ | 39.9464 |
| $k_4$ | 39.9464 |

TABLE S3-continued

Summary of the fitting parameters for the jellyfish-like swimming locomotion.

| Fitting Parameters | Optimal Fitted Values |
|---|---|
| $k_5$ | 10.5661 |
| $k_6$ | 16.3457 |

TABLE S4

Scaling analyses summary. We provide the performance indicator, best observable performance index, operating range of f, and robot dimension effects for each locomotion mode. The suggested operating range of f is based on our tested robots.

| | Performance indicator | Best observable performance index | Suggested f (Hz) | L | h | w |
|---|---|---|---|---|---|---|
| Jumping | $H_{max}$ | 12.2 mm | N/A | ↑ | ↓ | — |
| Rolling | $V_{roll}$ | 213 mm/s | (0, 4] | ↑ | — | — |
| Walking | $V_{walk}$ | 65.5 mm/s | [2, 11] | ↑ | ↓ | — |
| Meniscus climbing | $B_{min}$ | 1.4 mT | N/A | ↑ | ↓ | N/A |
| Undulating swimming | $V_{swim}$ | 107 mm/s | [40, 160] | ↑ | ↑ (Disagree with theory) | — |
| Crawling | $V_{crawl}$ | 15.4 mm/s | [20, 40] | — | — | — |
| Jellyfish-like swimming | $V_{jf}$ | 90.6 mm/s | [30, 40] | ↑ | ↓ | ↓ |

I. '↑', '↓', '—' are based on experimental results. '↑' means the corresponding dimension should be increased to improve the specified locomotion. '↓' means the corresponding dimension should be decreased to improve the specified locomotion. '—' means that the corresponding dimension has no obvious correlation with the specified locomotion.
II. The dimension h for the undulating swimming locomotion is marked grey as it disagrees with the theoretical prediction.
III. III. We take the mean value for the data point representing the best observable performance index.

The invention claimed is:

1. A method of actuating a shape changeable member having a height, a width and a length, the shape changeable member further being untethered; the method comprising the steps of:
   actuating the shape changeable member by means of at least one stimulus to bring about a change of shape of the shape changeable member at least over the length of the shape changeable member in at least one spatial direction and thereby inducing a torque into the shape changeable member;
   effecting a locomotion of the shape changeable member by means of the induced change of shape of the shape changeable member in the at least one spatial direction; and
   moving the shape changeable member in the at least one spatial direction,
      wherein the stimulus is an external stimulus present in the form of a time varying magnetic field applied in at least one dimension and the shape changeable member is formed from a continuum of infinitesimal segments (ds), with the segments (ds) each comprising the same material but having a different direction of magnetization.

2. The method in accordance with claim 1, wherein the induced torque is used to steer the shape changeable member in the at least one spatial direction.

3. The method in accordance with claim 1, wherein a type of locomotion of the shape changeable member is selected from the group of members consisting of swimming, walking, flipping, crawling, rolling, diving, immersion, emersion, jumping, landing and climbing.

4. The method in accordance with claim 1, wherein the change of shape comprises at least one of a deformation, a contraction, a flexing, an undulation and a stretching of the actuatable material of the shape changeable member.

5. The method in accordance with claim 1, wherein a magnitude of the time varying magnetic field applied is selected in the range of 0 to 500 mT.

6. The method in accordance with claim 5, wherein the magnitude of the time varying magnetic field applied is varied with a frequency selected in the range of 0 to 1 kHz.

7. The method in accordance with claim 5, wherein a direction of the time varying magnetic field applied is varied with a frequency selected in the range of 0 to 1 kHz.

8. The method in accordance with claim 1, further comprising the step of actuating the shape changeable member to additionally carry out at least one function.

9. The method in accordance with claim 8, wherein the at least one function comprises at least one of a gripping function, a holding function, a dropping function, a clamping function and picking up function.

10. The method in accordance with claim 1, wherein a type of locomotion of the shape changeable member is selected from the group of members consisting of swimming, walking, flipping, crawling, rolling, diving, immersion, emersion, jumping, landing and climbing,
   wherein the change of shape comprises at least one of a deformation, a contraction, a flexing, an undulation and a stretching of the actuatable material of the shape changeable member; and
   wherein the shape changeable member is deformed to adopt a sine like or cosine like shape to effect a crawling or walking type of locomotion to enable an undulating locomotion of the shape changeable member; or
   wherein the shape changeable member is deformed to adopt a part-circular shape to effect a rolling or meniscus climbing type of locomotion; or
   wherein the shape changeable member is deformed to undulate and generate a travelling wave on the member to effect a swimming type of locomotion or crawling type of locomotion, or
   wherein the shape of the shape changeable member is flipped from a first shape into a second shape and back into the first shape to effect a jelly-fish swimming type of locomotion; or
   wherein the shape changeable member is pulsed with the at least one stimulus in order to effect the jumping type of locomotion; or
   wherein to effect an immersion type of locomotion a magnetic field having a rotating B sequence is applied, with the magnetic field effecting a rotation of the shape changeable member in a counter-clockwise sense to reduce a contact with a liquid surface; or
   wherein to effect a landing type of locomotion a magnetic field having a rotating B sequence of variable magnitude applied, with the initial B-sequence having a high magnitude which is then reduced to a low magnitude; or
   wherein a rocking sequence of the magnetic field is applied to perform the walking type of locomotion; or
   wherein to effect a jelly fish-like swimming motion mode of locomotion of the shape changeable member the applied magnetic field is sequentially flipped from a positive magnetic field to a negative magnetic field causing an inversion of the shape of the shape changeable member.

11. A shape changeable member of actuatable material formed from a continuum of infinitesimal segments (ds), with the segments (ds) each comprising the same material but having a different direction of magnetization, the shape changeable member being untethered and having a width, a height and a length, wherein the shape changeable member is configured to be actuated by means of at least one external stimulus present in the form of a time-varying magnetic field applied in at least one dimension in order to bring about a change of shape of the shape changeable member in at least one spatial direction and thereby inducing a torque into the shape changeable member; the shape changeable member being configured to effect a locomotion of the shape changeable member by means of the induced change of shape of the shape changeable member in the at least one spatial direction; and to be moved in the at least one spatial direction in response to the at least one external stimulus.

12. The shape changeable member in accordance with claim 11, wherein the change of shape comprises at least one of a deformation, a contraction, a flexing and a stretching of the actuatable material of the shape changeable member.

13. The shape changeable member in accordance with claim 11, wherein the type of locomotion is jumping.

14. The shape changeable member in accordance with claim 11, wherein the shape changeable member is configured to carry out at least two types of locomotion and the at least two types of locomotion are selected from the group of members consisting of swimming, walking, flipping, crawling, rolling, diving, immersion, emersion, jumping, landing and climbing.

15. An actuating system comprising a shape changeable member in accordance with claim 11 and a magnetic field apparatus, wherein the magnetic field apparatus is a source of the time-varying magnetic field.

16. The actuating system in accordance with claim 15, wherein the magnetic field apparatus is configured to generate a uniform 3D magnetic field at a center of the system.

17. The actuating system in accordance with claim 15, wherein the magnetic field apparatus comprises at least two pairs of magnetic coils, wherein each of the pairs of coils is arranged on a common axis, with the respective common axes being arranged at least approximately perpendicular to one another at a center of the system, wherein the shape changeable member is configured to be actuated by means of the pairs of magnetic coils in such a way that the shape changeable member carries out at least one type of locomotion within the applied time-varying magnetic field, and wherein the pairs of magnetic coils are configured to produce the time-varying magnetic field at the center.

* * * * *